(12) United States Patent
Kodama et al.

(10) Patent No.: US 6,430,723 B2
(45) Date of Patent: *Aug. 6, 2002

(54) ERROR CORRECTING DEVICE AND DATA REPRODUCING APPARATUS PROVIDED THEREWITH

(75) Inventors: Kunihiko Kodama, Yokohama; Katsutoshi Moriyama, Zushi; Akira Hikimura, Yokohama, all of (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,472

(22) Filed: Dec. 16, 1998

(30) Foreign Application Priority Data

Dec. 16, 1997 (JP) .............................................. 9-346502

(51) Int. Cl.[7] .............................................. G11C 29/00
(52) U.S. Cl. ...................................... 714/770; 714/763
(58) Field of Search ................................. 714/752, 758, 714/769, 770, 763, 764, 761, 762, 787, 788, 785, 800, 751, 52, 54

(56) References Cited

U.S. PATENT DOCUMENTS

| 4,345,328 A | * | 8/1982 | White ........................ 714/751 |
| 4,617,664 A | * | 10/1986 | Aichelmann, Jr. et al. .. 714/751 |
| 5,056,089 A | * | 10/1991 | Furata et al. ................ 714/703 |
| 5,623,459 A | | 4/1997 | Iwamura et al. ............. 369/32 |

FOREIGN PATENT DOCUMENTS

JP        07-169205        7/1995

* cited by examiner

*Primary Examiner*—Christine T. Tu
(74) *Attorney, Agent, or Firm*—Oblon, Spivak, McClelland, Maier & Neustadt, P.C.

(57) ABSTRACT

An error correcting device includes a receiving circuit for receiving data in a unit of block, an error correcting circuit for detecting an error in the data received by the receiving circuit and correcting the error, a transmission circuit for transmitting the data whose error has been corrected by the error correcting circuit, and a storage device having two areas each having a storage capacity corresponding to at least one block of the data. The transmission circuit reads the data corrected by the error correcting circuit from one of the areas of the storage device, and simultaneously, the receiving circuit writes the received data into said one area of the storage device at an address where the transmission circuit has already read out the error-corrected data.

30 Claims, 50 Drawing Sheets

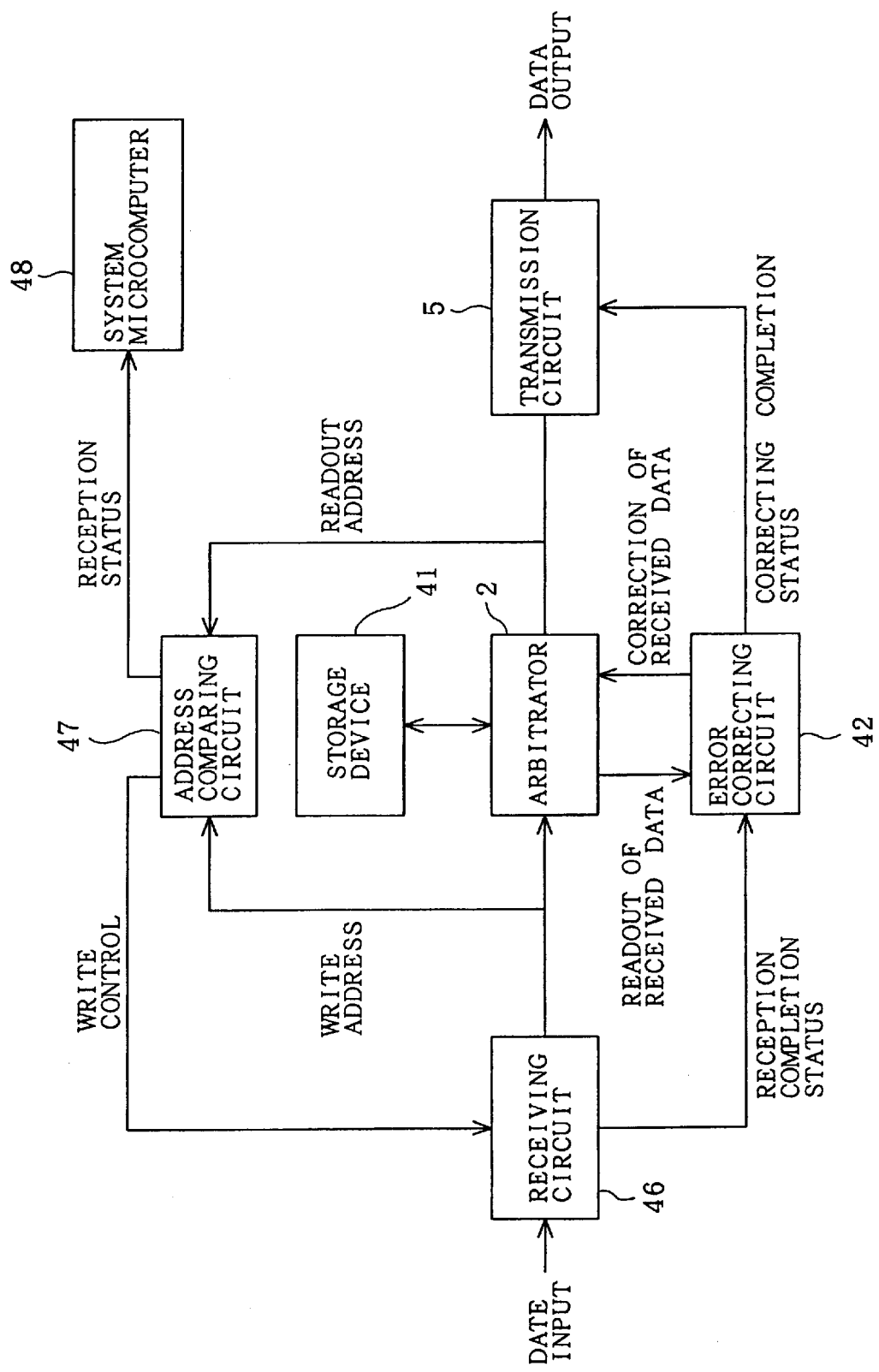
F I G. 11

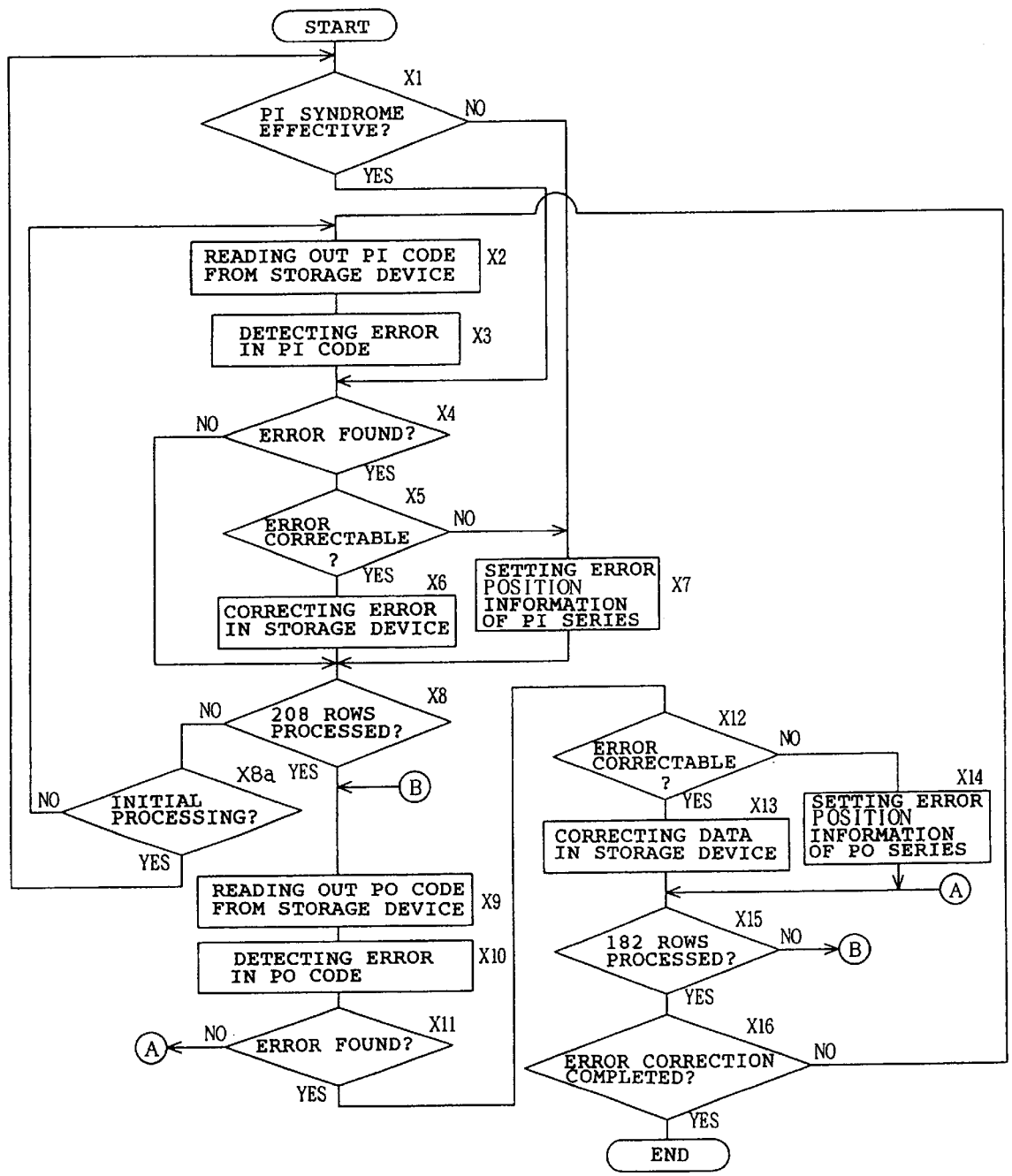
F I G. 1 5

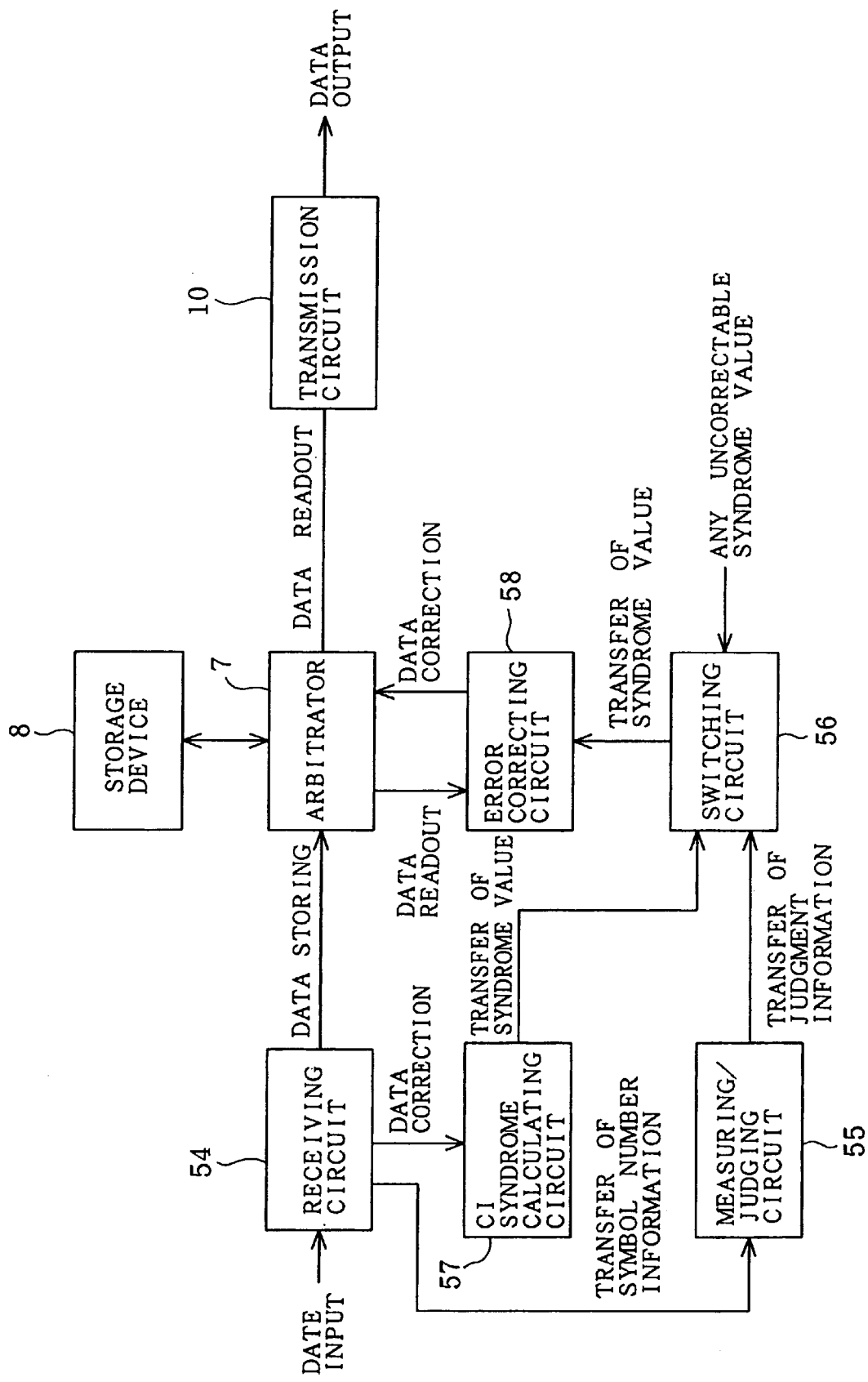
F I G. 16

ERROR CORRECTING DEVICE AND DATA REPRODUCING APPARATUS PROVIDED THEREWITH

BACKGROUND OF THE INVENTION

1. Field of the Invention

This invention relates to an error correcting device performing error correction for data composed as an error correction data and a data reproducing device reading out data recorded in a recording medium such as a compact disc (CD) or a digital versatile disc (DVD).

2. Description of the Prior Art

First Prior Art

FIG. 39 illustrates a conventional error correcting device for use in a disc reproducing device for reproducing data recorded in a recording medium such as a DVD. The reproducing device comprises a receiving circuit 1 receiving data read from a disc by an optical pickup and composed as an error correcting code. Neither disc nor pickup is shown. The receiving circuit 1 then decodes the received data and then writes the decoded data through an arbitrator 2 into a storage device 3 such as a RAM. The data received by the receiving circuit 1 sometimes contains an error when the surface of the disc is damaged or dirty due to adherence of dirt such as fingerprints. In such a case, an error correcting circuit 4 reads out the data the receiving circuit 1 has written into the storage device 3 to thereby detect an error in the data. When detecting a correctable error, the error correcting circuit 4 corrects the data containing the error, writing the corrected data through the arbitrator 2 into the storage device 3.

The conventional error correcting device further comprises a transmission circuit 5 reading out the data having been corrected by the error correcting circuit 4 through the arbitrator 2 from the storage device 3. The transmission circuit 5 then transmits the read data to a reproduction system (not shown) for reproduction of the data as image or sound. The arbitrator 2 serves as a memory interface for arbitrating access of the receiving circuit 1, the error correcting circuit 4 and the transmission circuit 5 to the storage device 3.

FIG. 40 shows a concept of storage area of the storage device 3. The storage area of the storage device 3 is divided into three areas A, B and C. Each area has a storage capacity set to be equal to that of one block which is a unit for which the error correction is performed with use of the error correcting code. For example, as shown in FIG. 41, when the data received by the receiving circuit 1 is to be written into the area A in a phase, the data the receiving circuit 1 has written into the area C in the last phase is an object for error detection and correction, whereas the data which is stored in the area B and the error of which has been corrected by the error correcting circuit 4 in the last phase is an object to be transmitted by the transmission circuit 5.

In a next phase, the received data is to be stored in the area B, the error detection and correction are to be performed for the data stored in the area A, and the data stored in the area C is to be transmitted. Thus, the three areas are sequentially switched among three processes of data reception, error detection and correction, and data transmission. In this case, the receiving circuit 1 delivers both to the error correcting circuit 4 and to the transmission circuit 5 a status signal indicative of completion of reception of one block of data. Each of these circuits 4 and 5 confirms receipt of the status signal before performing the process for a new area.

According to the above-described system, the processes of data reception, error correction and data transmission can concurrently be executed in a time sharing. Accordingly, an operating speed of each circuit need not be increased to a large value. However, the storage device 3 requires a storage capacity at least three times larger than the one corresponding to one block of data. This results in a problem that a circuit is rendered large-sized.

In order to solve the above-mentioned problem, the inventors proposed an arrangement shown in FIG. 42. Specifically, a storage device with a storage capacity twice as large as the data block capacity (only areas A and B) is used instead of the storage device 3. While the receiving circuit 1 is writing data into either one of the areas A and B, the error correcting circuit 4 perform an error correction for the data stored in the other area and thereafter, the transmission circuit 5 transmits the error-corrected data. The two areas are thus switched therebetween.

According to the proposed system described above, the storage capacity of the storage device can be reduced. However, the error correction for one block of data by the error correcting circuit 4 and the transmission of the corrected data by the transmission circuit 5 need to be serially executed and completed within a time of write of another block of data into one of the areas by the receiving circuit 1. In this arrangement, accordingly, operating speeds of the error correcting circuit 4 and the transmission circuit 5 need to be increased. This results in a problem that the conditions of design of circuits including the circuits 4 and 5 is rendered more rigorous.

Second Prior Art

The inventors proposed an arrangement as shown in FIG. 43 as an error correcting device for use in a disc reproducing device for reproducing data stored in the CD or the DVD. In this arrangement, the receiving circuit 6 receives data read from a disc by an optical pickup and composed as an error correcting code, decoding the received data. Neither disc nor pickup is shown. The receiving circuit 1 then writes the decoded data through an arbitrator 7 into a storage device 8 such as a RAM.

An error correcting circuit 9 reads out the data the receiving circuit 6 has written into the storage device 8 to thereby detect an error in the data. When detecting a correctable error, the error correcting circuit 9 corrects the data containing the error, writing the corrected data through the arbitrator 7 into the storage device 8.

A transmission circuit 10 reads out the corrected data through the arbitrator 7 from the storage device 8. The transmission circuit 10 then transmits the read data to a reproduction system (not shown) for reproduction of the data as image or sound. The arbitrator 7 serves as a memory interface for arbitrating access of the receiving circuit 6, the error correcting circuit 9 and the transmission circuit 10 to the storage device 8. A syndrome calculating circuit 11 obtains data directly from the receiving circuit 6 to calculate syndrome from the error correcting code, delivering the result of calculation to the error correcting circuit 9.

For example, a DVD employs, as the error correcting code, a Reed-Solomon product code constituted by two sequences of error correcting codes comprising an inner parity (PI) code and an outer parity (PO) code. Accordingly, the receiving circuit 6 writes data of one block of product code into the storage device 8 and thereafter, the error correcting circuit 9 reads out the stored data from the storage device 8 to perform the error correction. Now assume an arrangement as shown in FIG. 43. In this arrangement, the syndrome calculating circuit 11 calculates syndrome concerning, for example, rows of PI code, so that the error correcting circuit 9 can start detection of error concerning a first row of PI code before the receiving circuit 6 finishes writing one block of product codes into the storage device 8. Consequently, a time required for the error detection and correction can be reduced.

However, in the above-described system, when disturbance occurring in a receiving system at the receiving circuit 6 side interrupts data reception, the syndrome calculating circuit 11 cannot obtain the number of units of information symbols required for the calculation of syndrome, resulting in a problem that the calculation of syndrome cannot properly be performed.

Further, the storage device 8 retains data written thereinto in the past and being currently meaningless due to interruption of data reception. In this regard, if the result of syndrome calculation concerning the meaningless data shows an error-correctable value, the error correcting circuit 9 disadvantageously corrects the meaningless data or performs a false correction. Upon occurrence of such a false correction, there is a possibility that an offensive noise is produced during sound reproduction, for example, when the data is sound data. Further, in a case where the data is file data, the contents of the file are sometimes broken or the data is erroneous when the file is opened to be displayed on a display, although it had properly been loaded. These phenomena are regarded as having an obscure causal relation by the user, resulting in a problem that the phenomena reduce the reliability of a product.

Third Prior Art

FIG. 44 illustrates further another conventional error correcting device for use in a disc reproducing device for reproducing data stored in a storage medium such as CD or DVD. FIG. 45 is a flowchart showing a sequence of processes carried out by components of the error correcting device as will hereinafter be described. A receiving circuit 12 receives and decodes data read from a disc by an optical pickup (neither shown) and composed as an error correcting code (step S1). The receiving circuit 12 writes the decoded data via an arbitrator 13 into a storage device such as a RAM (step S2).

An error correcting circuit 15 reads out the data written into the storage device 14 by the receiving circuit 12 (step S3), detecting an error in the data. When detecting a correctable error, the error correcting circuit 15 corrects the data containing the error. The error correcting circuit 15 writes the corrected data via the arbitrator 13 into the storage device 14 (step S4).

A transmission circuit 16 reads out the data corrected by the error correcting circuit 15 via the arbitrator 13 from the storage device 14 (step S5), transmitting the read data to a reproduction system (not shown) for reproduction of the data as image or sound (step S6). Further, an overwrite circuit 17 overwrites any data via the arbitrator 13 onto the data stored in the storage device 14 immediately after the data read from the storage device 14 has been transmitted by the transmission circuit 16, so that the error correcting circuit is rendered incapable of correcting error (step 57). As a result, the data having been transmitted is rewritten.

The overwriting operation of the overwrite circuit 17 is performed so that the error correcting circuit 15 is prevented from a false detection or a false correction by overwriting the unrenewed data previously written onto the storage device 14 for corrupting the data even when data cannot be written onto the storage device 14 due to disturbance in the data receiving conditions of the receiving circuit 12. The arbitrator 13 serves as a memory interface for arbitrating access of the receiving circuit 12, the error correcting circuit 15, the transmission circuit 16 and the overwrite circuit 17 to the storage device 14.

The number of times of access to the storage device 14 is increased in the above-described system wherein the data overwrite circuit 17 is provided for overwriting the transmitted data. Accordingly, a problem arises that a data transfer rate to the storage device 14 needs to be increased so that a processing speed required for the sequence of processes comprising data reception, error correction and data transmission is maintained at a predetermined level.

Fourth Prior Art

FIG. 46 illustrates further another conventional error detection device for use in a disc reproducing device for reproducing data stored in a storage medium such as CD or DVD. An RF (high frequency) circuit 18 receives data read out from a disc 19 by an optical pickup 20 and constituted as an error correcting code to equalize signal waveforms of the data to thereby deliver the equalized signal waveforms to a synchronization separating circuit 21, a PLL circuit 22 and a servo circuit 23.

The PLL circuit 22 produces reproduction clock signals based on the data signal waveforms, delivering the signals to the synchronization separating circuit 21 and a decoding circuit 24. The synchronization separating circuit 21 separates synchronization signals from the data signals based on the reproduction clock signals, delivering the synchronization signals to the decoding circuit 24. The decoding circuit 24 decodes the data from the supplied data signals, writing the decoded data via an arbitrator 25 onto a storage device comprising a RAM or the like.

An error correcting circuit 27 reads out the data written onto the storage device 26 by the decoding circuit 24 to detect error in the data. When detecting a correctable error, the error correcting circuit 27 corrects the data containing the error and thereafter writes the corrected data via the arbitrator 25 onto the storage device 26.

A transmission circuit 28 reads out the data corrected by the error correcting circuit 27 from the storage device 26 to transmit the data to a processing system (not shown) for reproducing the data as image or sound according to a type of the disc 19. The arbitrator 25 serves as a memory interface for arbitrating access of the decoding circuit 24, the error correcting circuit 27 and the transmission circuit 28 to the storage device 26.

The servo circuit 23 controls a motor 30 for turning the disc 19 and the pickup 20. Processes performed by the servo circuit 23, the error correcting circuit 27 and the transmission circuit 28 are based on clock signals supplied from a system reference clock circuit 31 to them. The servo circuit 23 is also supplied with a reproduction speed control signal from a system controller (not shown) according to input by a user.

An information storage system for the disc 19 at the above-described reproduction system includes a constant linear velocity (CLV) system wherein a linear velocity is constant, and a zone constant velocity (ZCLV) system wherein an angular velocity between zones is constant. The disc reproducing device reads out the data to reproduce image or sound according to the above-described or other reproduction systems. For example, in the CLV system, the servo circuit 23 controls the motor 30 and the pickup 20 as shown in FIG. 47, so that the disc 19 is rotated at a constant linear velocity. The servo circuit 23 further moves the pickup 20 from an inner circumferential side of the disc 19 to an outer circumferential side thereof by linear tracking, thereby reading data recorded on the disc 19 and writing it onto the storage device 26 in the same manner as described above. Thus, time variations in data readout by the motor 30 can be canceled to a certain extent by once writing onto the storage device 26 the data read from the disc 19.

The disc 19 may be a CD-ROM or a DVD-ROM each of which has a large data recording capacity. In order that data retrieving speeds may be improved, there has recently been a demand that the disc reproducing device reproduce data at higher speeds. As shown in FIG. 47, when data recorded on the disc 19 is reproduced at a high speed in a random manner, the pickup 20 is quickly moved to any track and thereafter, the disc 19 needs to be rotated at a constant linear speed. In this case, the pickup 20 can easily be moved quickly to the track. However, rotational inertia prevents the motor 30 from instantaneous response. Accordingly, the data reproducing speed varies until the rotational speed of the motor 30 reaches a constant linear speed. This results in a problem that data cannot be reproduced when the above-mentioned variations in the reproducing speed is not canceled in the storage device 26.

A motor with a high torque characteristic is considered to be used as the motor 30 for improvement in the responsibility. However, this increases an amount of current consumed by the servo circuit 23, presenting a definite limit. Further, in another arrangement, the disc is rotated in the CAV system for the purpose of reducing control burden of the motor 30. However, this arrangement cannot be applied to the device designed for use in the CLV system.

In view of the above-described problems, the prior art has proposed an improved system for a disc reproducing device for use with a computer, in which system the disc 19 is a CD-ROM, a DVD-ROM, etc. In this system, data is transmitted at the transmission side at a speed according to a data readout speed in a period of variations in the speed at which data is read out from the disc. Specifically, although the data readout speed needs to be set so as to usually maintain the CLV at a constant value according to a sampling rate of 44.1 KHz in the case of CD of the musical purposes, the above-mentioned use with the computer is free from such a limitation.

FIG. 48 shows an example of the improved system. In this system, clock signals supplied to the error correcting circuit 27 and the transmission circuit 28 are produced by frequency-dividing clock signals delivered from the system reference clock circuit 31 by a frequency divider circuit 32. A speed comparison circuit 33 monitors a write address of the storage device 26 for the decoding circuit 24, thereby changing a frequency-dividing ratio of the frequency divider circuit 32 according to a remaining recording capacity of the storage device 26. As a result, a speed at which the transmission data is read from the storage device 26 follows up a speed at which the received data is written onto the storage device 26.

In the above-described system, a frequency of the clock signals delivered from the system reference clock circuit 31 needs to be increased so that a reproducing speed or the speed at which the transmission data is read out is increased. This results in a problem of increases in unnecessary radio wave radiation causing malfunction of a microcomputer etc. and in consumed electric power.

FIG. 49 shows another prior art arrangement in which the clock signals supplied to the error correcting circuit 27 and the transmission circuit 28 are produced by frequency-dividing the clock signals the PLL circuit 22 produces based on the rows of received data.

According to this system, the variation in the reproducing speed is directly related with those in the operation clock signals of the error correcting circuit 27 and the transmission circuit 28. As a result, time base variations in the motor 30 need not be canceled via the storage device 26. However, in case where a rapid variation in the readout speed desynchronize the PLL circuit 22, there is a possibility that the frequency of the clock signals delivered therefrom may rapidly be increased. In this case, the clock signals supplied to the storage device 26, the error correcting circuit 27 or the transmission circuit 28 would exceed a respective limit operating speed, resulting in malfunction of the system.

FIG. 50 shows further another prior art arrangement in which the system reference clock circuit 31 delivers clock signals to the error correcting circuit 27 and the transmission circuit 28, and a speed comparing circuit 35 compares a speed at which the decoding circuit 24 writes the received data onto the storage device 26 and a speed at which the transmission circuit 28 reads out the transmission data from the storage device 26, whereby an interval at which the transmission circuit 28 reads out the transmission data from the storage device 26 is changed according to the result of comparison.

In this arrangement, a speed at which the clock signals are supplied to the error correcting circuit 27 and the transmission circuit 28 is set so as to be higher than the speed at which the decoding circuit 24 writes the received data onto the storage device 26. Further, each of the error correction and transmission circuits 27 and 28 starts data processing when a predetermined amount of data (one block of error correcting code in the DVD system, for example) is stored in the storage device 26. Upon completion of the data processing, each of the circuits 27 and 28 interrupts the data processing until another predetermined amount of data is stored.

According to the above-described system, an upper limit of the data reproducing speed depends upon the frequency of the clock signals delivered from the system reference clock circuit 31. Accordingly, a frequency of the operating clocks of each of the error correction and transmission circuits 27 and 28 is constant such that the operation of each circuit is ensured. However, each circuit is usually operated at a high frequency. This results in a problem of increases in unnecessary radiation and consumed electric power.

SUMMARY OF THE INVENTION

Therefore, a primary object of the present invention is to provide an error correcting device in which the recording capacity of the storage device can be reduced without an excessive increase in the processing speeds of the error correction means and transmission means, for the purpose of overcoming the problems in the above-described first prior art.

A second object of the invention is to provide an error correcting device in which a false correction can be prevented even when the calculation of syndrome is not properly carried out due to disturbance of the data receiving state, for the purpose of overcoming the problems in the above-described second prior art.

A third object of the invention is to provide an error correcting device in which a data overwriting circuit is not required and the false correction can be prevented when unrenewed data remains in the storage device, for the purpose of overcoming the problems in the above-described third prior art.

A fourth object of the invention is to provide a data reproducing device in which increases in unnecessary radiation and consumed electric power can be restrained and a transmission speed of data whose error has been correct can follow the speed at which the storage device receives data, for the purpose of overcoming the fourth problems.

The present invention provides an error correcting device comprising a receiving circuit for receiving data composed as an error correcting code in a unit of block, an error correcting circuit detecting an error in the data based on the error correcting code received by the receiving circuit and correcting the error, and a storage device having two areas each having a storage capacity corresponding to at least one block of the data. In this error correcting device, the receiving circuit and the error correcting circuit alternately switch in use the two areas of the storage device between a receiving data area into which the data received by the data receiving circuit is written and as a corrected data area into which the correct data is written. The transmission circuit reads out the data stored in the corrected data area, transmitting the data. Further, the receiving circuit writes the received data at an address at which the transmission circuit has read out the data within a period of time when the transmission circuit reads out one block of data from the area of the storage device to transmit the data, thereby using said area as the received data area.

According to the above-described error correcting device, while the two areas of the storage device are switched alternately between the received data area and the corrected data area, the transmission circuit reads out the data sequentially from the area of the storage device which was previously a corrected data area to transmit the read data, whereas the receiving circuit writes the received data at the address at which the transmission circuit has read out the data, within the period of time during which the transmission circuit reads out and transmits one block of the corrected data. Accordingly, an independent transmission data area is not required. This clearly differs from the prior art. Moreover, the receiving circuit sequentially overwrites the received data onto the area of the data the transmission circuit having already been read out. Accordingly, operating speeds of the error correcting and transmission circuits need not be increased excessively relative to an operating speed of the receiving circuit.

The error correcting device is preferably provided with a function of setting a difference between an address of the storage device at which the transmission circuit reads out the data whose error has been corrected by the error correcting circuit and an address of the storage device at which the receiving circuit writes the received data so that the difference is smaller than an address corresponding to a capacity of one block of the error correcting code.

The error correcting circuit preferably detects and corrects the error in one block of data, a time required for writing the corrected data onto the corrected data area of the storage device is set so as to be shorter than a time required for the receiving circuit to write received one block of data onto the storage device, and when the error correcting circuit finishes writing onto the corrected data area one block of the corrected data, the transmission circuit reads out the corrected data from a first address of the corrected data area before the receiving circuit completes the writing of one block of data onto the received data area.

According to the above-described error correcting device, the address of the storage device at which the transmission circuit reads out the corrected data slightly precedes the address thereof at which the receiving circuit writes the received data. Accordingly, the storage device owns in common an area from which the transmission data is read out and an area into which the received data is written by the difference between the addresses, namely, the difference between a period of time during which the transmission data is read out and a period of time during which the received data is written.

The transmission circuit preferably reads out the corrected data from the previous corrected data area of the storage device at a speed higher than a maximum speed at which the receiving circuit writes the received data onto the storage device. Further, the error correcting device preferably further comprises a readout speed control circuit for controlling a data readout speed of the transmission circuit based on a speed at which the receiving circuit writes the received data onto the storage device.

The error correcting device preferably further comprises an interrupting circuit for comparing an address at which the transmission circuit reads out the corrected data from an area of the storage device which was a last corrected data area and an address at which the receiving device writes the received data onto the storage device. In this case, the interrupting circuit interrupts a writing operation of the receiving circuit onto the received data area when an interval between the addresses is below a predetermined value.

Further, the error correcting device preferably further comprises a data erasure judging circuit for comparing an address at which the transmission circuit reads out from the storage device the corrected data and an address at which the receiving circuit writes the received data onto the storage device, thereby judging that untransmitted data which is stored in the storage device and regarding which an error correcting process has been executed has been erased.

The invention also provides an error correcting device comprising a receiving circuit for receiving data composed as an error correcting code, a storage device for storing the data received by the receiving circuit, an error correcting circuit detecting an error in the data based on the error correcting code received by the receiving circuit and correcting the error, the error correcting circuit further writing the error-corrected data onto the storage device, a transmission circuit for reading out the error-corrected data from the storage device to transmit the same, a syndrome calculating circuit obtaining the data received by the receiving circuit to calculate a syndrome of the obtained data based on the error correcting code, the syndrome calculating circuit delivering the calculated syndrome to the error correcting circuit, and a syndrome judging circuit for judging validity of the syndrome calculated by the syndrome calculating circuit based on a received state of the data obtained from the receiving circuit for use in calculation of the syndrome.

According to the above-described error correcting device, the syndrome calculating circuit directly obtains the received data without via the storage device, previously calculating the syndrome of the data from the error correcting code. Accordingly, the error correcting circuit can start the error correction without reading out the received data from the storage device in a case where the error of the data is detected as the result of the calculation of the syndrome by the syndrome calculating circuit when a first correction of error is corrected regarding the received data. In this case, furthermore, the error correcting circuit can cause the syndrome judging circuit to judge the validity of the syndrome calculated by the syndrome calculating circuit.

The above-described error correcting device preferably further comprises a syndrome output switching circuit for switching between a case where the syndrome output switching circuit delivers to the error correcting circuit the syndrome with respect to which the error of the data is uncorrectable, when the syndrome judging circuit has delivered the invalidity signal, and a case where the syndrome output switching circuit delivers to the error correcting circuit the syndrome calculated by the syndrome calculating circuit otherwise. In this constitution, the syndrome output switching circuit delivers to the error correcting circuit the syndrome with respect to which the error cannot be corrected, when the correction of the error of the data cannot properly be performed with the syndrome calculated by the syndrome calculating circuit. Consequently, the error correcting circuit can be prevented from a false correction.

The error correcting circuit does not preferably perform the error correction for at least a row of the error correcting code of the data corresponding to the syndrome judged to be invalid, when the syndrome judging circuit has delivered the invalidity signal.

The invention further provides an error correcting device comprising a receiving circuit for receiving data composed as an error correcting code, a storage device onto which the data received by the receiving circuit is written, a judging circuit for judging whether data of a predetermined number of symbols required for error correction is received by the receiving circuit and properly written onto the storage device, a renewal position information generating circuit for generating information of a renewal position regarding a row of code of the data written onto the storage device, based on a judgment of the judging circuit, an error correcting circuit reading out the data stored in the storage device to detect an error of the data based on the error correcting code, the error correcting circuit correcting the error of the data regarding which the error has been detected and writing onto the storage device the data regarding which the error has been corrected, the error correcting circuit refraining from performing the error correction for at least a row of the error correcting code with respect to which the data has not been renewed on the basis of the renewal position information generated by the renewal position information generating circuit, and a transmission circuit reading out and transmitting the data written onto the storage device and regarding which the error correction has been performed.

According to the above-described error correcting device, for example, an unrenewed row of code remains in an area of the storage device onto which no data is written when a disturbance in the data receiving state of the receiving circuit interrupts data reception. In this case, however, the error correcting circuit refrains or does not perform the error correction for the code row regarding which the information data has not been renewed, based on the renewal position information. This can prevent a false detection and a false correction regarding the unrenewed data without provision of means for collapsing data having been transmitted on the storage device, differing from the prior art.

In the above-described constitution, the data is preferably composed as a plurality of sequences of error correcting codes. In this case, when the number of rows of any one sequence of error correcting codes of the data regarding which rows the error correction has been performed is larger than the number of correctable errors in the other sequences of error correcting codes, the error correcting circuit performs the error correction for the rows of error correcting codes the data of which in said other sequences of error correcting codes has not been renewed.

According to this constitution, even if the error correcting circuit executes the error correction for the unrenewed code row regardless of the renewal position information, the error correction is not actually performed since the number of rows of any one sequence of error correcting codes of the data is larger than the number of correctable errors in the other sequences of error correcting codes. At this time, false correction is prevented. Further, for example, when data correction is executed for said any one sequence of code row at many times and the correcting process is repeatedly executed for each sequence of code row at a plurality of times, there is a possibility that the correction may be performed for the unrenewed code rows in subsequent correcting processes. Consequently, the correctability of the unrenewed data can be improved.

The invention also provides a data reproducing device comprising a receiving circuit for receiving data read out from a recording medium and composed as an error correcting code, a storage device onto which the data received by the receiving circuit is written, a clock signal supplying circuit for supplying clock signals independent of clock signals for control of data reception, an error correcting circuit reading out the data stored in the storage device based on the clock signals supplied thereto from the clock signal supplying circuit and correcting an error in the data regarding which the error has been detected, based on the error correcting code, the error correcting circuit writing onto the storage device the data regarding which the error has been corrected, and a transmission circuit for reading out and transmitting the error-corrected data written onto the storage device, based on the clock signals supplied thereto from the clock signal supplying circuit.

According to the above-described data reproducing device, the error correcting circuit and the transmission circuit are supplied with frequency-variable clock signals from the clock signal supplying circuit dedicated to both of them. Upon completion of the error correction for the data written onto the storage device by the receiving circuit, the error correcting circuit interrupts the error correction until the receiving circuit writes new data onto the storage device. When completing transmission of the data regarding which the error correcting circuit has corrected the error, the transmission circuit interrupts the transmission until the new data regarding which the error correcting circuit has corrected the error.

More specifically, by setting the frequency of the clock signals delivered from the clock signal supplying circuit, the error correction and transmission of the data by the error correcting circuit and the transmission circuit respectively can be performed at respective higher speeds than the data reception by the receiving circuit. Accordingly, the frequency of the system reference clock signals set at a large value need not be supplied to error correcting circuit and the transmission circuit for increase in the data reproducing speed, or clock signals a PLL circuit or the like generates from the received data need not be supplied to the error correcting circuit and the transmission circuit. Consequently, increases in consumed electric power and unnecessary radiation can be prevented, and occurrence of malfunction can be prevented.

The clock signal supplying circuit preferably includes a frequency control circuit for controlling a frequency of the clock signals in a feedback manner so that the frequency of the clock signals delivered from the clock signal supplying circuit approximates to a value set by the frequency setting circuit Further, the data reproducing device preferably further comprises a system control circuit for generally controlling a system and for setting a set value at the frequency setting circuit. When the recording medium is an information storage disc, the system control circuit changes an upper limit value of a data reproducing speed by setting the set value of the frequency setting circuit according to a type of the information storage disc storing the data to be reproduced. Further, the system control circuit changes an upper limit value of a data reproducing speed by setting the set value of the frequency setting circuit according to a position of a data reading element reading the data from the information storage disc.

BRIEF DESCRIPTION OF THE DRAWINGS

Other objects, features and advantages of the present invention will become clear upon reviewing the following description of the preferred embodiments, made with reference to the accompanying drawings, in which:

FIG. 11 is a view similar to FIG. 1, showing a fourth embodiment in accordance with the invention;

FIG. 15 is a flowchart of the procedure of error correction by an error correcting circuit;

FIG. 16 is a block diagram showing an electrical arrangement of a CD reproducing device of a seventh embodiment in accordance with the invention;

DETAILED DESCRIPTION OF THE PREFERRED EMBODIMENTS

A first embodiment in accordance with the present invention will be described with reference to FIGS. 1 to 6. In the embodiment, the invention is applied to a DVD data reproducing device. The identical or similar parts in the embodiment are labeled by the same reference symbols as those shown in FIG. 39. The description of these identical or similar parts will be eliminated and only the differences between the first embodiment and the constitution of FIG. 39 will be described.

Figure 1:
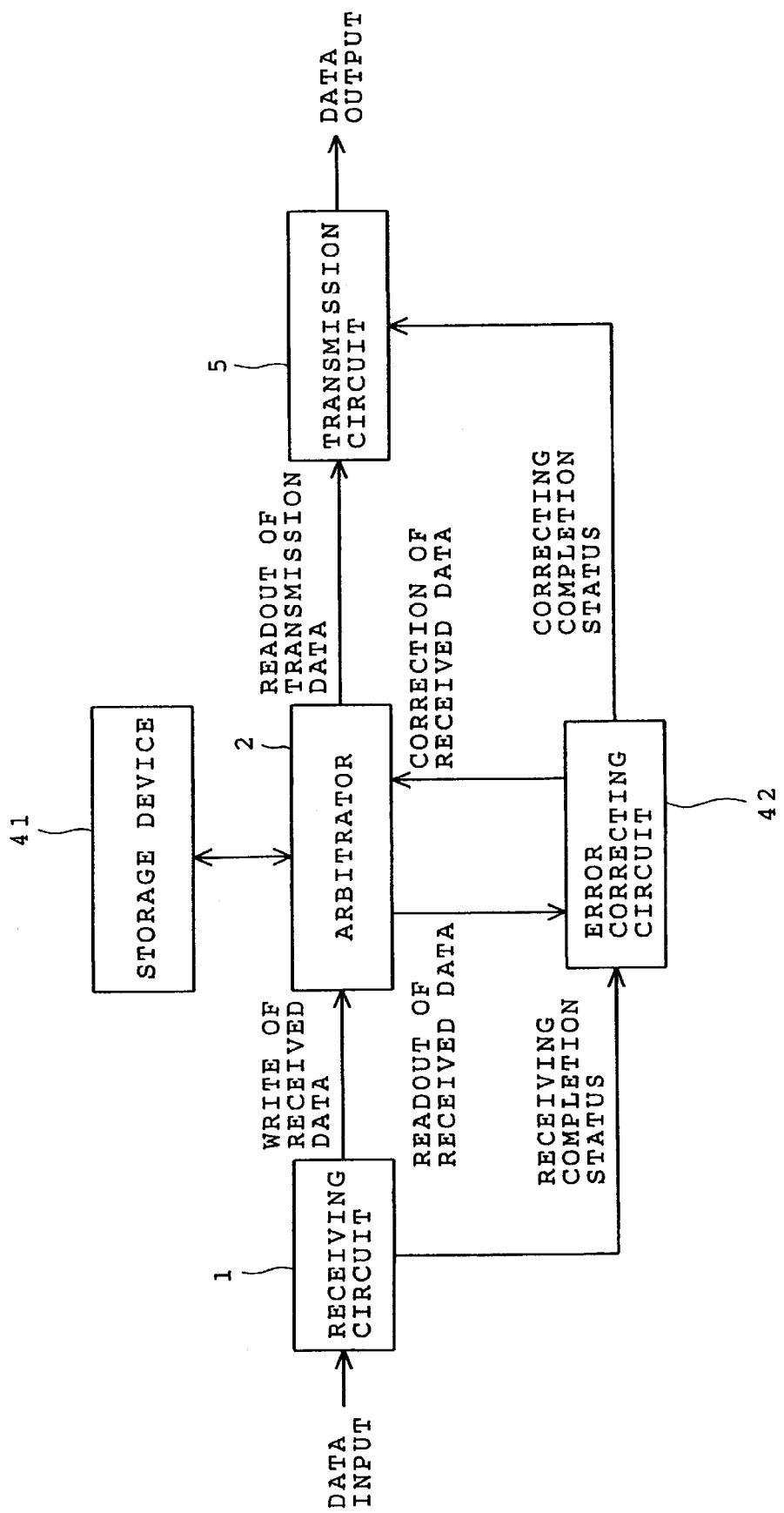
FIG. 1 is a block diagram showing an electrical arrangement of a DVD data reproducing device as a first embodiment in accordance with the present invention.
Figure 39:
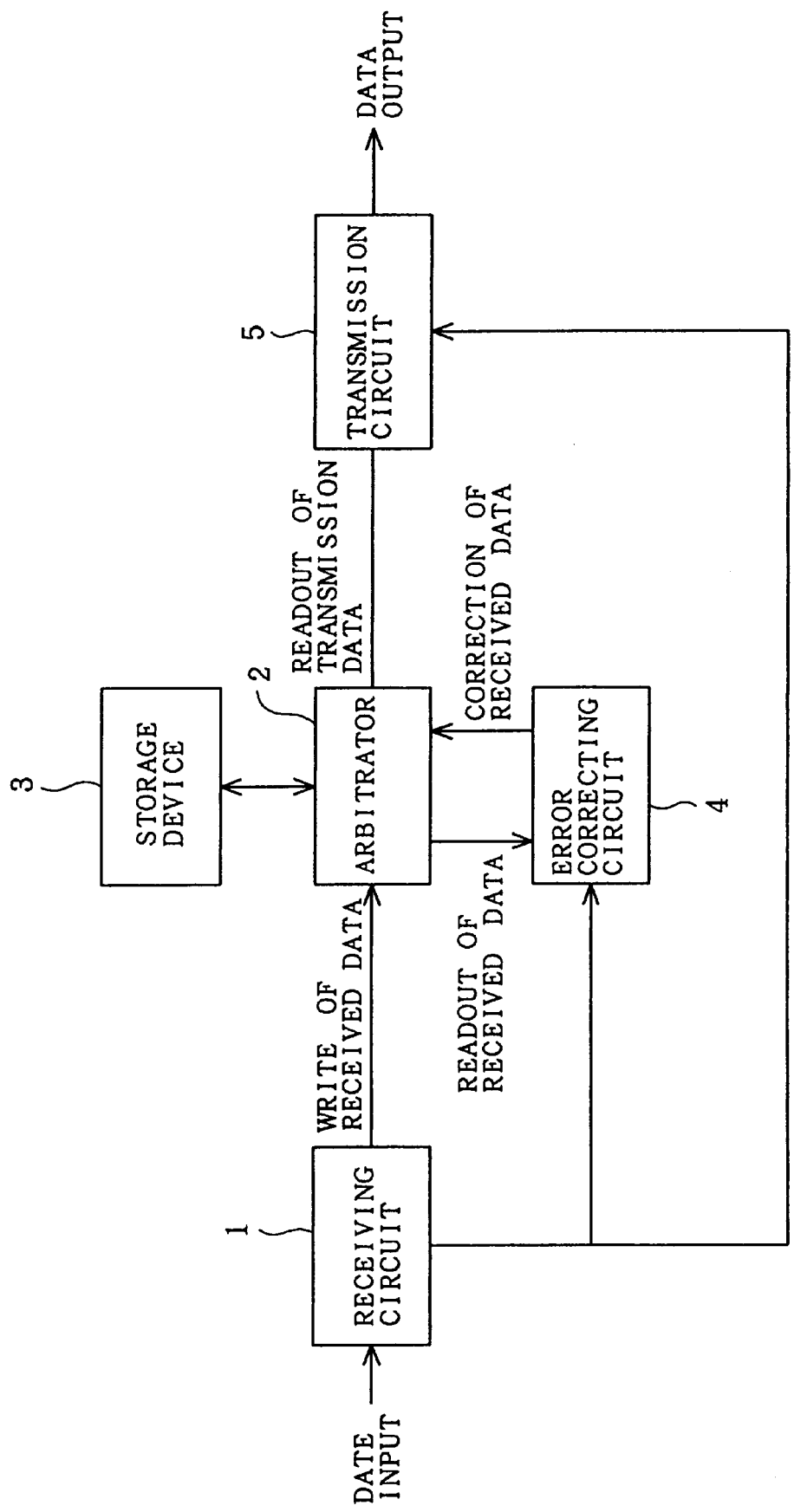
FIG. 39 is a block diagram similar to FIG. 1, showing a prior art.
Figure 40:
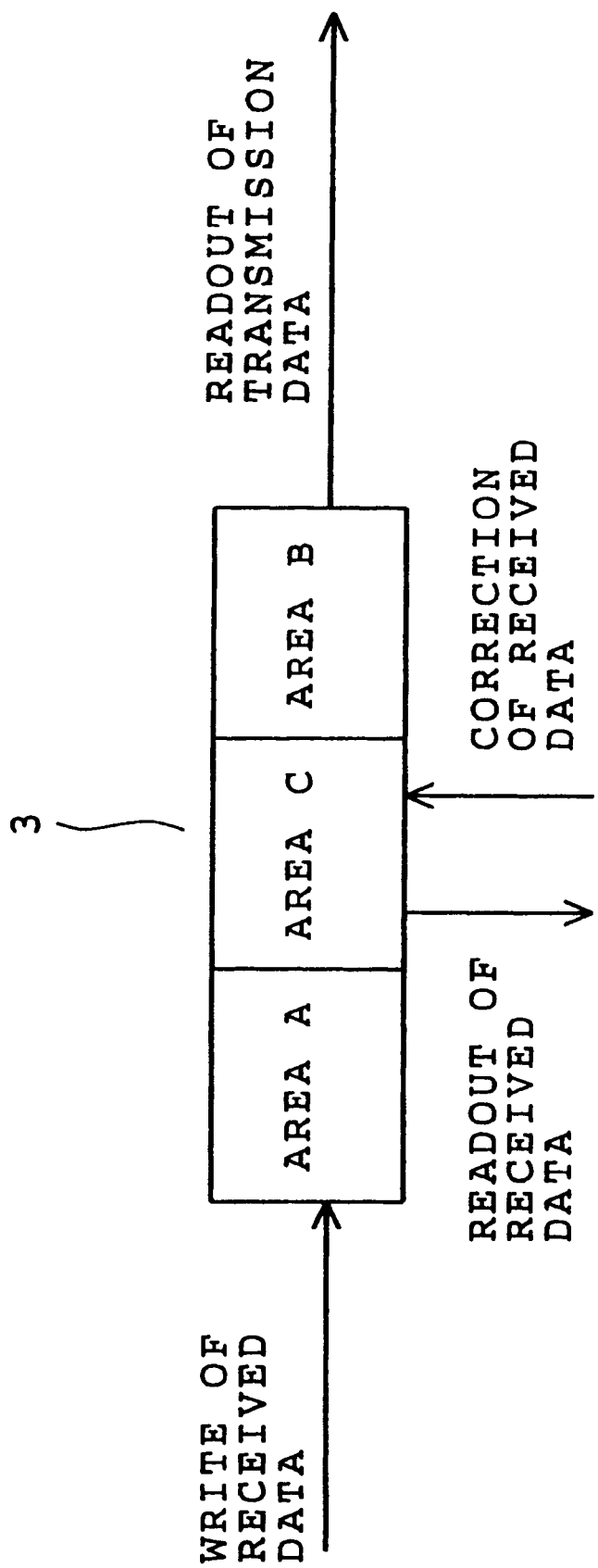
FIG. 40 is a view similar to FIG. 2, showing the prior art.
Figure 41:
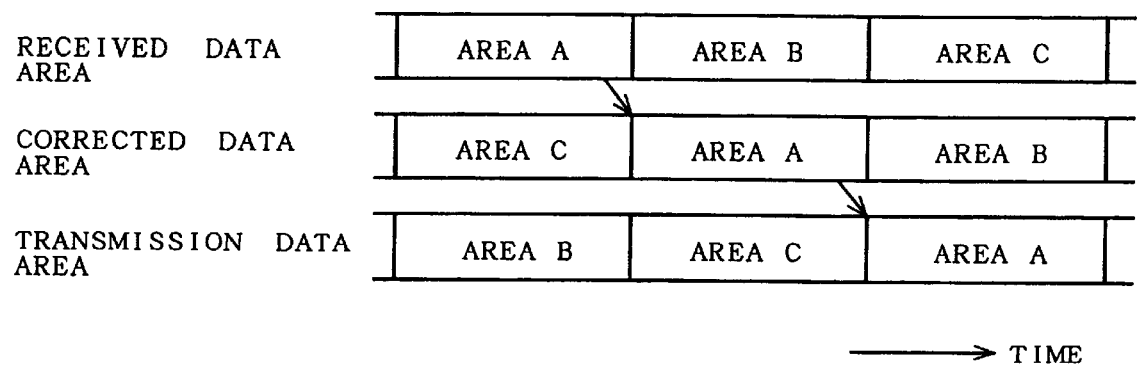
FIG. 41 is a view similar to FIG. 3, showing the prior art.
Figure 42:
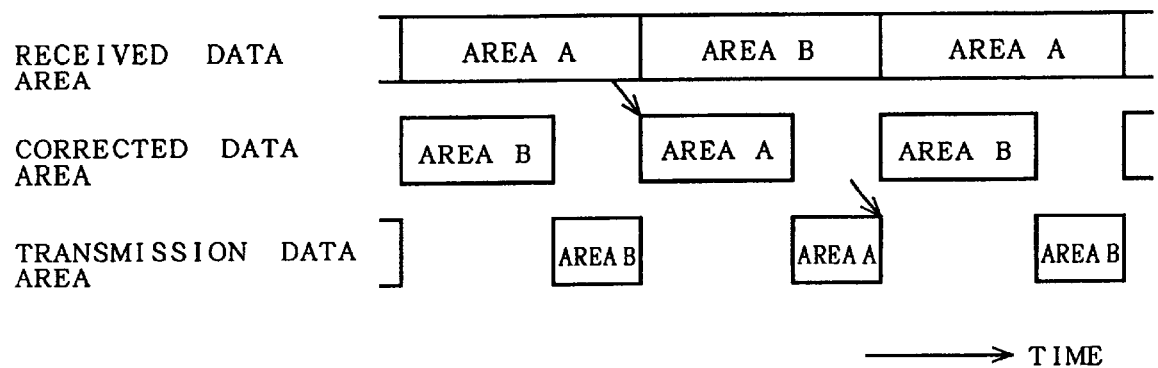
FIG. 42 is also a view similar to FIG. 3, showing the prior art.

Referring to FIG. 1, a storage device 41 replaces the storage device 3 in FIG. 39 and comprises a RAM having two areas A and B each with a capacity corresponding to one block of data. Although the areas A and B are shown in parallel with each other, for example, in FIG. 4, they may be contiguous areas in the storage device 41 and a head address of the area B is set to follow a final address of the area A. An error correcting circuit 42 replaces the error correcting circuit 4. An operating speed of the error correcting circuit 42 for error detection and error correction of the data per block is set to be slightly higher than a speed at which the receiving circuit receives one block of data. The other constitution of the error correcting circuit 42 is the same as that of the device 4 in FIG. 39.

An error correcting code employed in a DVD is constituted by a Reed-Solomon product code including two sequences of codes, namely, an inner parity (PI) code in which the number of 8-bit symbols in each row of codes is 182 and an outer parity (PO) code in which the number of 8-bit symbols is 208. A capacity of one block is 182×208 bytes.

The operation of the DVD reproducing device will now be described with reference to FIGS. 3 to 6.

Figure 3:
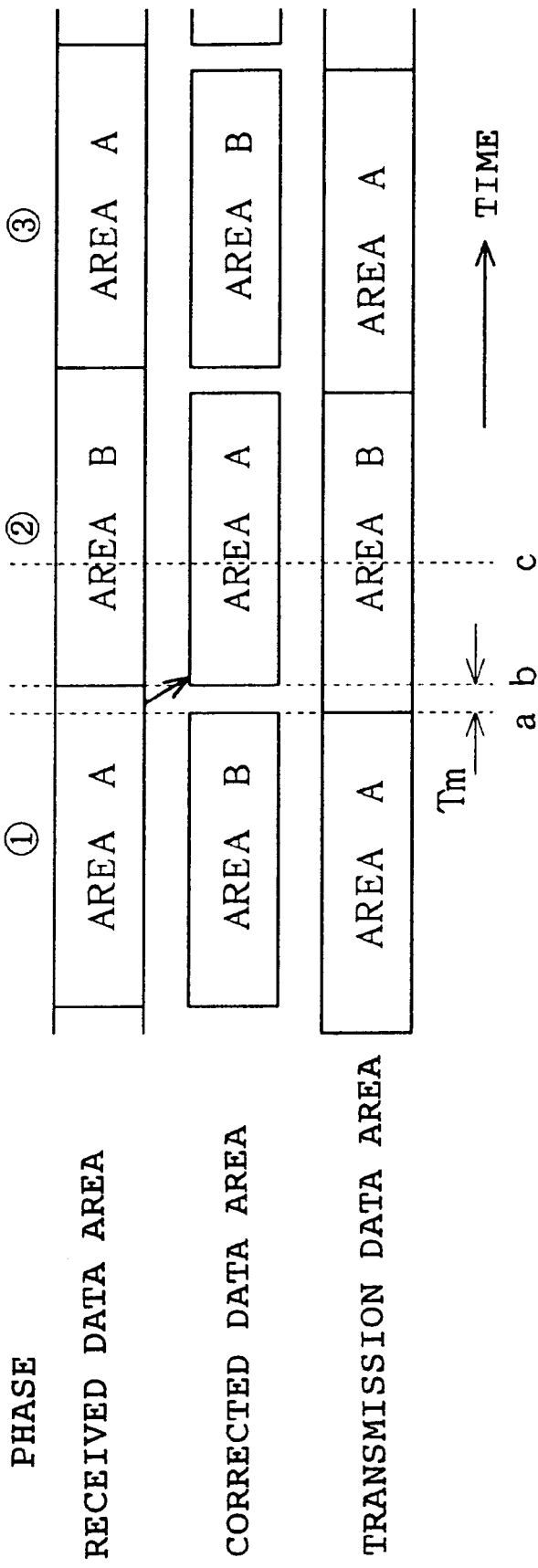
FIG. 3 is a time chart for explaining the switching of two areas A and B in use for data reception, error correction and data transmission.
Figure 4:
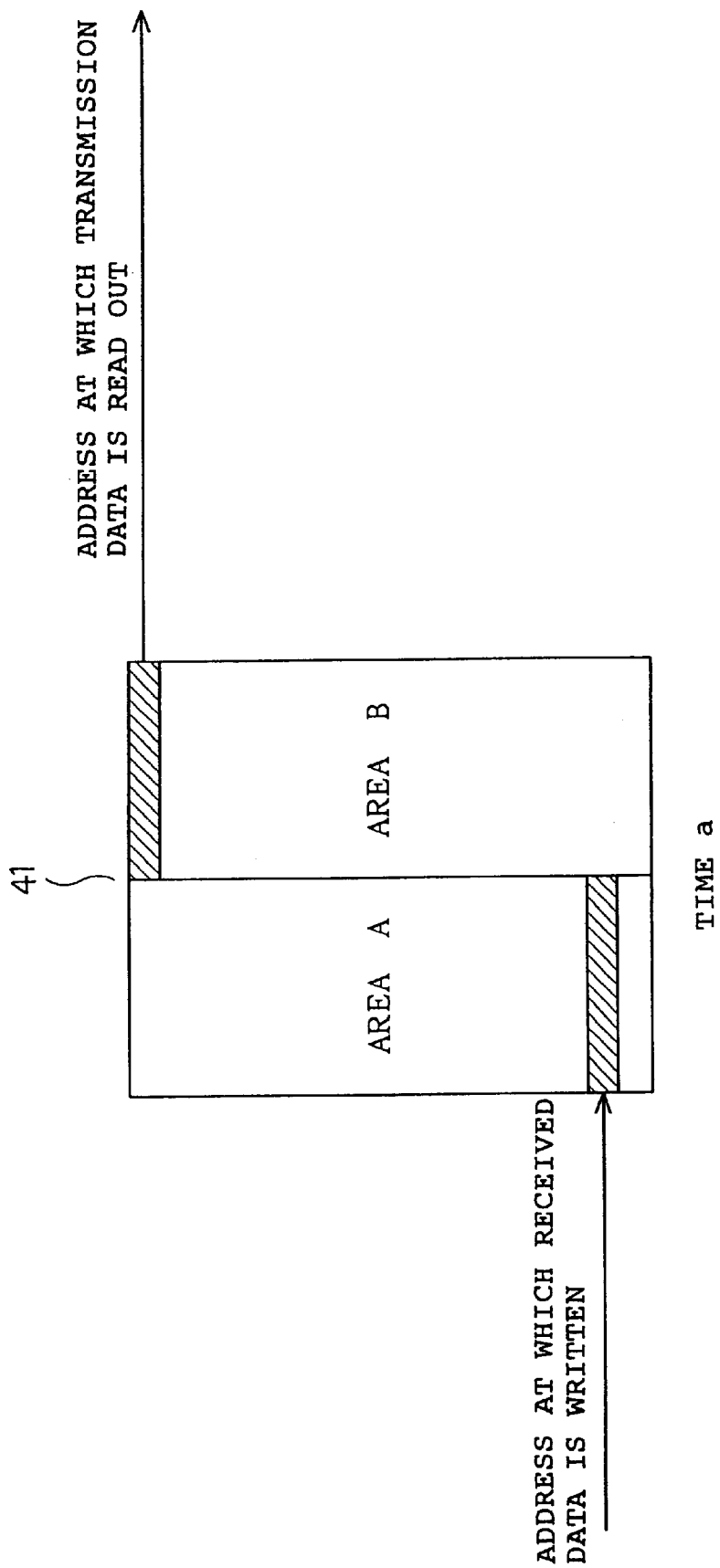
FIG. 4 illustrates processes executed for the areas A and B at time a in FIG. 3.
Figure 5:
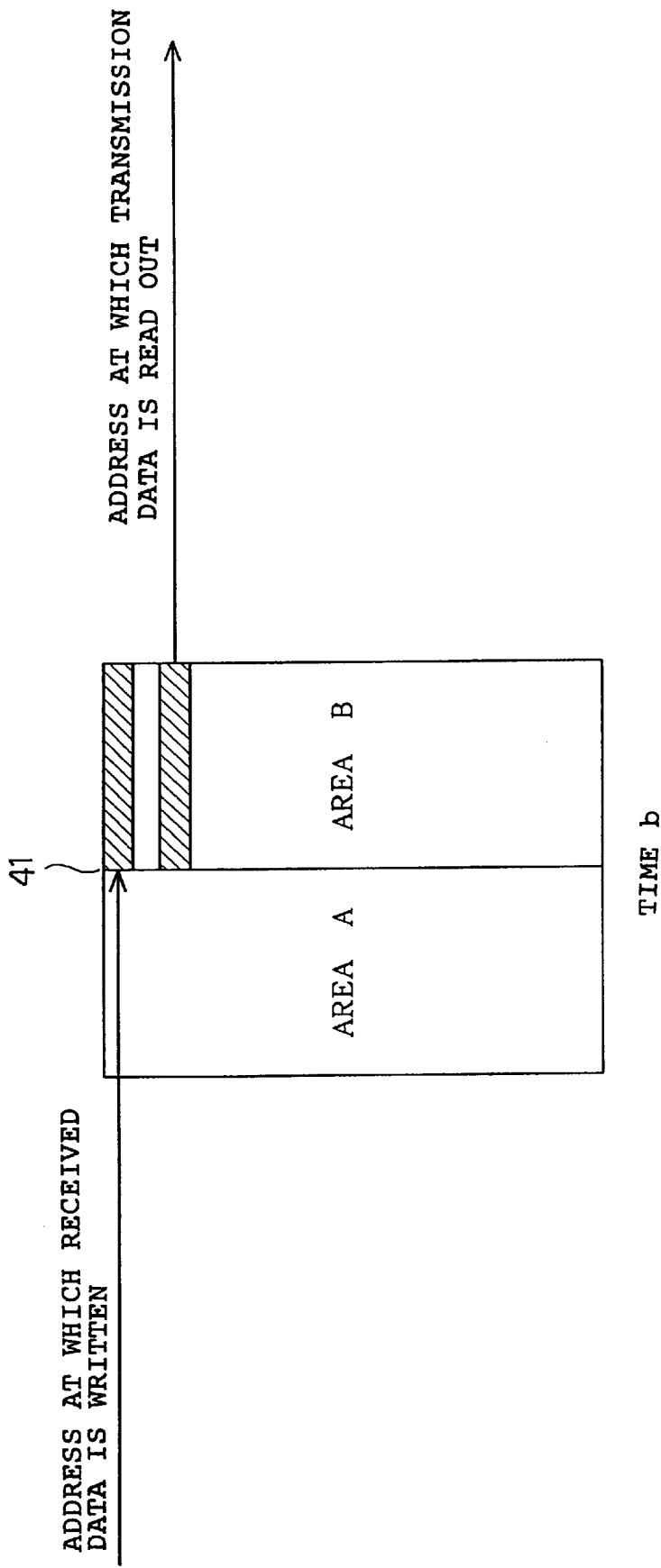
FIG. 5 illustrates processes executed for the areas A and B at time b in FIG. 3.
Figure 6:
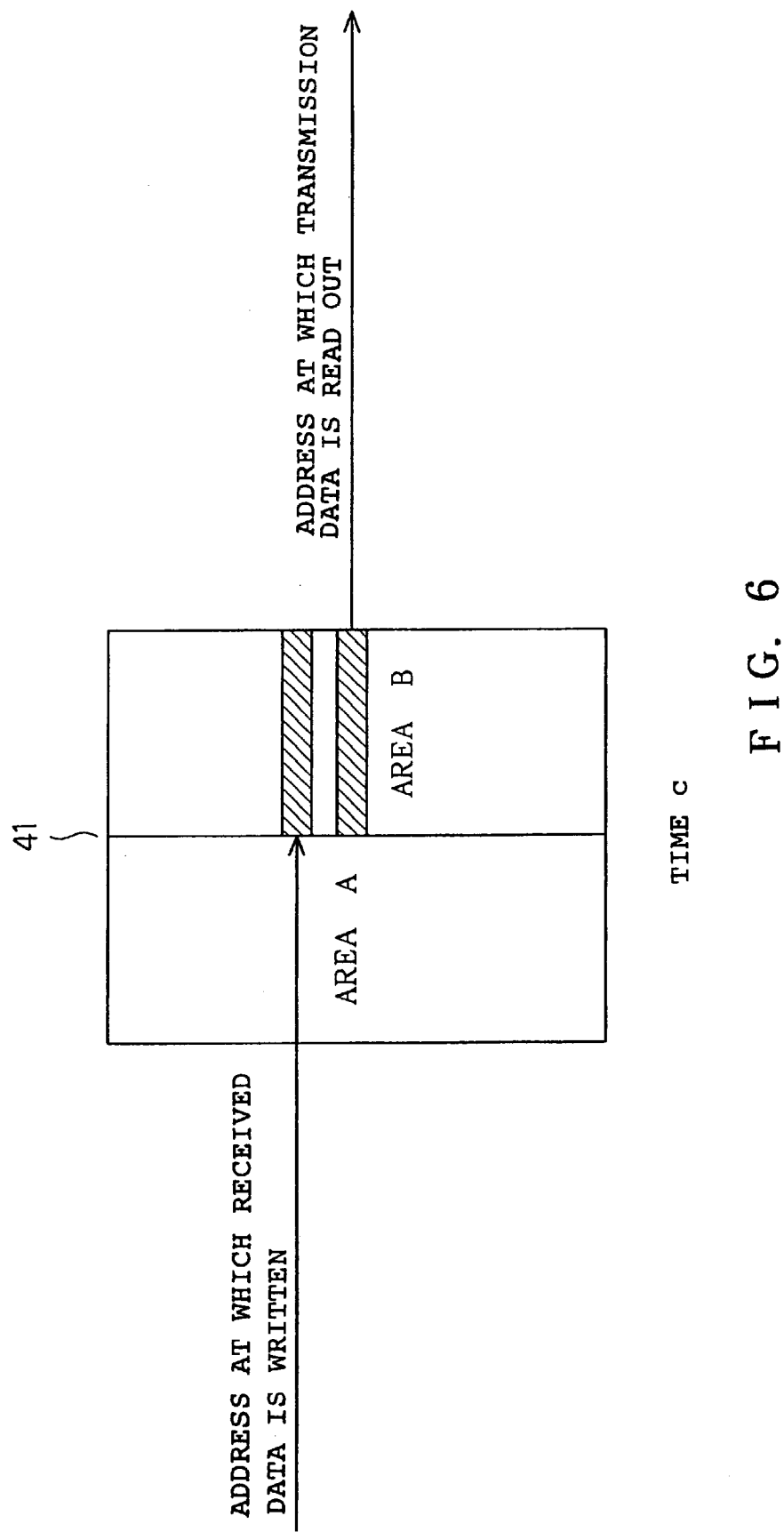
FIG. 6 illustrates processes executed for the areas A and B at time c in FIG. 3.

FIG. 3 is a time chart for explaining the switching of two areas A and B the receiving circuit 1, the error correcting circuit 42 and the transmission circuit 5 use for data reception, error correction and data transmission respectively. FIGS. 4, 5 and 6 illustrate processes executed for the areas A and B at times a, b and c in FIG. 3 respectively.

In FIG. 3, first, area A is used as a received data area at phase ①, for example. The receiving circuit 1 receives and then decodes data read out from the DVD disc (not shown) by an optical pickup (not shown), the data being composed as an error correcting code. Subsequently, the receiving circuit 1 writes the decoded data onto the area A of the storage device 41. At this time, the area B is used as a correction data area by the error correcting circuit 42. The error correcting circuit 42 performs an error detection and correction regarding the two sequence of codes PI and PO of one block of data stored in the area B which was a received data area at the last phase. When the process proceeds to a phase ② upon completion of the error correction regarding the one block of data, the area B is then used as the received data area by the receiving circuit 1, whereas the area A is used as the corrected data area by the error correcting circuit 42. Thus, both areas A and B are used alternately as the received data area and the corrected data area respectively.

Further, as shown in FIG. 3, a speed at which the error correcting circuit 42 performs the correcting process for one block of data is set to be higher than a speed at which the receiving circuit 1 writes one block of data onto the storage device 41, so that the correcting process completes earlier by time Tm than the writing operation of the receiving circuit 1. The time Tm is not fixed and varies according to changes in the speed at which the receiving circuit 1 writes the received data onto the storage device 41. However, the time Tm does not become zero even when the writing speed of the receiving circuit 1 becomes maximum, so that the time Tm equal to or above a predetermined positive value is ensured. Specifically, the time Tm is set so that an interval between an address at which the transmission circuit 5 reads out the transmission data to transmit it and an address at which the receiving circuit 1 writes the received data becomes an average of one sector which is equal to 2 kilo bytes in a data format of the DVD.

Figure 2:
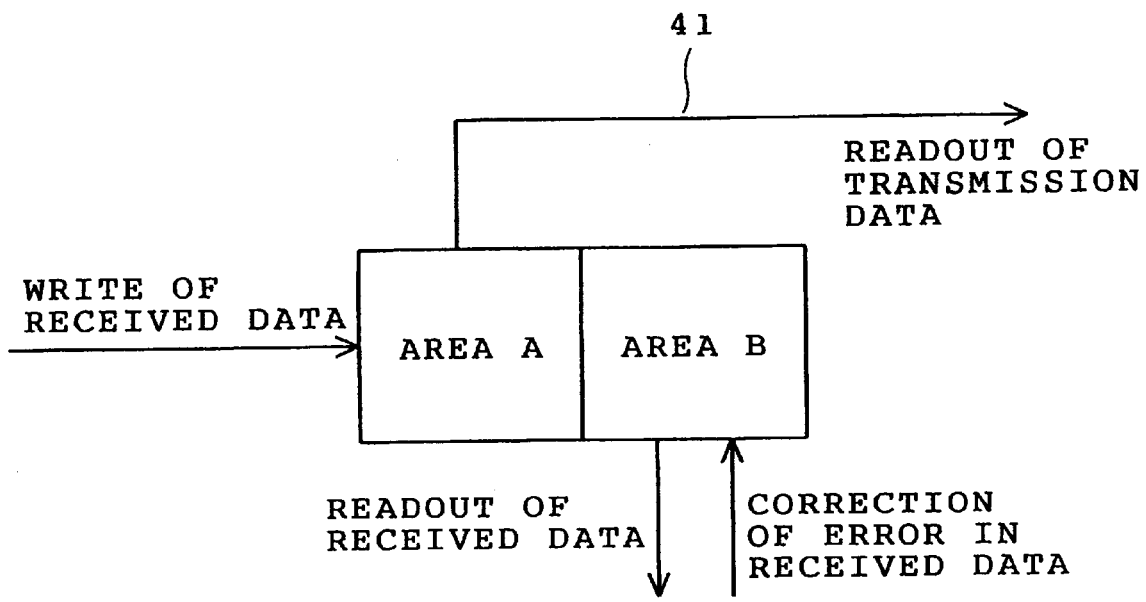
FIG. 2 is a schematic illustration of areas of a storage device.

At phase ①, the transmission circuit 5 reads out data of the area A regarding which the error correction has already been performed at the last phase, at an address preceding the address at which the receiving circuit 1 is writing data. FIG. 2 shows this state at phase ①. When supplied from the error correcting circuit 42 with a status signal indicative of completion of the error correction regarding one block of data, the transmission circuit 5 immediately starts, at phase ②, data transmission from the head of the area of corrected data (area B at phase ①, for example) immediately after completion of the error correction.

FIG. 4 shows the above-described state at time a in phase ①. More specifically, the transmission circuit 5 starts data transmission from a head address immediately after completion of the error correction regarding the area B, whereas the receiving circuit 1 is writing the received data onto an end portion of the area A. At this time, the error correcting circuit 42 is on standby for completion of the write of the received data onto the area A by the receiving circuit 1 and accordingly, is not executing the error correction.

FIG. 5 shows the state at time b immediately after transference to phase ②. More specifically, an address of area B at which the transmission circuit 5 is to transmit the transmission data proceeds forward. Following the transmission circuit 5, the receiving circuit 5 starts writing the received data at a head address of the area B from which the transmission data has already been transmitted. As described above, actually, the transmission is reading out the transmission data in advance of a write address of the receiving circuit 1. In this case, an interval between a readout address of the transmission data and the write address of the received data is about one sector according to time Tm, as described above. Simultaneously, the error correcting circuit 42 starts error correction regarding the area A.

FIG. 6 shows the state at time c in phase ②. More specifically, an address of the area B at which the transmission circuit 5 is to transmit the transmission data proceeds further forward. Following the transmission circuit 5, the receiving circuit 1 overwrites the received data at an address of the area B from which the transmission data has already been transmitted. When the error correcting circuit 42 performs the error correction at this time, the error correction is executed at least once or at more times for each of the two sequence of PI and PO codes of one block of data stored in the area A. Therefore, FIG. 6 does not show for what portion of the area A the processing is being executed. Thus, when one of the two areas A and B of the storage device 41 serves as the correction data area, the other serves as the received data area, so that the transmission data is used also as the received data area.

According to the above-described embodiment, the DVD data reproducing device comprises the storage device 41 having two areas A and B each of which has at least the capacity of one block of error correcting codes, and the error correcting circuit 42 constituted so that the time period during which it performs the error correction regarding one block of error correcting codes becomes shorter by the time Tm than the time period during which the receiving circuit 5 receives one block of error correcting codes. When the error correcting circuit 42 finishes writing into the corrected data area one block of the corrected data, the transmission circuit 5 immediately reads out the corrected data from the head address of said corrected data area to transmit the data. The receiving circuit 1 writes the received data at the address from which the transmission circuit 5 has already read out the data, within the time period during which the transmission circuit 5 reads out and transmits one block of the corrected data from the area which served as the corrected data area at the last phase, so that the area serves as the received data area.

Accordingly, the difference between the address at which the transmission circuit 5 reads out data and the address at which the receiving circuit 1 writes data is kept smaller than an address corresponding to the capacity equal to one block of data. Consequently, the receiving circuit 1 and the transmission circuit 5 can use one area commonly as the received data area and as the transmission data area respectively. Further, the storage device 41 needs only a capacity equal to two blocks without an independent transmission data area, whereby a required minimum capacity of the storage device 41 can be reduced to two thirds of that in the prior art.

Furthermore, an error correcting time of the error correcting circuit 42 is rendered shorter by time Tm than a data receiving time of the receiving circuit 5 so that the data transmission by the transmission circuit 5 slightly precedes the data reception by the receiving circuit 1. Accordingly, the error correction by the error correcting circuit 42 and the data transmission by the transmission circuit 5 need not be completed within a data receiving time, so that the constitution of each of the error correcting circuit 42 and the transmission circuit 5 can be simplified.

Figure 7:
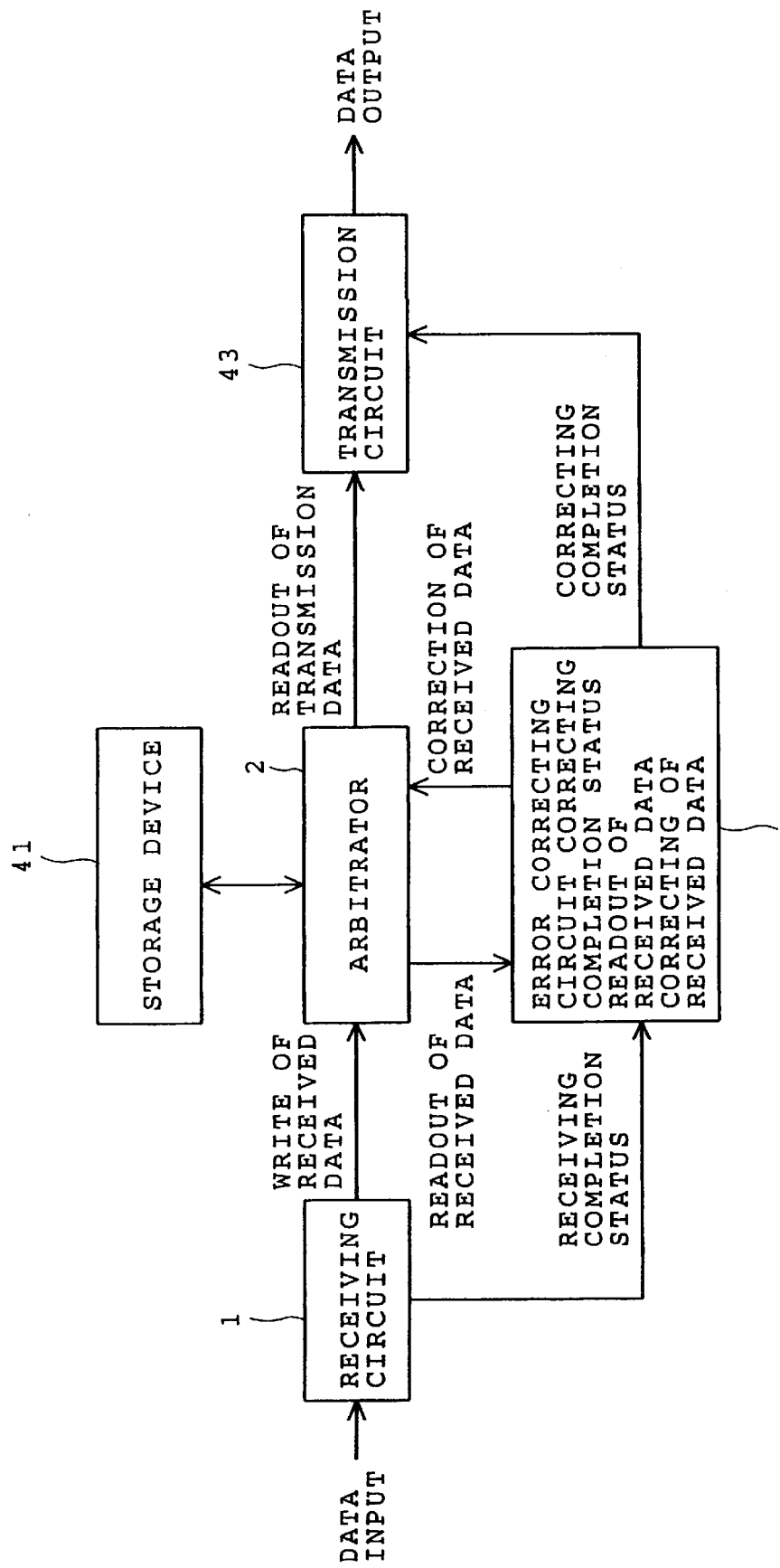
FIG. 7 is a view similar to FIG. 1, showing a second embodiment in accordance with the invention.
Figure 8:
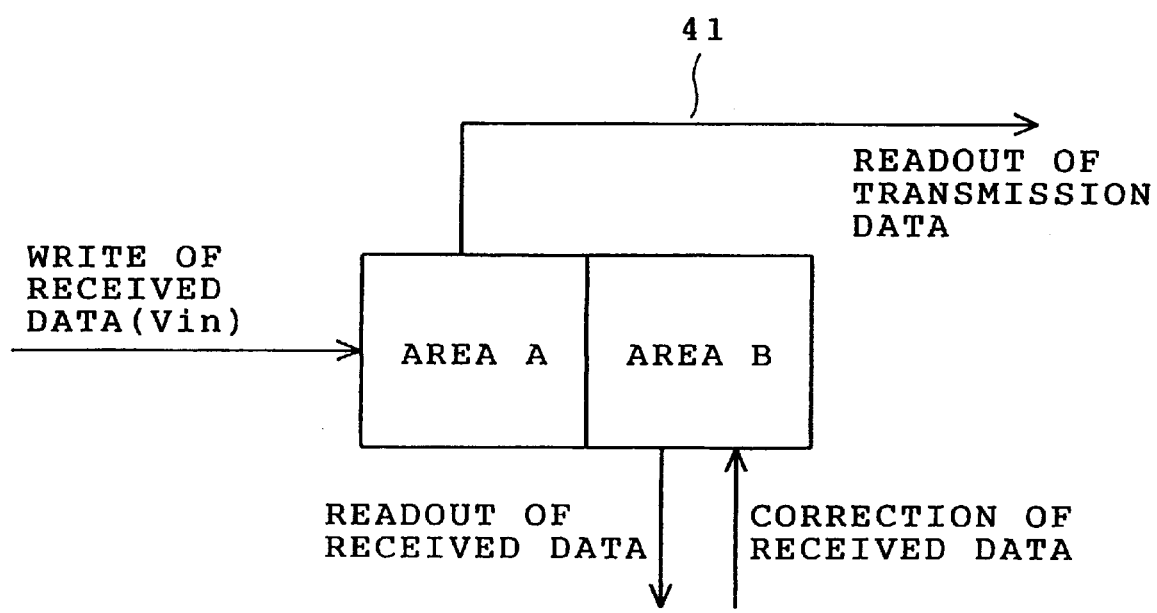
FIG. 8 is a view similar to FIG. 2.
Figure 9:
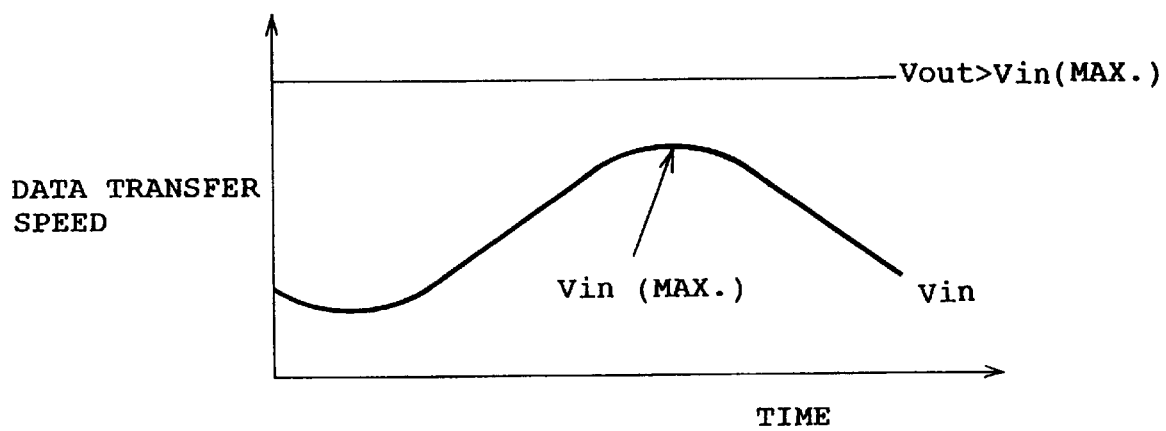
FIG. 9 is a graph showing the relationship between a transfer speed of received data and a transfer speed of transmission data.

FIGS. 7 to 9 illustrate a second embodiment. The identical or similar components in the second embodiment are labeled by the same reference symbols as those in the first embodiment, and the description of these parts are eliminated. Only the differences between the first and second embodiments will herein described. Referring to FIG. 7 showing the electrical arrangement of the DVD data reproducing device, a transmission circuit 43 replaces the transmission circuit 5 in the first embodiment. The other arrangement is the same as that in the first embodiment.

Reference symbol Vin designates a speed at which the receiving circuit 1 writes the received data onto the storage device 41 and reference symbol Vout designates a speed at which the transmission circuit 43 reads out the transmission data from the storage device 41, as shown in FIG. 8. The write speed Vin varies due to high-speed reproduction of data recorded on the DVD, changes in a data readout linear speed as in the search of a specific data, or movement of a tracking position of the pickup. The readout speed Vout of the transmission circuit 43 is set at a value larger than a maximum speed Vin(max) of the varying write speed Vin (Vout>Vin), as shown in FIG. 9.

According to the second embodiment, the readout speed Vout of the transmission circuit 43 is higher than the write speed Vin of the receiving circuit 1 even when the receiving circuit 1 writes the received data at the address from which the transmission circuit 43 has transmitted the data., Accordingly, the data readout address of the receiving circuit 1 is not caught up with by the data write address of the transmission circuit 43, so that the data to be transmitted can reliably be prevented from being overwritten to be lost.

Figure 10:
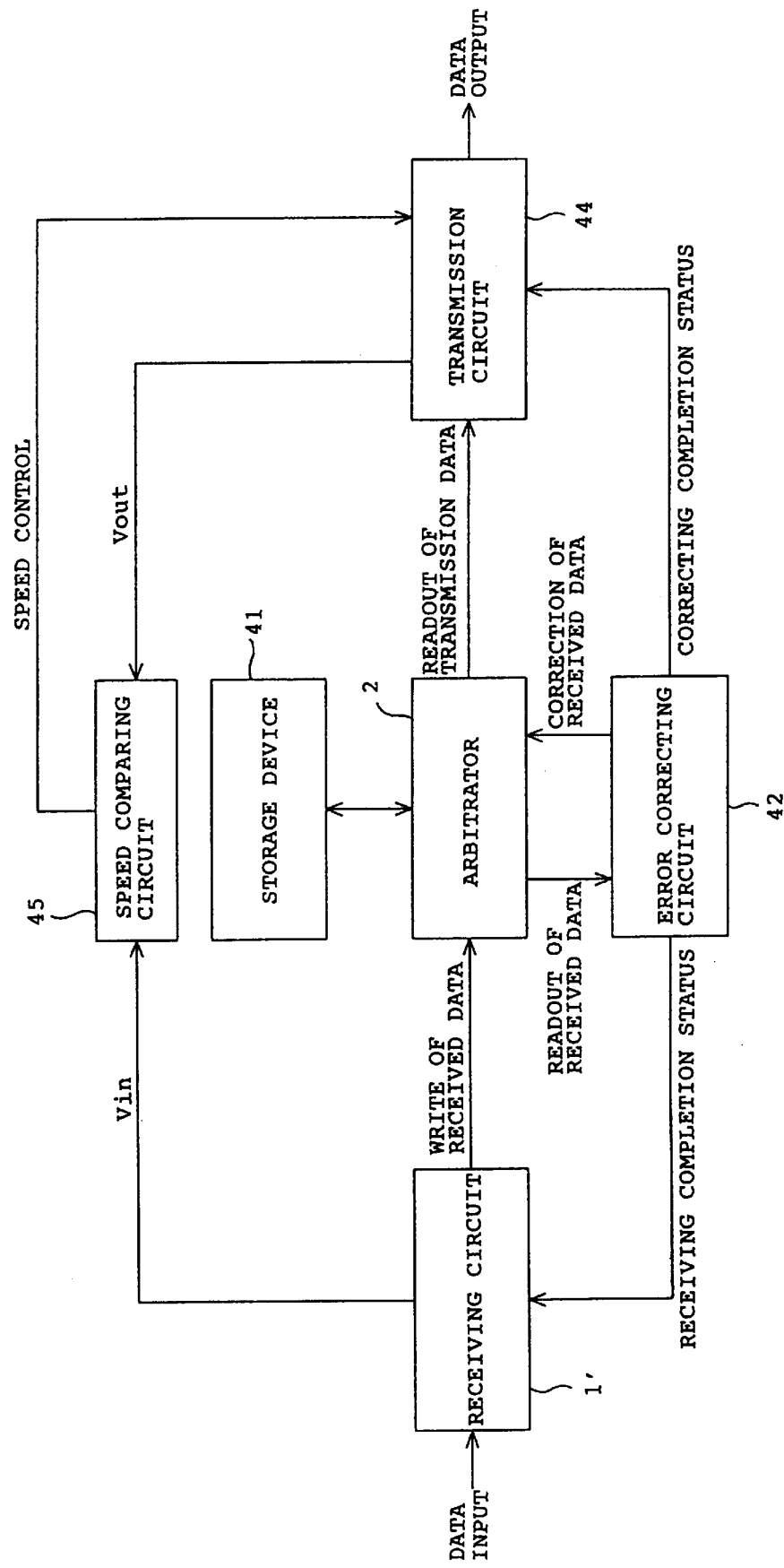
FIG. 10 is a view similar to FIG. 1, showing a third embodiment in accordance with the invention.

FIG. 10 illustrates a third embodiment. Only the differences between the first and third embodiments will be described. Referring to FIG. 10, a transmission circuit 44 is provided in the third embodiment, instead of the transmission circuit 5. Further, a speed comparing circuit 45 (readout speed control circuit) is provided for referring to and comparing the data write speed Vin of the receiving circuit 1' and the data readout speed Vout of the transmission circuit 44, thereby delivering to the transmission circuit 44 a control signal for control of the data readout speed Vout. The transmission circuit 44 changes the data readout speed Vout according to the control signal delivered from the speed comparing circuit 45. The other arrangement is the same as that in the first embodiment.

The operation of the DVD data reproducing device of the third embodiment will now be described. Even when the write speed Vin varies as shown in FIG. 9 of the second embodiment, the speed comparing circuit 45 compares the write speed Vin and the readout speed Vout to thereby deliver the control signal to the transmission circuit 44 so that the readout speed Vout is rendered higher than the write speed Vin. The transmission circuit 44 changes the readout speed Vout according to the control signal supplied thereto in a dynamic manner. Consequently, the difference between both speeds can be controlled so as to be maintained at a fixed value, for example.

According to the third embodiment, the speed comparing circuit 45 supplies the control signal to the transmission circuit 44 so that the readout speed Vout is higher than the write speed Vin. Accordingly, the data readout address of the transmission circuit 44 can be prevented from being caught up with by the data write address of the receiving circuit 1' even when the write speed Vin varies. This can reliably prevent the data to be transmitted from being lost as in the second embodiment.

Further, since the transmission circuit 44 dynamically changes the readout speed Vout according to the control signal supplied thereto from the speed comparing circuit 45, the readout speed Vout need not be set at a predetermined value so as to be higher than the maximum write speed Vin(max). Consequently, unnecessary radiation and consumed electric power can be reduced.

FIG. 11 illustrates a fourth embodiment. Only the differences between the first and fourth embodiments will be described. Referring to FIG. 4, a receiving circuit 46 is provided in the fourth embodiment, instead of the receiving circuit 1. Further, an address comparing circuit (write interrupting circuit) 47 is provided for referring to and comparing a write address at which the receiving circuit 46 writes the received data onto the storage device 41 and a readout address at which the transmission circuit 5 reads out the transmission data from the storage device 41, so that the address comparing circuit 47 monitors the interval between these addresses as to whether the interval is maintained at a predetermined value, e.g., a value corresponding to one sector. The interval between the addresses is equal to or above the predetermined value if the processes of the data reception, the error correction and the data transmission are normally carried out.

When the interval is below the predetermined value, there is a possibility that the error-corrected data which has not been transmitted may be lost. In this case, the address comparing circuit 47 delivers a write interrupt signal to the receiving circuit 46 (write control). Upon receipt of the write interrupt signal, the receiving circuit 46 interrupts data reception.

Further, the address comparing circuit 47 delivers to a system microcomputer 48 a status signal indicative of whether the receiving circuit 46 is normally receiving data. The system microcomputer 48 executes a user interface process according to the status signal, for example. The system microcomputer 48 is provided for generally controlling the overall system in the DVD data reproducing device. The other arrangement is the same as that in the first embodiment.

According to the fourth embodiment, for example, an address of the storage device 41 at which the received data is written is skipped to a large extent when disturbance in the receiving system prevents the receiving circuit from receiving a sector ID etc. of the received data. The address comparing circuit 47 interrupts the data writing operation of the receiving circuit 46 when the data write address approximates the data readout address of the transmission circuit 5 such that the interval therebetween is below the predetermined value. Consequently, the untransmitted data on the storage device 41 can be prevented from being lost due to overwrite by the receiving circuit 46.

Figure 12:
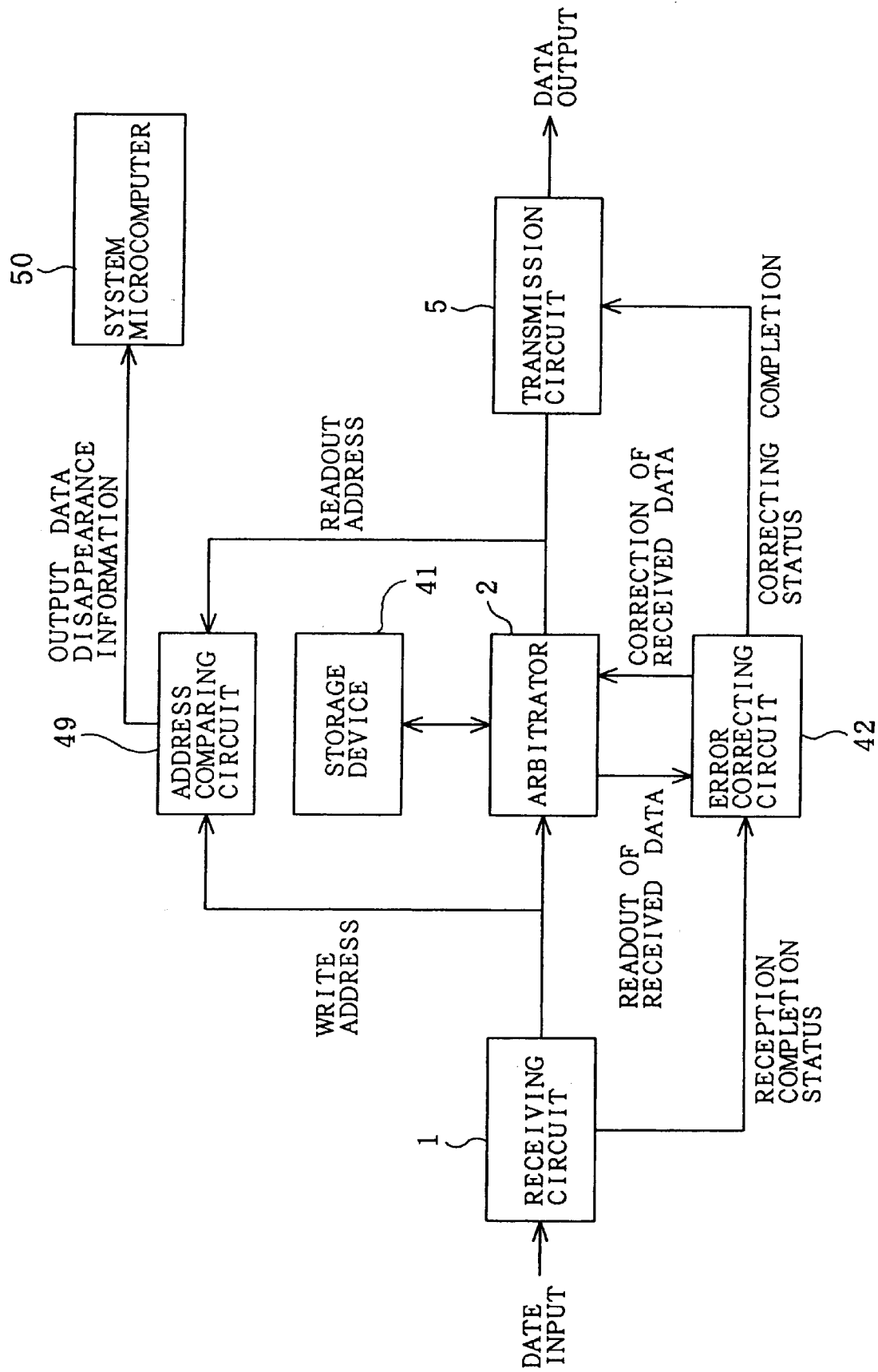
FIG. 12 is a view similar to FIG. 1, showing a fifth embodiment in accordance with the invention.

FIG. 12 shows a fifth embodiment. Only the differences between the first and fourth embodiments and the fifth embodiment will be described. Referring to FIG. 12, an address comparing circuit (data disappearance judging circuit) 49 is provided for referring to and comparing the write address at which the receiving circuit 1 writes data onto the storage device 5 and the readout address at which the transmission circuit 5 reads out data from the storage device 41. The address comparing circuit 49 judges the error-corrected untransmitted data in the storage device 41 to be lost when the write address becomes equal to or precedes the readout data.

Further, when judging the untransmitted data to be lost, the address comparing circuit 49 delivers a status signal to the system microcomputer 50. In response to the status signal, the system microcomputer 50 executes a user interface process etc. The other arrangement is the same as that in the first embodiment.

According to the fifth embodiment, when the write address of the receiving circuit 1 becomes equal to or precedes the readout address of the transmission circuit 5 for some reason or other, there is a high possibility that the untransmitted data on the storage device 41 has been overwritten. In this case, the address comparing circuit 49 judges the data to be lost. Consequently, an external processing system subsequent to the system microcomputer 50 and the transmission circuit 5 can properly deal with the lost data (re-readout of the corresponding data, for example), based on the results of judgment by the address comparing circuit 49.

The present invention should not be limited to the embodiments described above with reference to the accompanying drawings. The invention may be modified or expanded as follows. The arbitrator may be composed integrally with the storage device in each of the above-described embodiments. Further, the functions of the arbitrator may be allotted to the receiving circuit, the error correcting circuit and the transmission circuit so that the requirement for access to the storage device is shared with these circuits for execution of arbitration.

Although the interval between the write and readout addresses is an average of one sector in each embodiment, it may be larger than one sector with its upper limit below one block.

Each area of the storage device has a capacity corresponding to at least one block of error correcting code in each of the foregoing embodiments. However, the capacity of each area may be larger than one block.

The storage device need not be constituted by a single storage element such as a RAM. For example, the storage device may comprise two storage elements each of which has a capacity equal to at least one block of error correcting code and arbitrates access thereto of the receiving circuit, the error correcting circuit and the transmission circuit.

The address comparing circuit 47 in the fourth embodiment may be provided with the function of the data disappearance judging circuit in the fifth embodiment.

Although the present invention is applied to the DVD data reproducing device in each of the foregoing embodiments, the invention can be applied to equipment for reproducing data composed of error correcting codes of a block completion type. Further, although the error correcting code is a product code in each embodiment, it may be a single sequence of codes.

Figure 13:
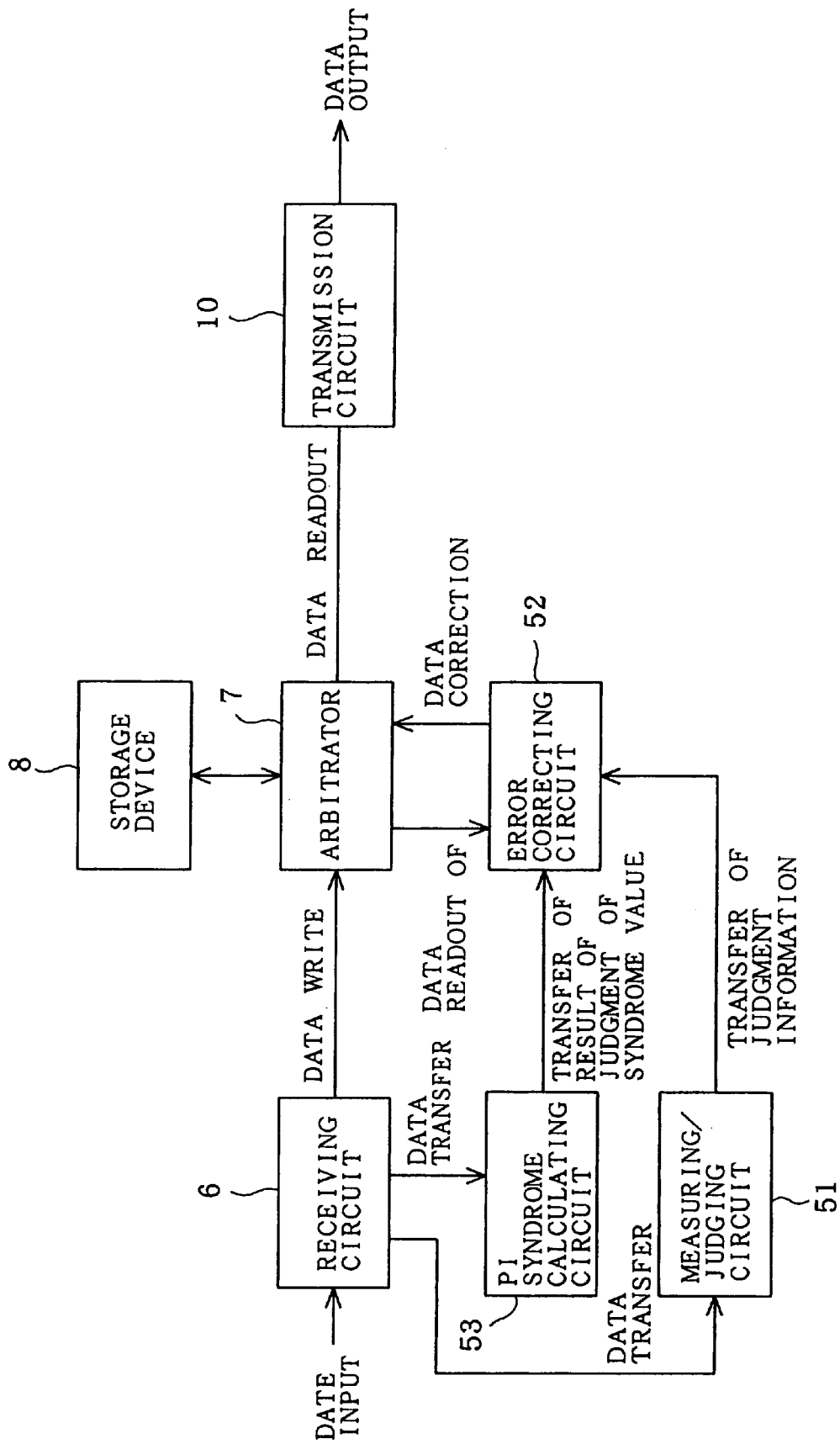
FIG. 13 is a block diagram showing an electrical arrangement of a DVD data reproducing device as a sixth embodiment in accordance with the present invention.
Figure 14:
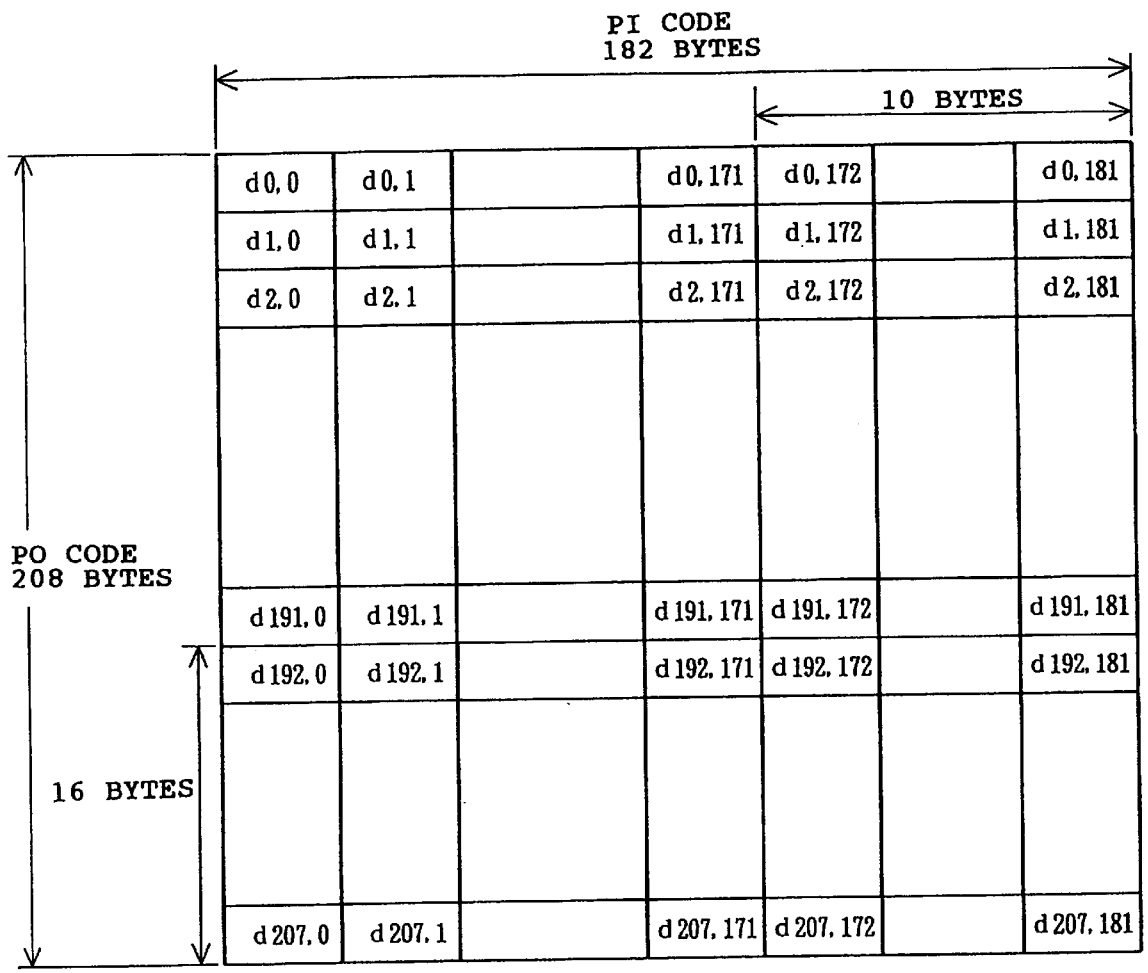
FIG. 14 illustrates a data format of error correcting codes employed in a DVD.
Figure 43:
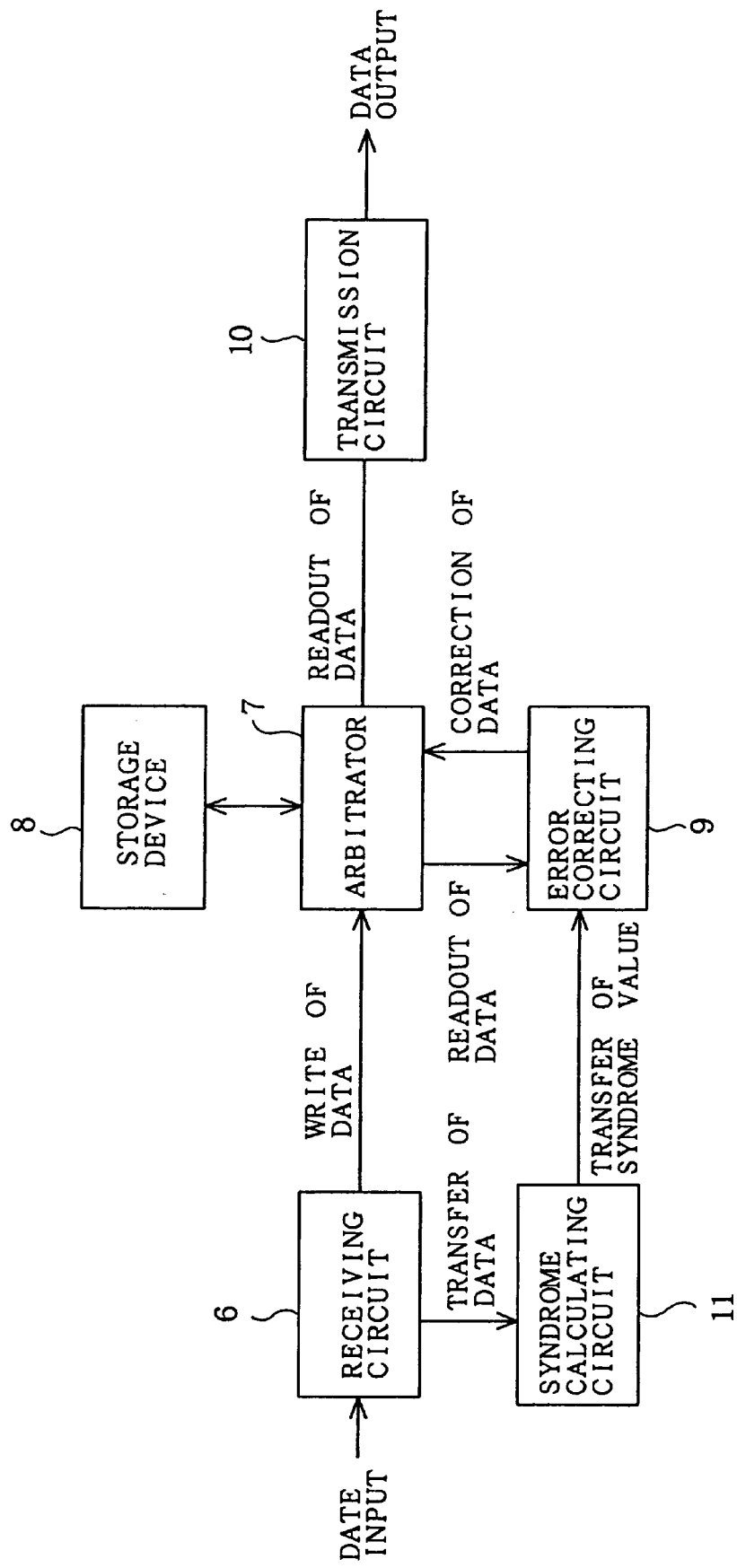
FIG. 43 is a view similar to FIG. 13, showing another prior art.

FIGS. 13 to 15 illustrate a sixth embodiment. The error correcting device of the invention is applied to a DVD data producing device in the sixth embodiment. The identical or similar components in the sixth embodiment are labeled by the same reference symbols as those in the constitution shown in FIG. 43, and the description of these components are eliminated. Only the differences between the sixth embodiment and the constitution shown in FIG. 43 will herein be described.

The receiving circuit 6 receives signals the pickup (not shown) has optically read from the DVD disc (not shown). The receiving circuit 6 receives a synchronization signal located at the head of each one frame of a data format of the DVD.

Further, the receiving circuit 6 generates a latch pulse signal in synchronization with input of data of 182 bytes every two frames in the PI sequence, based on clock signals generated on the basis of a row of received data by a PLL circuit (not shown) incorporated in the receiving circuit. The receiving circuit 6 latches the data of 182 bytes (symbols in the unit of one byte) by means of the latch signal, thereby performing data reception. Thereafter, the received 16-bit data is demodulated to 8-bit data, which is then written onto the storage device 8 by the receiving circuit 6.

Referring to FIG. 13, a measuring/judging circuit 51 (syndrome judging circuit) receives the above-described various signals via the receiving circuit 6. From the time of output of the synchronization signal, the measuring/judging circuit 51 counts the number of times of output of the latch pulses generated by the receiving circuit 6. The measuring/judging circuit 51 judges whether the count is equal to 182 for every two frames (a predetermined value), thereby judging whether the receiving circuit 6 normally receives 182 symbols for every two frames. Based on the results of judgment, the measuring/judging circuit 51 delivers an invalidity judgment signal (judgment information) to the error correcting circuit 52. A PI syndrome calculating circuit (syndrome calculating circuit) 53 obtains data directly from the receiving circuit 6 to calculate a syndrome from the PI sequence of error correction signals in the DVD data. The PI syndrome calculating circuit 53 delivers the results of calculation to the error correcting circuit 52.

Referring to FIG. 14, data arrangement of one block of error correcting codes employed in the DVD data is shown. Each of sectors composing source data of the DVD is comprised of 2 K bytes. The error correcting code is added to the data every 16 sectors. The source data of 32 K bytes composes one block. Each one block of error correcting code is comprised of a Reed-Solomon product code including two sequences of codes, that is, an inner parity (PI) code having parameters of m=8, n=182, k=172 and d=1, and an outer parity (PO) code having parameters of m=8, n=208, k=192 and d=17. Parameter m designates a code length of one symbol. Parameter n designates the number of symbols in one row of code. Parameter k designates the number of symbols other than parity in one row of code. Parameter d designates a minimum distance between codes.

More specifically, as shown in FIG. 14, the inner code PI (d 0,0, d 0,1, d 0,2, . . . , d 0,181, . . . ) arranged in row is a sequence of code including 182 symbols each having a code length of 8 bit. The symbols include main data of 172 symbols and parity of 10 symbols. Further, the outer code PO (d 0,0, d 1,0, d 2,0, . . . , d207,0, . . . ) arranged in row is a sequence of code including 208 symbols each having a code length of 8 bit. The symbols include main data of 192 symbols and parity of 16 symbols. The main data other than the parity is 32.25 K bytes (172×192). A sector ID, EDC as parity of the sector ID, reserve, etc. are comprised of 0.25 K bytes.

The error correcting code having the above-described composition can correct up to 5 symbols regarding the inner code PI and up to 8 symbols regarding the outer code PO, depending upon the results of calculation of syndrome in its sequence of code. Further, by utilizing as an erasure pointer information of error detection position obtained from the results of calculation of syndrome in the other sequence of code, an erasure correction can be performed up to 10 symbols regarding the inner code PI and up to 16 symbols regarding the outer code PO. Data is actually received in an order of d 0,0, d 0,1, d 0,2, . . . d 0, 181, d 1,0, d 1,1, d 1,2, . . . , d 207,180, and d 207,181. Regarding the inner code PI, the actual order of data reception is the same as a code sequence order of error correcting code.

The operation of the DVD data reproducing device of the sixth embodiment will now be described. FIG. 15 is a flowchart of the procedure of error correction performed by an error correcting circuit 52. In FIG. 15, the error correcting circuit 15 judges whether the results of calculation of syndromes SI0 to SI9 of the PI code sequence delivered from a PI syndrome calculating circuit 53 are usable as having validity, depending upon whether the measurement/judging circuit 51 has delivered the invalidity judgment signal (step X1). When the results of calculation are valid, the error correcting circuit 52 judges whether symbol data contains error, based on the results of calculation of the syndromes SI0 to SI9 (step X4). The symbol data of the code row contains no error when the results of calculation of all the syndromes SI0 to SI9 show "0." Accordingly, the error correcting circuit 52 advances to step X8. The error correcting circuit 52 further advances to step X1 when the processes have not been completed for all the 208 rows and this is an initial error correction for PI code (step X8a).

Further, the measuring/judging circuit 51 delivers an invalidity judgment signal to thereby indicate that the results of calculation of the syndromes SI0 to SI9 are invalid when the number of times of output of the latch pulse from the receiving circuit 6, the number being counted from the time of output of the synchronization signal, is not "182" for every two frames. For example, the number of the delivered latch pulses becomes smaller than "182" when there is a partial omission of the symbol data, whereas the number of times becomes larger than "182" when noise is superposed on the latch pulse. In this case, the error correcting circuit 52 judges in the negative at step X and then sets the error location information regarding the PI sequence without judgment/correction on the basis of the results of calculation of the syndromes SI0 to SI9 (step X7), thereafter advancing to step X8.

On the other hand, when judging at step X4 that the symbol data contains error, the error correcting circuit 52 further judges whether the error is correctable based on the values of the syndromes SI0 to SI9 (step X5). When the error is correctable, the error correcting circuit 52 detects an error size and an error position based on the syndromes SI0 to SI9. The results of calculation are written onto a RAM or work area (not shown) incorporated in the error correcting circuit 52 to be stored.

After the receiving circuit 6 has written the received data onto the storage device 8, the error correcting circuit 52 reads out symbol data corresponding to the error position and adds the value of the size of error to the data value to thereby correct the error of the data, writing the corrected data onto the storage device 8 (step X6). On the other hand, when the data is uncorrectable, the error correcting circuit 52 sets error position information indicating that the PI code row includes an uncorrectable error (step X7).

When performing processes for all of the 208 rows of one block of PI code and judging in the affirmative ("YES") at step X8, the error correcting circuit 52 performs error correction regarding 182 rows of PO code sequence at steps X9 to X16. In the error correction of the PO code sequence, the erasure correction can be carried out by utilizing the error position information of the PI code sequence set at step X7 (steps X12 and X13).

When performing processes for all of the 182 rows of one block of PO code and judging in the affirmative ("YES") at step X15, the error correcting circuit 52 judges at step X16 whether the error correction is further performed. When the error correction is to be continued, the error correcting circuit 52 then reads out data of the PI code sequence from the storage device 8, calculating syndromes SI0 to SI9 on the basis of the read data (steps X2 and X3). More specifically, the error correcting circuit 52 refers to the syndromes SI0 to SI9 of the PI code row only in the initial error correction of the PI code row. In the second and subsequent error corrections, the error correcting circuit 52 judges in the negative ("NO") at step X8a and then reads out PI code row from the storage device 8 to calculate syndromes SI0 to SI9 by itself on the basis of the read data, thereby detecting error. The reason for this is that there is a possibility that error-corrected symbol data may be present as the result of execution of the first error correction of the PI code row. Accordingly, more errors of the data can be corrected when the syndromes SI0 to S19 are calculated on the basis of the data read out from the storage device 8 and then, the error correction is performed in the second and subsequent error corrections.

According to the sixth embodiment, the measuring/judging circuit 51 judges whether the receiving circuit 6 has received data of 182 symbols for every two frames, based on the receiving state of the receiving circuit. When the measuring/judging circuit 51 has not delivered the invalidity judgment signal, the error correcting circuit 52 uses the syndromes SI0 to SI9 calculated by the syndrome calculating circuit 53 for the initial error correction. On the other hand, when the invalidity judgment signal has not been delivered, the error correcting circuit 52 does not perform the error correction regarding the code sequence. More specifically, since the syndromes SI0 to SI9 calculated by the PI syndrome calculating circuit 53 are used in the initial error correction as described above, the error correcting circuit 52 can start the initial error correction without reading out the received data from the storage device 8 after one block of data has been written onto the storage device 8. Accordingly, a time required for the error detection and correction can be reduced. Further, in the second and subsequent error corrections, the error correcting circuit 52 reads out the data of PI code sequence and calculates the syndromes SI0 to SI9 based on the read data for the error detection. Consequently, more errors of the data can be corrected.

Further, the error correcting circuit 52 judges the validity of the syndromes SI0 to SI9 calculated by the PI syndrome calculating circuit 53 or whether the syndromes SI0 to S19 have been calculated on the basis of the proper number of symbols, based on the invalidity judgment signal delivered from the measuring/judging circuit 51. Accordingly, a false detection and a false correction are not executed regarding the past data remaining on the storage device 8 on the basis of the improperly calculated syndromes. Consequently, the reliability of the device can be improved since occurrence of a sudden noise is prevented during reproduction of images or sound by the DVD data.

Figure 17:
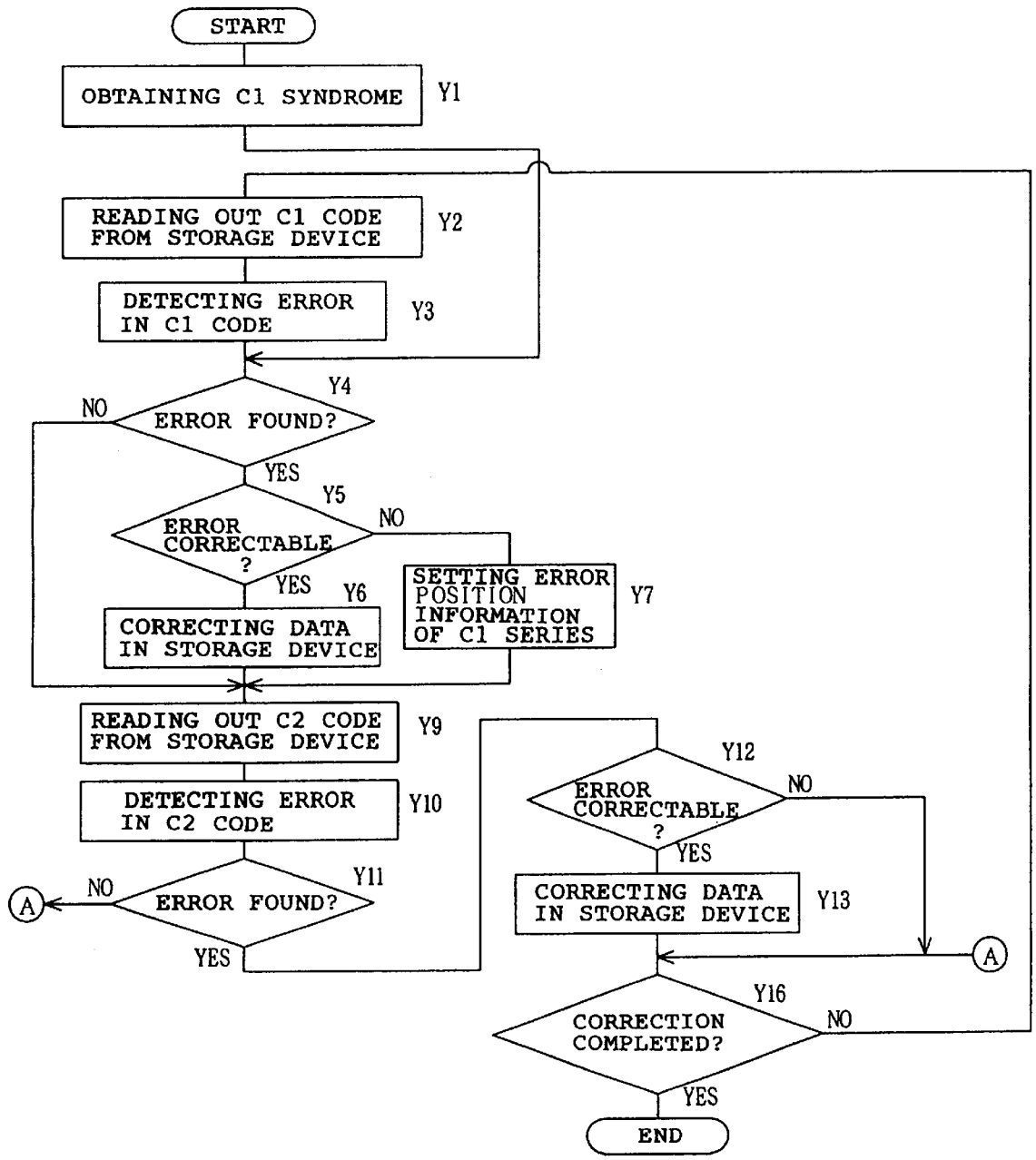
FIG. 17 is a view similar to FIG. 15.

FIGS. 16 and 17 show a seventh embodiment. The error correcting device of the invention is applied to a CD data reproducing device in the seventh embodiment. The identical or similar components in the seventh embodiment are labeled by the same reference symbols as those in the constitution shown in FIG. 43, and the description of these components are eliminated. Only the differences between the seventh embodiment and the constitution shown in FIG. 43 will herein be described. A receiving circuit 54 receives signals optically read from a CD disc (not shown) by the pickup (not shown). The receiving circuit 54 receives a synchronization signal located at the head of the data format of the CD for every one frame (588 channel bit). One frame in the data format of the CD is composed of a frame synchronization signal of 24 bit, a sub-coding of 14 bit (one symbol), data and parity of 14×32 bit (32 symbols) and an inter-symbol combining bit of 3×34 bit.

Further, the receiving circuit 54 generates a latch pulse signal in synchronization with input of data of 32 bytes every one frame, based on clock signals generated on the basis of a row of received data by a PLL circuit (not shown) incorporated therein. The receiving circuit 54 latches the data of 32 bytes (symbols in the unit of one byte) by means of the latch signal, thereby performing data reception. Thereafter, the received 14-bit data is demodulated to 8-bit data by means of EFM (eight to fourteen modulation) demodulation, which is then written onto the storage device 8 by the receiving circuit 54.

Referring to FIG. 16, a measuring/judging circuit 55 (syndrome judging circuit) receives the above-described various signals via the receiving circuit 54. The measuring/judging circuit 55 judges whether the receiving circuit 54 has properly received symbols of 32 bytes per frame, based on these various signals, thereby delivering an invalidity judgment signal (judgment information) to a switching circuit (syndrome output switching circuit) 56. A C1 syndrome calculating circuit (syndrome calculating circuit) 57 obtains data directly from the receiving circuit 54 to calculate syndromes S10 to S13 from the C1 sequence of error correcting code in the CD data. The PI syndrome calculating circuit 53 delivers the results of calculation to the switching circuit 56.

The switching circuit 56 delivers the syndrome values calculated by the calculating circuit 53 to a correcting circuit (error correcting circuit) 58 when no invalidity judgment signal is delivered from the measuring/judging circuit 55. Further, When the invalidity judgment signal has been delivered, the switching circuit 56 delivers any previously possessed uncorrectable syndrome value to the error correcting circuit 58 instead of the syndrome values calculated by the C1 syndrome calculating circuit 57.

The error correcting code employed in the CD data is comprised of a Reed-Solomon product code including two sequences of codes, that is, a C1 code sequence having parameters of m=8, n=32, k=28 and d=5, and a C2 code sequence having parameters of m=8, n=28, k=24 and d=5. In each code sequencer the error correction can be performed up to two symbols (=(d−1)/2=(5−1)/2). Further, the C2 code sequence is an interleaving sequence which includes data of 32 symbols per frame of the C1 code sequence every five frames. Accordingly, error position information obtained in the error correction for the C1 code sequence can be used as an erasure pointer for an erasure correction of the C2 code sequence. Inversely, error position information obtained in the error correction for the C2 code sequence cannot be used in the error correction of the C1 code sequence. Accordingly, a maximum of four symbols can be corrected regarding the C2 code sequence by the erasure correction.

The operation of the CD data reproducing device of the seventh embodiment will now be described. When obtaining a synchronization signal per frame of the CD data via the receiving circuit 54 and a latch pulse signal generated by the receiving circuit 54, the measuring/judging circuit 55 counts the number of times of output of the latch pulse signal from the time of output of the synchronization signal. The measuring/judging circuit 55 judges whether the count is "32" (a predetermined value). More specifically, the measuring/judging circuit 55 whether the receiving circuit 54 has delivered the latch pulse signals corresponding to 32 symbols until the synchronization signal of a next frame is delivered from the time of output of the synchronization signal, thereby judging whether the receiving circuit 54 has received data of 32 symbols per frame.

In a case where the receiving circuit 54 has received data of 32 symbols per frame, the syndrome calculated by the C1 syndrome calculating circuit 57 is expected to be based on the data of 32 symbols. Accordingly, the results of calculation can be judged to be correct. In this case, since the measuring/judging circuit 55 does not deliver the invalidity judgment signal, the switching circuit 56 delivers to the error correcting circuit 58 the syndrome value calculated by the C1 syndrome calculating circuit 57.

On the other hand, data reception is not normally be performed when disturbance occurs during the data receiving operation of the receiving circuit 54. When the number of the delivered latch pulse signals counted within the output interval of the synchronization signals by the measuring/judging circuit 55 does not agree with "32," the syndrome calculated by the C1 syndrome calculating circuit 57 is not based on the data of 32 symbols. Accordingly, the results of the calculation by the C1 syndrome calculating circuit 57 can be judged to be incorrect. In this case, the measuring/judging circuit 55 delivers the invalidity judgment signal to the switching circuit 56. Based on the invalidity judgment signal, the switching circuit 56 delivers the uncorrectable syndrome to the error correcting circuit 58.

FIG. 17 is a flowchart showing processes for correcting error by the error correcting circuit 58. The error correcting circuit 58 obtains the results of calculation of syndromes C10 to C13 of the C1 sequence previously calculated by the C1 syndrome calculating circuit 57 (step Y1). Based on the results of calculation, the error correcting circuit 58 judges whether the symbol data contains error (step Y4). The subsequent processes are obtained by basically altering the flowchart of FIG. 15 so that the processing contents match the data format of the CD. As described above, the error correcting code used in the CD data includes the C1 code sequence and the C2 code sequence obtained by applying an interleaving process to the C1 code sequence. Thus, the error correcting code used in the seventh embodiment is of a non-completion type and accordingly, has no general idea of "block" as the completion type error correcting code of the DVD data has.

One sequence of C2 code completes when 109 sequence of C1 codes become complete or have written onto the storage device 8. Accordingly, in the case of CD data, the error correction is performed alternately for the C1 and C2 code sequence every row. Therefore, steps corresponding to steps X8, X8a and X15 in FIG. 15 are eliminated in FIG. 17. Further, a step corresponding to step X14 is also eliminated since the error position information obtained in the error correction of the C2 code sequence cannot be used as erasure correction for the C1 code sequence.

In the flowchart of FIG. 17, the measuring/judging circuit 55 delivers the invalidity judgment signal when the data reception cannot normally be executed. The switching circuit 56 then delivers the uncorrectable syndrome to the error correcting circuit 58. The error correcting circuit 58 judges in the affirmative ("YES") at step Y4 and in the negative ("NO") at step Y5, setting error position information indicating that the C1 code sequence contains an uncorrectable error (step Y7).

According to the seventh embodiment, the measuring/judging circuit 55 judges whether the receiving circuit 54 has received the data of 32 symbols per frame. The switching circuit 56 delivers to the error correcting circuit 58 the syndrome value calculated by the C1 syndrome calculating circuit 57 when the measuring/judging circuit 55 has not delivered the invalidity judgment signal. On the other hand, when the measuring/judging circuit 55 has delivered the invalidity judgment signal, the switching circuit 56 delivers to the error correcting circuit 58 any uncorrectable syndrome value possessed by the switching circuit. Accordingly, a false detection and a false correction are not executed regarding the past data remaining on the storage device 8 on the basis of the improperly calculated syndromes. Consequently, the reliability of the device can be improved since occurrence of a sudden noise is prevented during reproduction of sound by the CD data.

Figure 18:
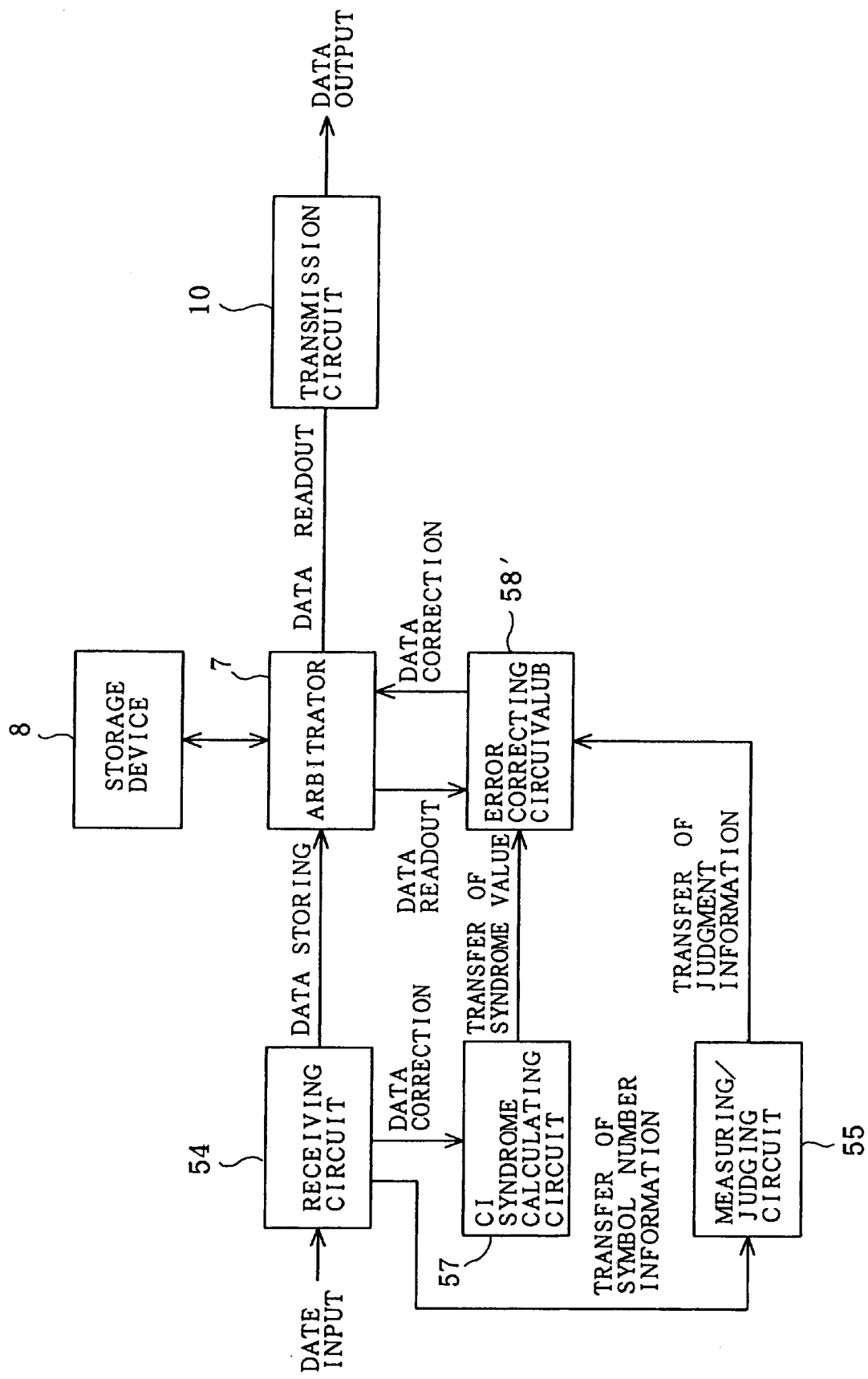
FIG. 18 is a view similar to FIG. 16, showing an eighth embodiment in accordance with the invention.

FIG. 18 shows an eighth embodiment. The identical or similar components in the eighth embodiment are labeled by the same reference symbols as those in the seventh embodiment, and the description of these components are eliminated. Only the differences between the seventh and eighth embodiments will herein be described. The switching circuit 56 employed in the constitution shown in FIG. 16 is eliminated in the constitution shown in FIG. 18. An error correcting circuit 58' is directly supplied with both the syndrome value delivered by the C1 syndrome calculating circuit 57 and the invalidity judgment signal delivered by the measuring/judging circuit 55. The other arrangement is the same as that in the seventh embodiment.

The operation of the CD data reproducing device of the eighth embodiment will be described. In the eighth embodiment, the processes shown in FIG. 15 are executed according to the data format of the CD. More specifically, the error correcting circuit 58' does not perform the error correction based on the syndrome value delivered by the C1 syndrome calculating circuit 57 when the measuring/judging circuit 55 has delivered the invalidity judgment signal.

According to the eighth embodiment, the error correcting circuit 58' directly obtains the invalidity judgment signal delivered by the measuring/judging circuit 55, so that an unnecessary error correction is avoided. Consequently, the error correction can efficiently be executed. Further, the overall size of the error correcting device can be rendered smaller since the switching circuit 56 employed in the seventh embodiment is not required.

Figure 19:
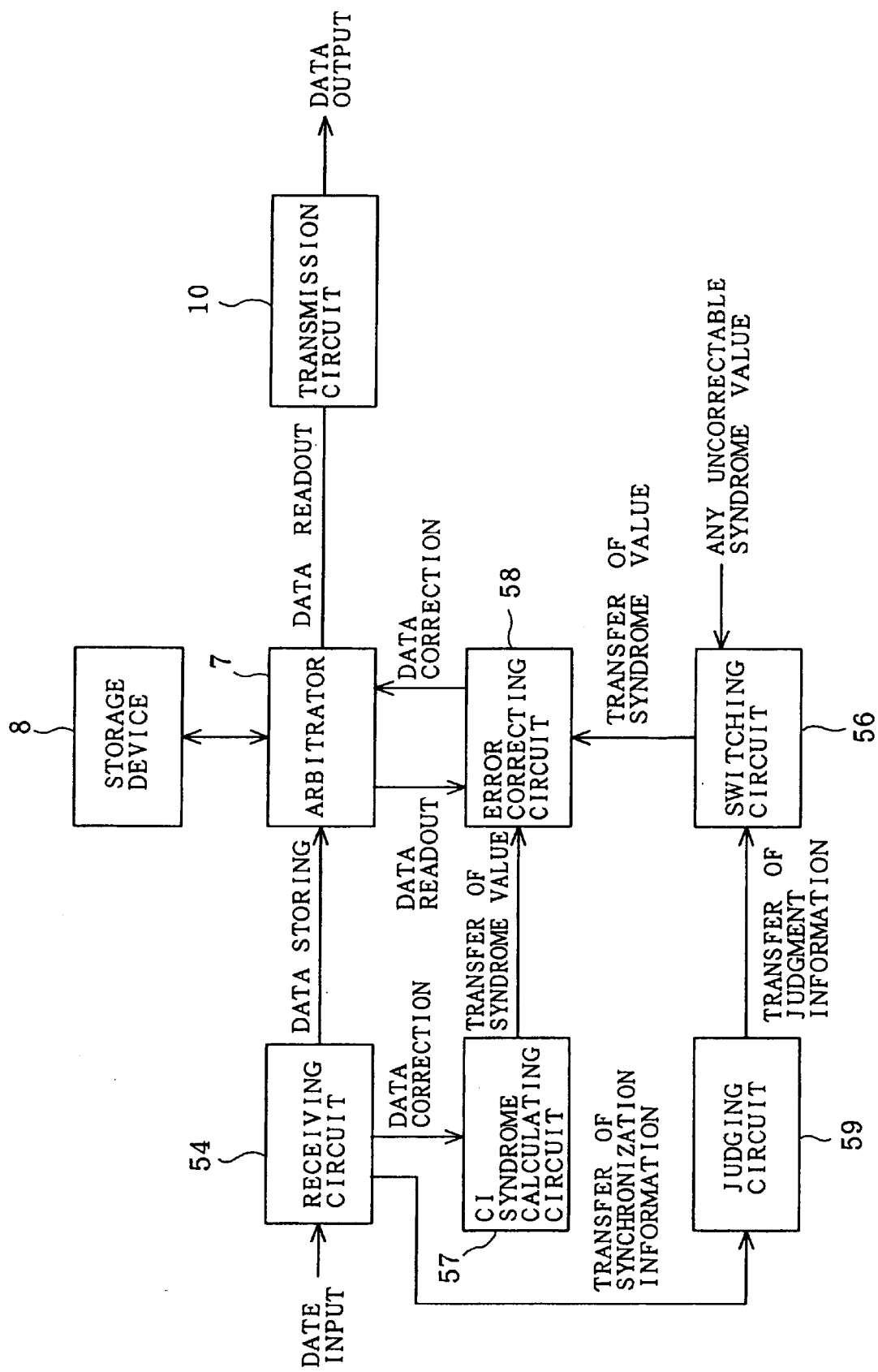
FIG. 19 is a view similar to FIG. 13, showing a ninth embodiment in accordance with the invention.

FIG. 19 illustrates a ninth embodiment. The identical or similar components in the ninth embodiment are labeled by the same reference symbols as those in the seventh embodiment, and the description of these components are eliminated. Only the differences between the seventh and ninth embodiments will herein be described. The measuring/judging circuit 55 in the seventh embodiment is replaced by a judging circuit (syndrome judging circuit) 59. The other arrangement is the same as that in the seventh embodiment.

Judgment by the judging circuit 59 differs from that by the measuring/judging circuit 55 in the seventh embodiment. Based on the clock signal generated by the PLL circuit on the basis of the received data, the judging circuit 59 measures a receiving interval of the synchronization signals the receiving circuit 54 receives every one frame. The judging circuit 59 judges whether the receiving interval is 588 channel bit, thereby judging the data reception by the receiving circuit is normal. The other arrangement is the same as that in the seventh embodiment. Accordingly, the same effect is achieved from the ninth embodiment as that from the sixth embodiment.

The invention should not be limited to the embodiments described above with reference to the accompanying drawings and may be modified or expanded as follows.

The arbitrator may be composed integrally with the storage device in each of the above-described embodiments. Further, the functions of the arbitrator may be allotted to the receiving circuit, the error correcting circuit and the transmission circuit so that the requirement for access to the storage device is shared with these circuits for execution of arbitration.

In the sixth embodiment, the error correction of the PI code sequence at steps X1 to X8 may be executed after execution of the error correction of the PO code sequence at step X9 to X16. Further, the error correction of the C1 code sequence at step s Y1 to Y8 may be executed after execution of the error correction of the C2 code sequence at steps Y9 to Y15 in the seventh embodiment.

Further in the sixth embodiment, the error correcting circuit 52 may first perform the error correction of the PO code sequence and use the results of calculation of the syndromes SI0 to SI9 of the PI code sequence, as an erasure pointer, for the erasure correction in the first error correction of the PO code sequence. Consequently, more symbol data can be corrected in the first error correction. In the sixth embodiment, the results of calculation of the syndrome may be supplied via the switching circuit 56 to the error correcting circuit 52 in the same manner as in the seventh embodiment.

In the sixth and eighth embodiments, the syndrome calculating circuit may perform the processes up to the correction of symbol data, and the error correcting circuit may have only a function of writing the corrected data onto the storage device. In this case, the error correcting circuit may interrupt the write of the corrected data when the judging circuit has delivered the invalidity judgment signal.

The ninth embodiment may be applied to a DVD data reproducing device. In this case, whether the synchronization signal per frame is received every 1488 channel bit in the received data row may be judged, whereby the results of calculation of the syndrome is judged.

When the error correction is performed for one row of error correcting code only once, steps X2, X3, X8a and X16 in FIG. 15 may be eliminated, and the control may advance directly to step X1 when judging in the negative ("NO") at step X8. Further, the steps Y2, Y3 and Y16 in FIG. 17 may also be eliminated.

Although the present invention is applied to the DVD or CD data reproducing device in each of the foregoing embodiments, the invention can be applied to equipment for reproducing data composed of error correcting codes. Further although the error correcting code is a product code in each embodiment, it may be a single sequence of codes.

FIGS. 20 to 27 illustrate a tenth embodiment in which the error correcting device of the invention is applied to a DVD data reproducing device. The identical or similar components in the tenth embodiment are labeled by the same reference symbols as those in the constitution shown in FIG. 44, and the description of these components are eliminated. Only the differences between the tenth embodiment and the constitution shown in FIG. 44 will herein be described.

Figure 21:
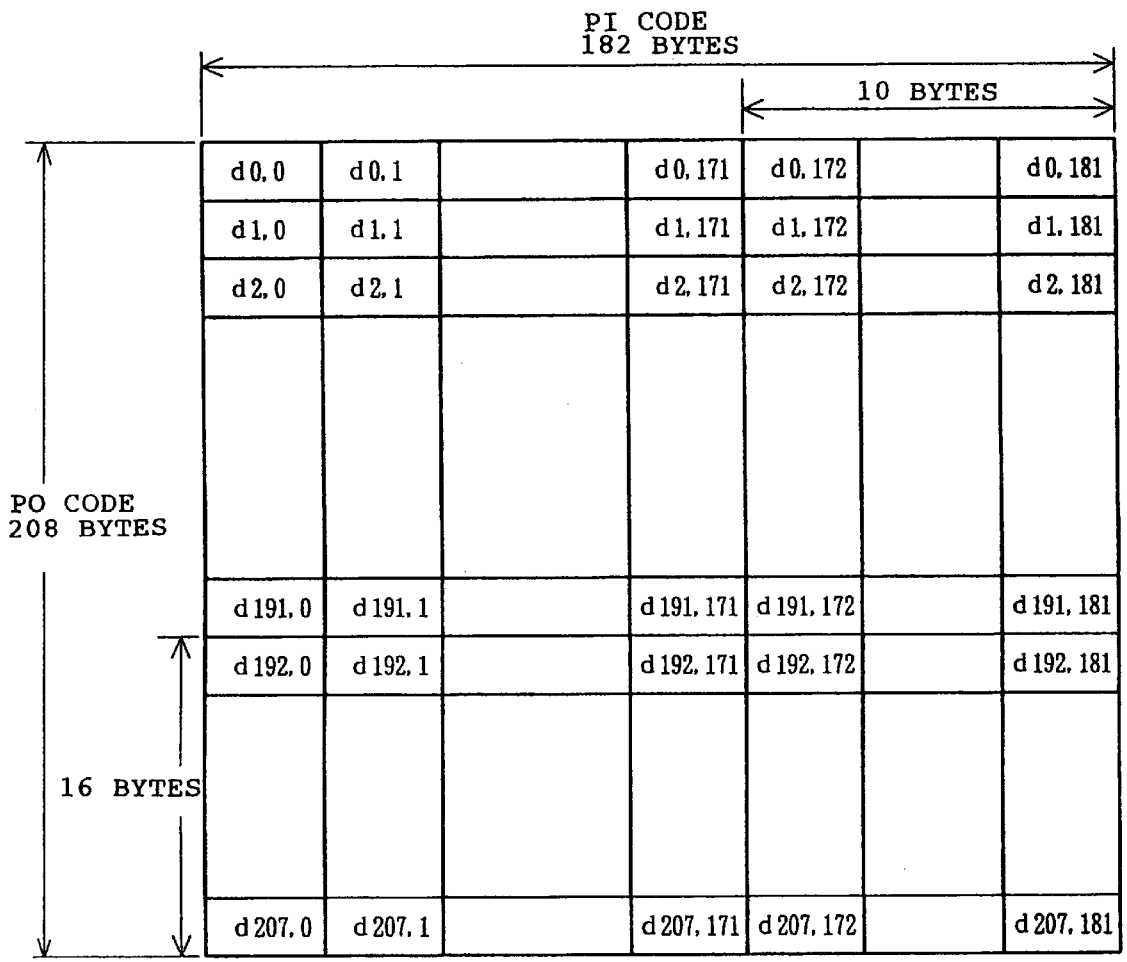
FIG. 21 illustrates a data format of error correcting codes employed in a DVD.

Data format of the error correcting codes shown in FIG. 21 is the same as that shown in FIG. 14 and accordingly, the description thereof is eliminated.

Figure 20:
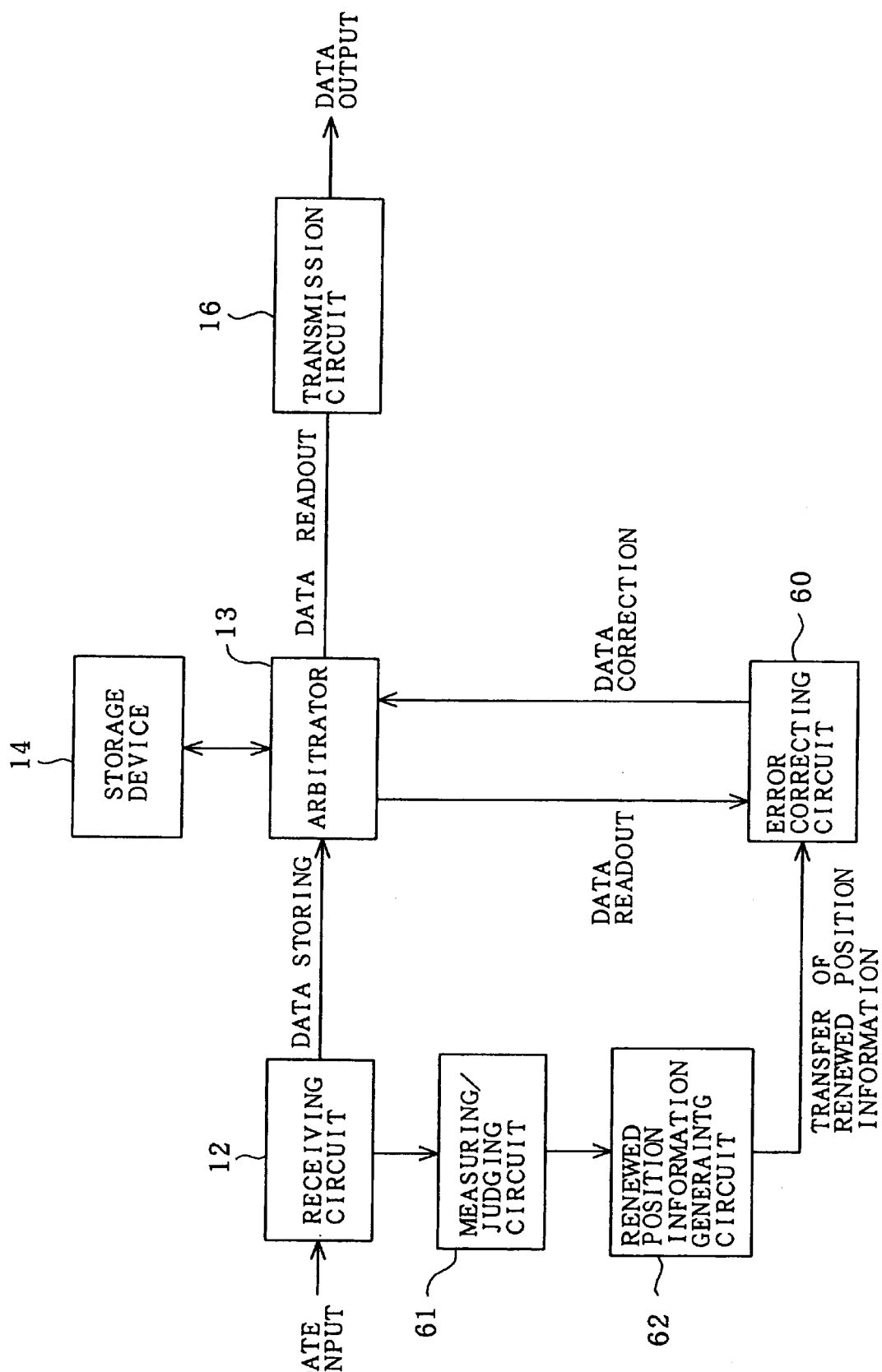
FIG. 20 is a block diagram showing an electrical arrangement of a DVD reproducing device of a tenth embodiment in accordance with the invention.
Figure 44:
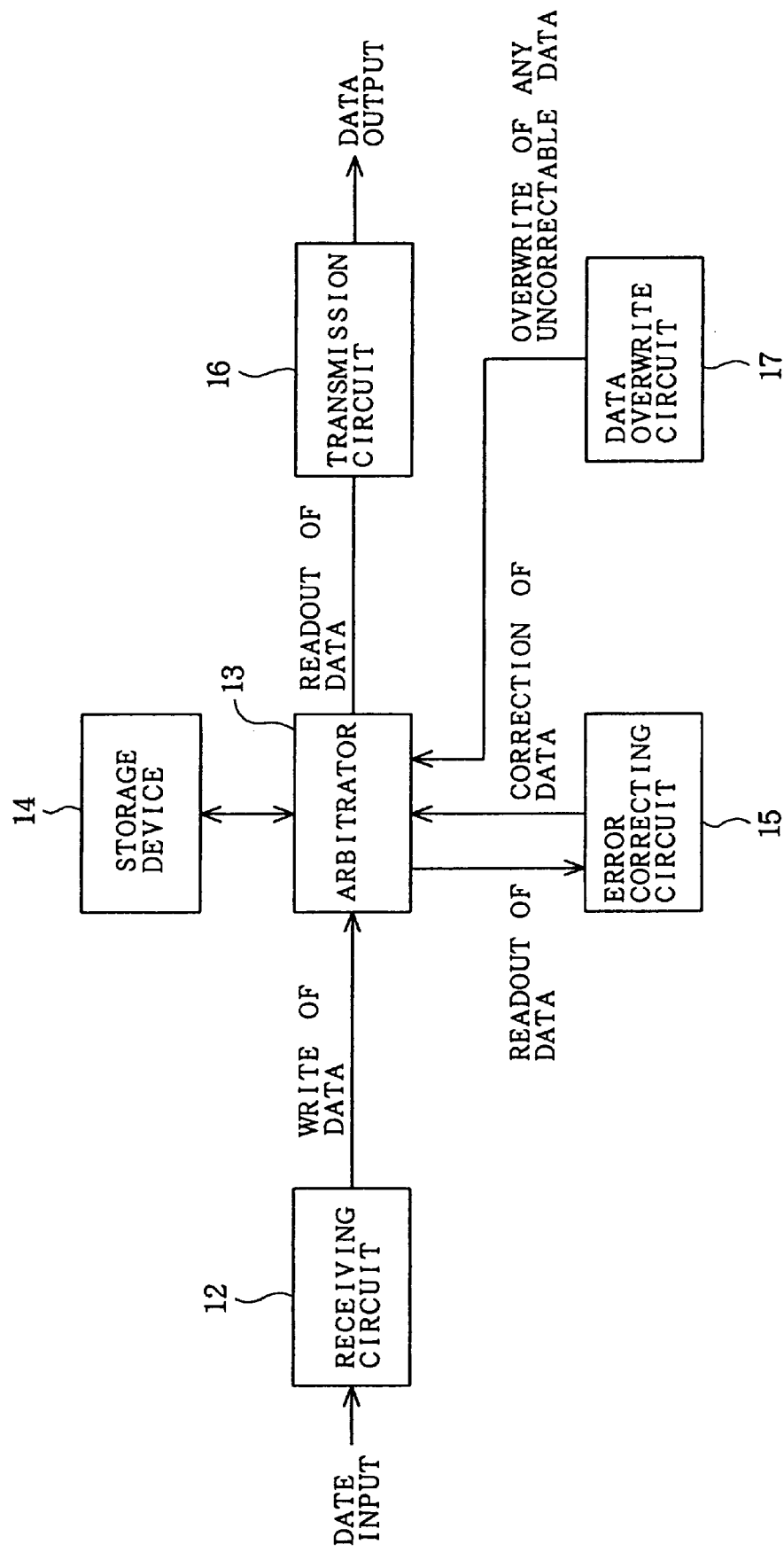
FIG. 44 is a view similar to FIG. 20, showing further another prior art.
Figure 45:
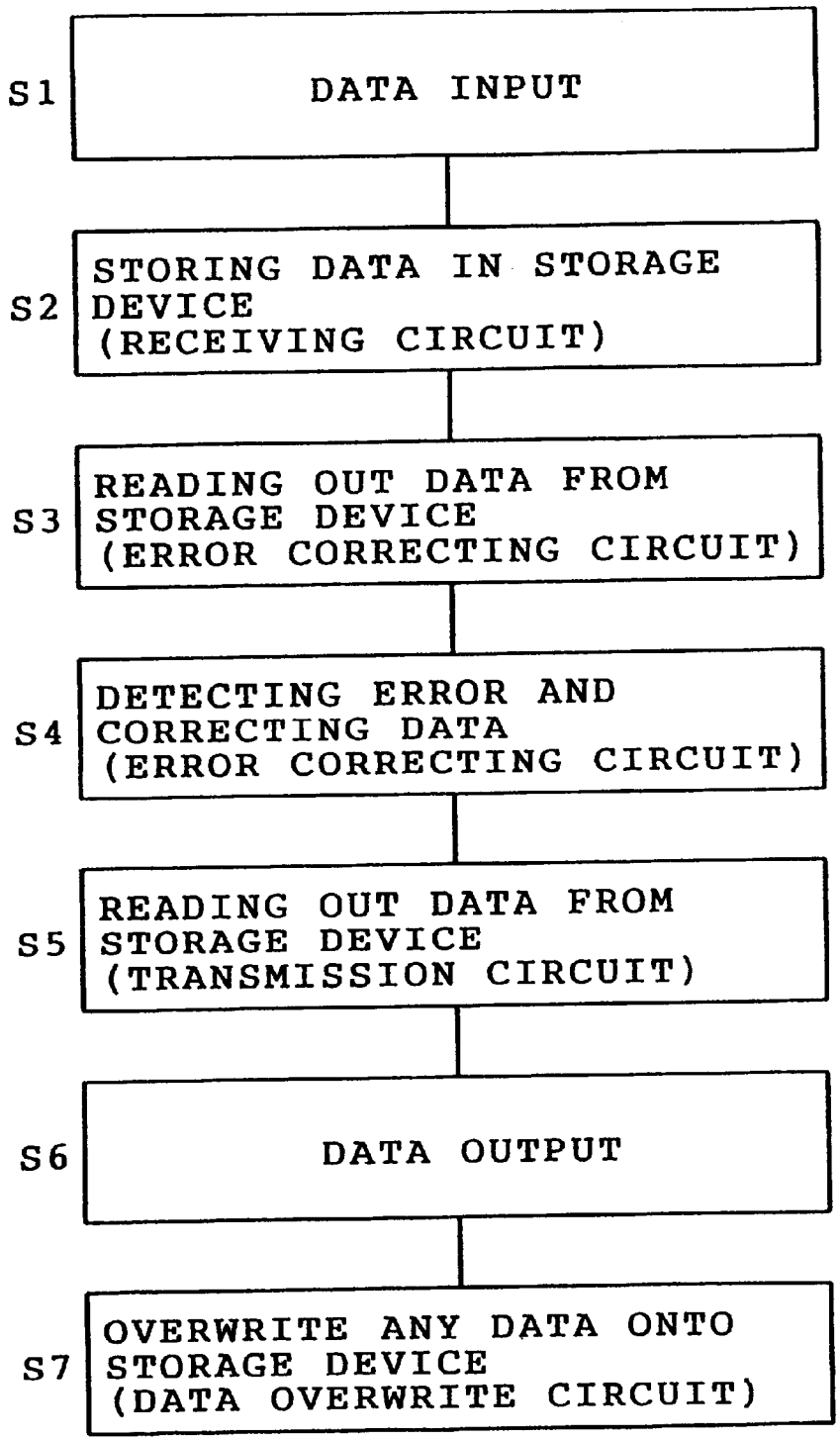
FIG. 45 is a flowchart showing processes of data reception, error correction and data transmission in the prior art.
Figure 46:
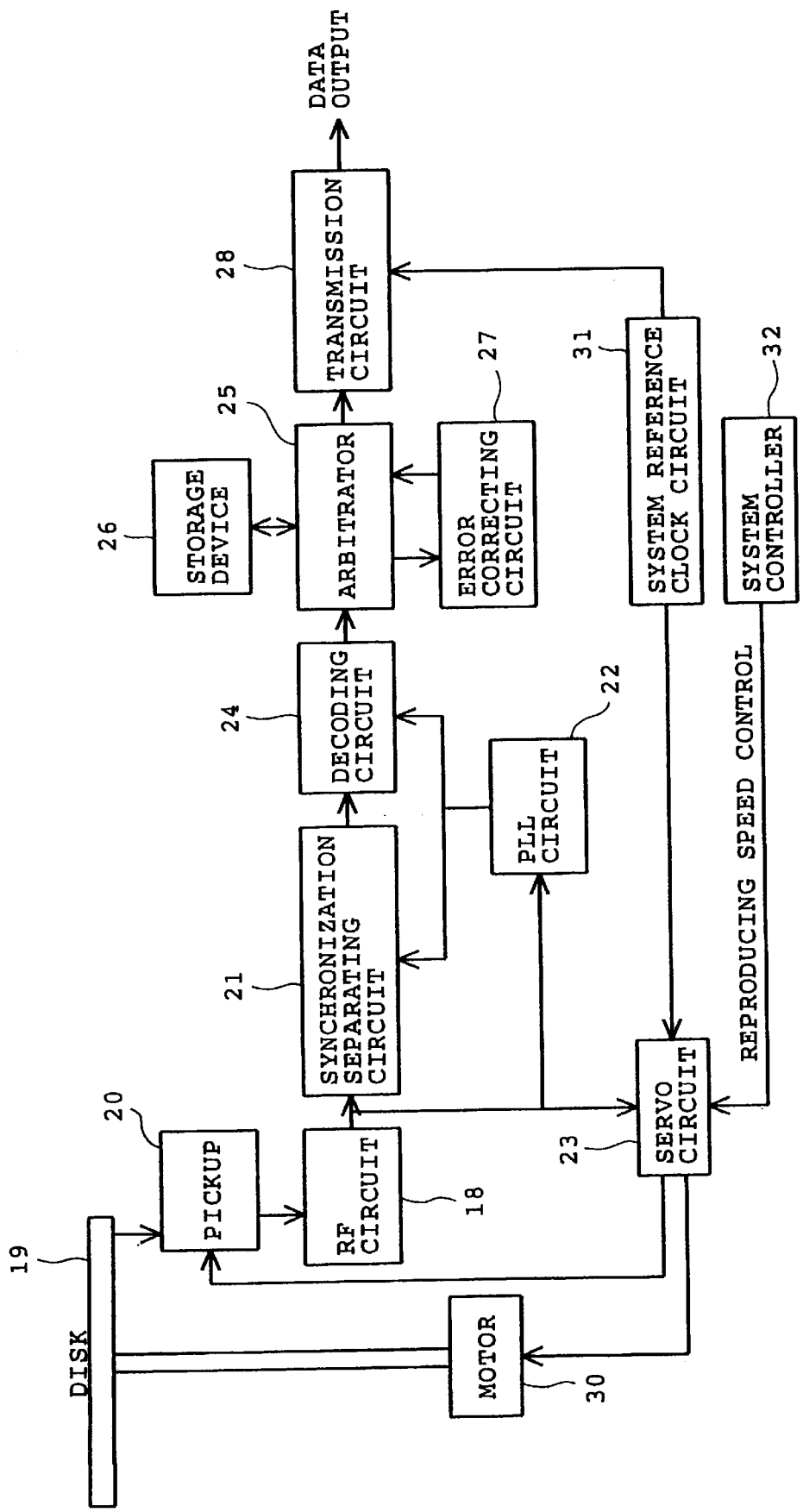
FIG. 46 is a view similar to FIG. 31, showing further another prior art.
Figure 47:
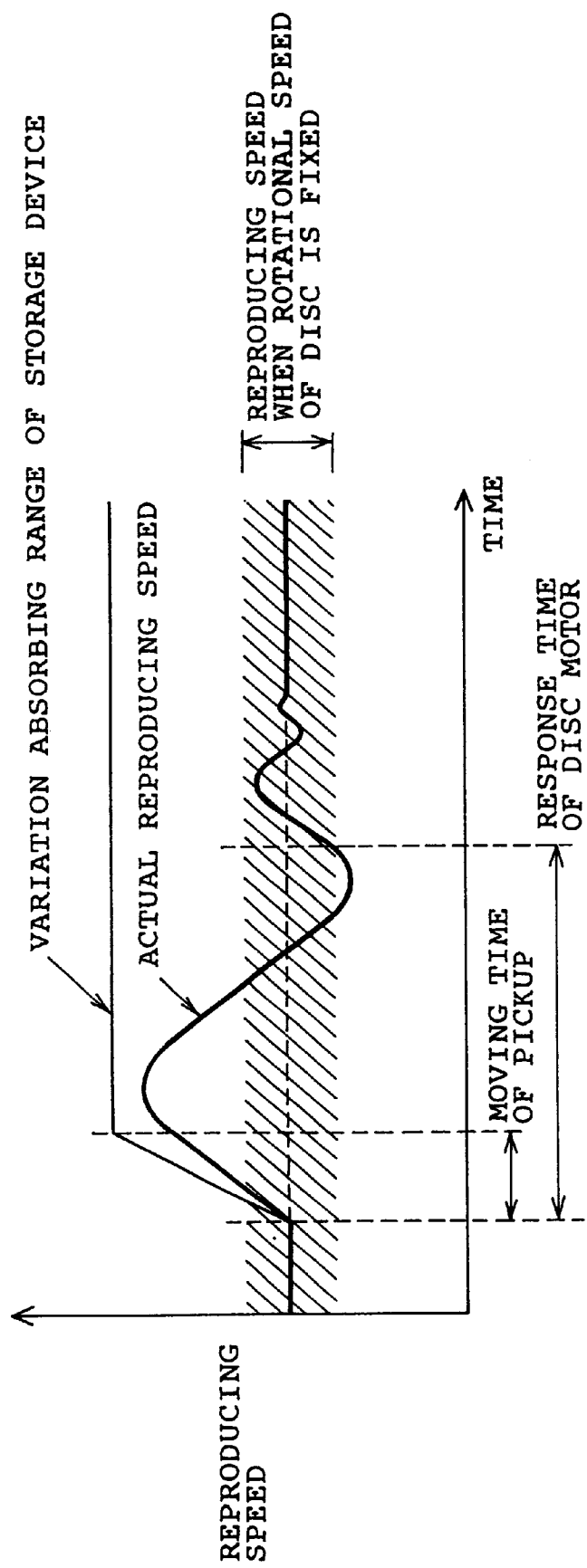
FIG. 47 is a graph showing changes in a data reproducing speed when a pickup has suddenly changed a tracking location on the disc in the CLV system.
Figure 48:
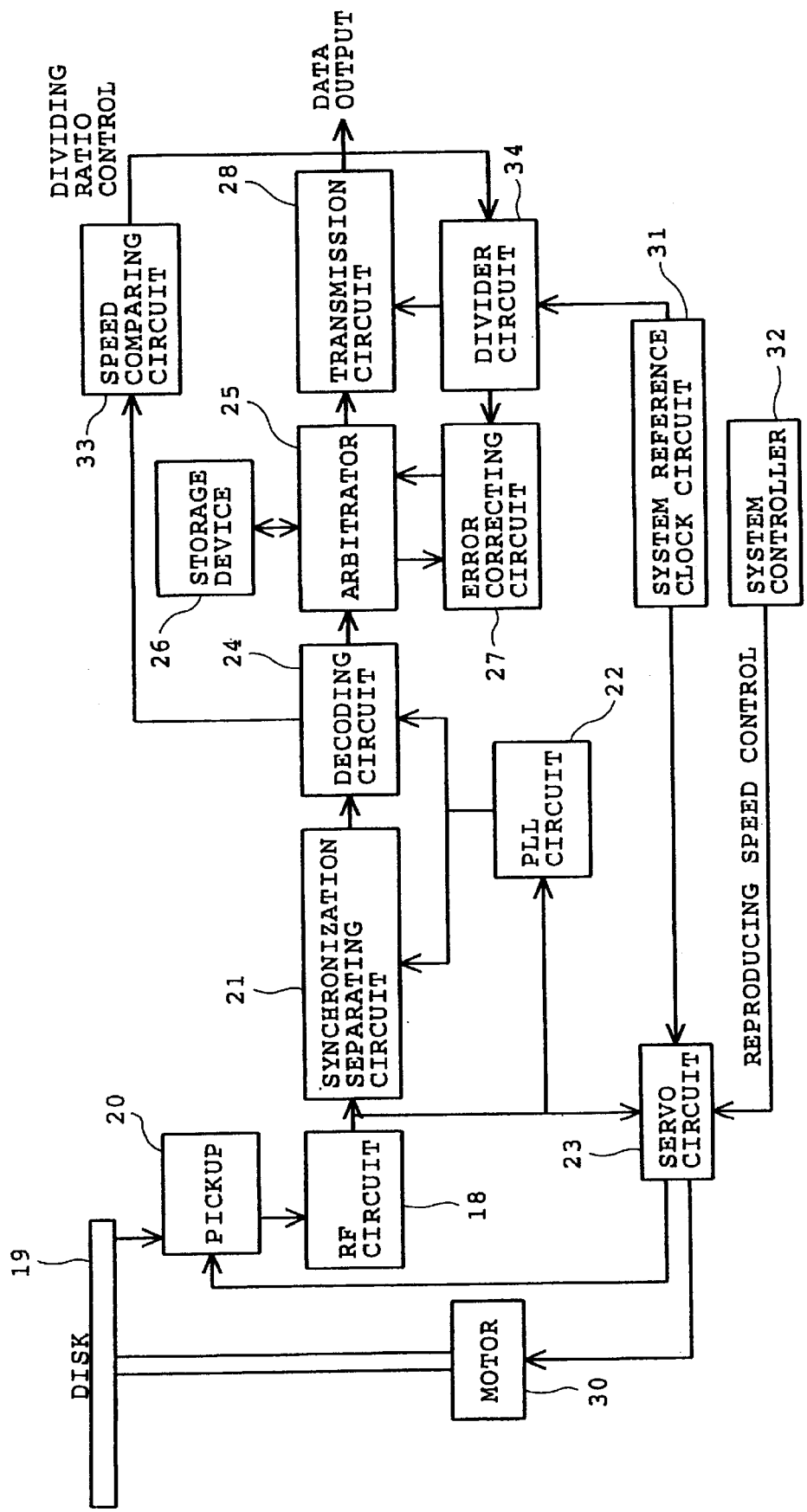
FIGS. 48 to 50 are views similar to FIG. 31, showing the prior art.

Referring now to FIG. 20 showing the electrical arrangement of the DVD data reproducing device, the data overwrite circuit 17 employed in the prior art arrangement shown in FIG. 44 is eliminated in the tenth embodiment. Further, an error correcting circuit 60 substitutes the error correcting circuit 15.

The receiving circuit 12 receives a synchronization signal located at the head of each one frame (91 bytes) of a data format of the DVD. Further, the receiving circuit 12 generates a latch pulse signal in synchronization with input of data (symbols) of 182 bytes every two frames, based on clock signals generated on the basis of a row of received data by a PLL circuit (not shown) incorporated in the receiving circuit. The receiving circuit 12 latches the data of 182 bytes (symbols in the unit of one byte) by means of the latch signal, thereby performing data reception.

A measuring/judging circuit 61 (judging circuit) receives the above-described synchronization signal and the latch pulse signal via the receiving circuit 12. The measuring/judging circuit 61 counts the number of the latch pulse signals, thereby judging whether the receiving circuit 12 has received data of 182 bytes for every two frames (PI code sequence). The measuring/judging circuit 61 delivers the results of judgment to a renewal position information generating circuit 62.

Based on the results of judgment from the measuring/judging circuit 61, the renewal position information generating circuit 62 generates renewal position information showing whether data reception by the receiving circuit has normally been carried out regarding each of 208 PI code rows per block, namely, whether the data on the storage device 14 has been renewed. The renewal position information is delivered to the error correcting circuit 60. Based on the renewal position information, the error correcting circuit 60 performs the error correction in a manner as will hereinafter be described.

Figure 22:
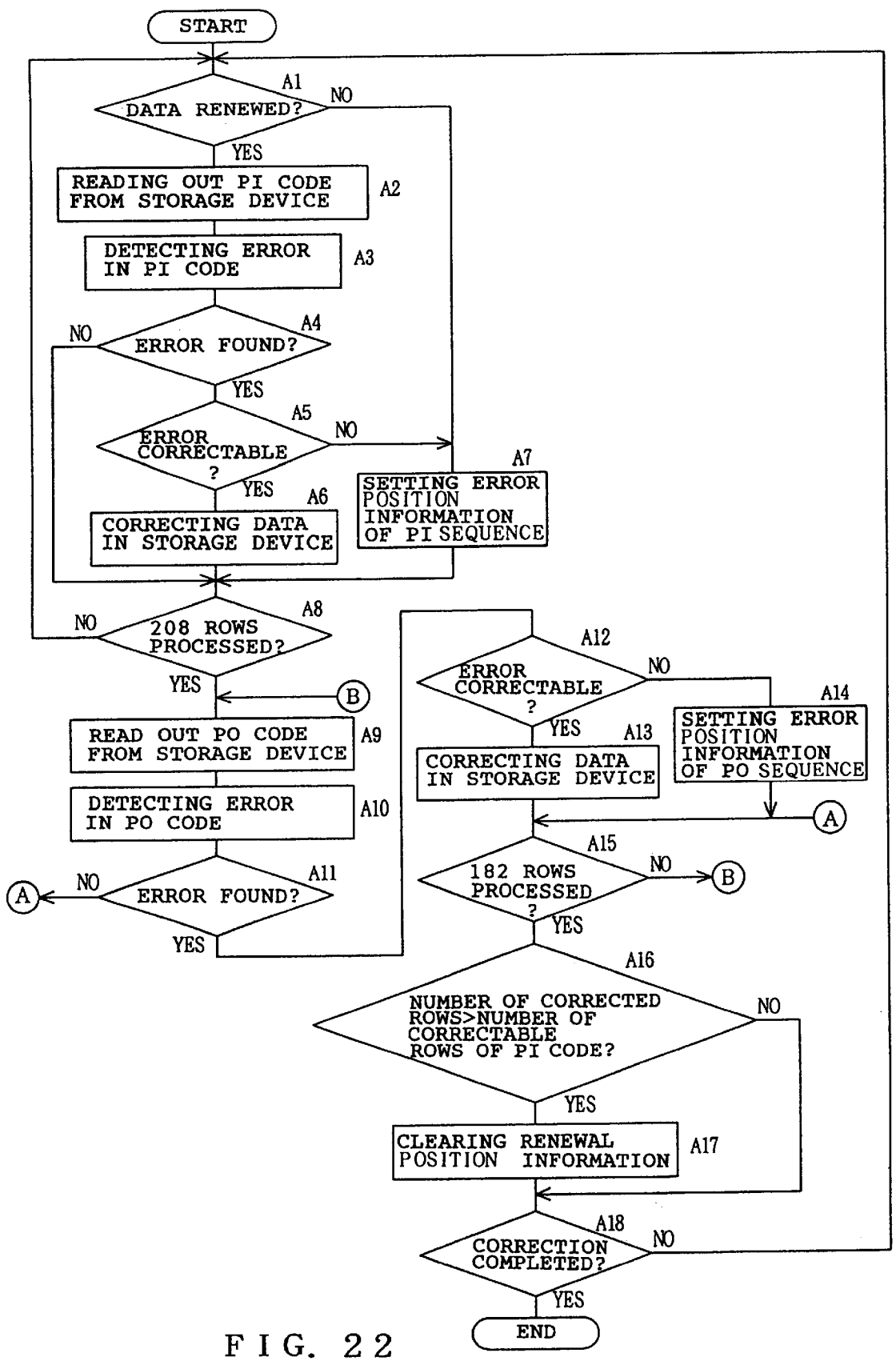
FIG. 22 is a flowchart of the operation of an error correcting circuit.

The operation of the tenth embodiment will be described. FIG. 22 is a flowchart showing processes of the error correction performed by the error correcting circuit 60. First, the error correcting circuit 60 refers to the renewal position information generated by the renewal position information generating circuit 62 to judge whether data of a first row of the PI code has been renewed (step A1). When the data has been renewed, the error correcting circuit 60 reads out the data from the storage device (RAM) 14 (step A2).

The error correcting circuit 60 calculates ten syndrome calculating equations SI0 to SI9 for the first row of the PI code to perform the error detection (step A3). The error correcting circuit 60 then performs the error correction based on the results of calculation. All the symbols of the first row have no error when all the results of calculation are "0." Since the error correction is unnecessary in this case, the error correcting circuit 60 advances from step A4 to step A8. On the other hand, any symbol of the first row contains error when all the results of calculation are not "0." In this case, the error correcting circuit 60 advances to step A5 to judge whether the error is correctable.

When the error is correctable or when the number of symbols containing error is equal to or below five, the syndrome calculating equation SI0 indicates error vector e which is a size of the error or the sum of them (ei+ej+ . . . ) when a plurality of symbols contain respective errors. Accordingly, an error position i indicative of the position of the symbol containing the error is obtained from the results of calculation. When a plurality of symbols contain respective errors, a size of each error is obtained from the results of calculation.

The error is corrected by adding the error size ei to the value di' of thereceived symbol containing the error (di=di'+ei). When the error has been corrected, the error correcting circuit 60 writes data of the corrected symbol onto the storage device 14 (step A6). At step A8, the error correcting circuit 60 then judges whether the error detection and correction have been executed for all of 208 rows of PI codes. When the error detection and correction have been executed for all the rows of PI codes, the error correcting circuit 60 advances to step A9 to start the error correction regarding rows of PO codes. On the other hand, when the error detection and correction have not been executed for all of 208 rows, the error correcting circuit 60 advances to step A1 to carry out the error correction for the next row of PI code.

On the other hand, when judging the data not to have been renewed at step A1 or when judging the error to be uncorrectable at step A5, the error correcting circuit 60 sets a flag at a storage area of the error position information in a work area (memory) incorporated therein, thereby setting error position information indicating that the code row contains the error (step A7). The error correcting circuit 60 then advances to step A8.

In subsequent steps A9 to A15, the processes at steps A2 to A8 are basically executed regarding 182 rows of PO codes. However, at steps A12 and A13, the error correcting circuit 60 uses as an erasure pointer the error position obtained in the error correction of the row of PI code at step A7, in addition to error correction on the basis of the results of calculation of 16 syndrome calculating equations SO0 to SO15. Even if the number of symbols is unknown in a range up to 16 in the erasure correction, simultaneous equations including 16 syndromes SO0 to SO15 are solved such that the data value of the unknown number is obtained, when the position of the data of unknown number is known.

Further, at step A13, the error correcting circuit 60 counts the number of corrected rows every execution of error correction. After having processed all of 182 rows, the error correcting circuit 60 judges whether the number of the corrected rows has exceeded an error correctability of the PI code, "5" (step A16). When the correctability has exceeded "5," the error correcting circuit 60 clears the renewal position information generated by the renewal position information generating circuit 62 (step A17). When the error correction is to be continuously performed, the error correcting circuit 60 advances from step A18 to step A1 to re-execute the error correction for the PI code row. The error correcting circuit 60 advances to step A18 when the number of corrected rows is not in excess of "5."

In re-execution of the error correction for the row of PI code, the error correcting circuit 60 can also carry out the erasure correction for the number of symbols up to ten by use of ten syndrome calculating equations SI0 to SI9, based on the error position information obtained in the error correction of the row of PO code at step A14. The number of times of repetition of the error correction at step A18 may suitably be set according to a spare time for the error correction, a required degree of reliability of the symbol data, etc.

The data correctability in the tenth embodiment will now be described with reference to FIGS. 23A to 26C. FIGS. 23A to 24C illustrate an example of processing in the tenth embodiment. For the sake of showing in the figures, the number of symbols of the PI code is 20, whereas that of the PO code is 16. Although the size of each area differs from one figure to another, symbol data in each of areas A and B contains error, and an area C is an unrenewed area in which symbol data has not been renewed. In each figure, each PO code row which is not in the areas A and B but is only in the area C is correctable.

Figure 23A:
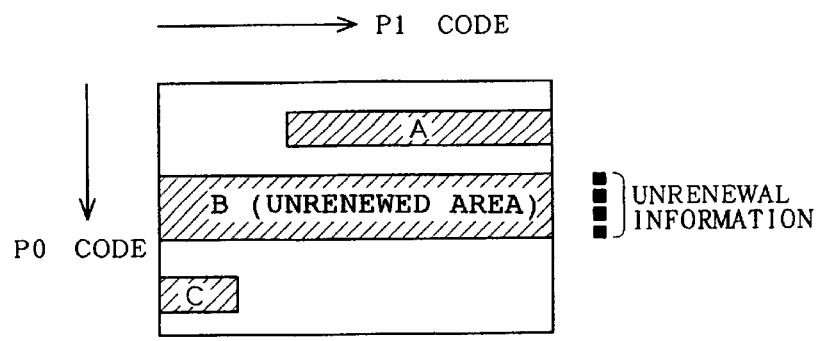
FIGS. 23A to 23C illustrate an error correcting operation of the error correcting circuit in the tenth embodiment.
Figure 23B:
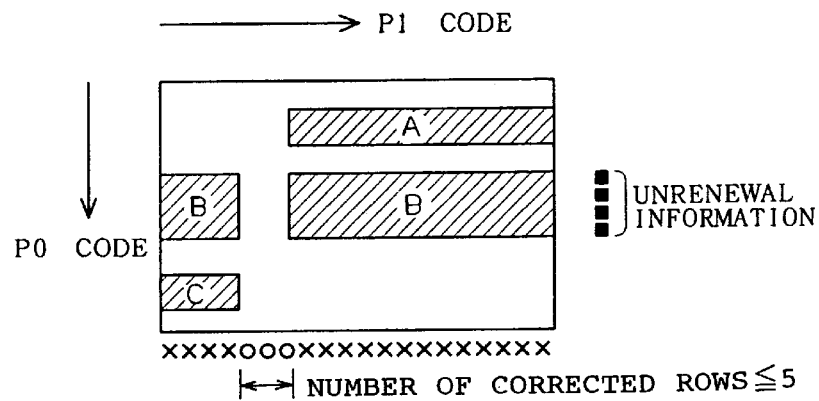
Figure 23C:
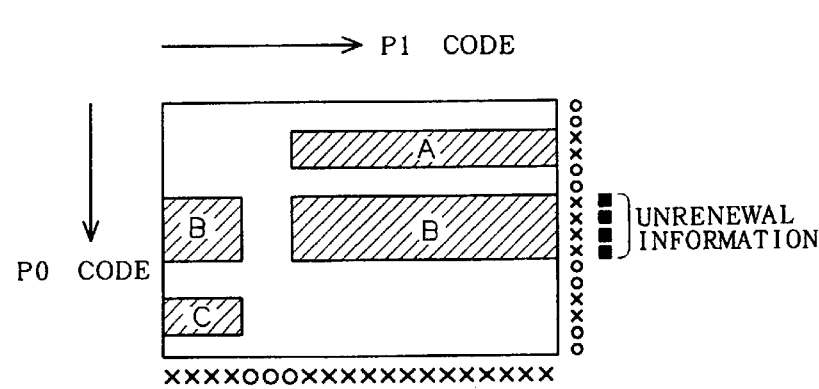

First in the state of FIGS. 23A–23C, four PI code rows are unrenewed and assigned with respective pieces of renewal position information generated by the renewal position information generating circuit 62 and indicating an unrenewed state. In case that the number of corrected rows in the error correction of the PO code rows is "3" ($\geq 5$) as shown in FIG. 23B, the error correcting circuit 60 judges in the negative ("NO") at step A16 and further judges at the next step A1 in the negative ("NO") regarding the four PI code rows in the area B based on the renewal position information. Thus, a false judgment can be prevented (see FIG. 23C).

Figure 24A:
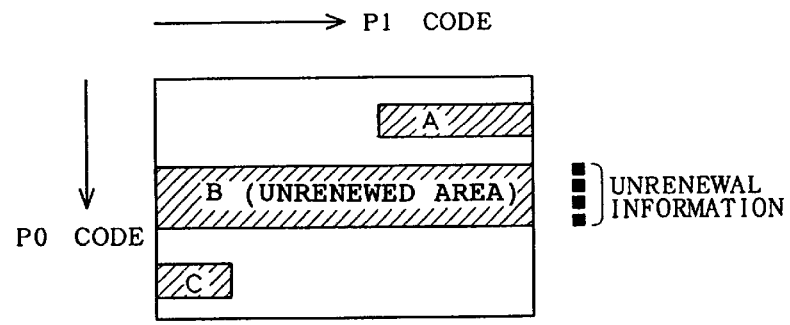
FIGS. 24A to 24C illustrate another error correcting operation of the error correcting circuit.
Figure 24B:
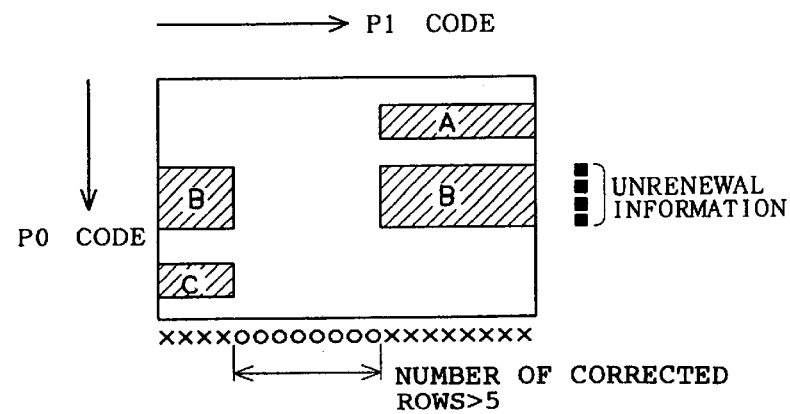
Figure 24C:
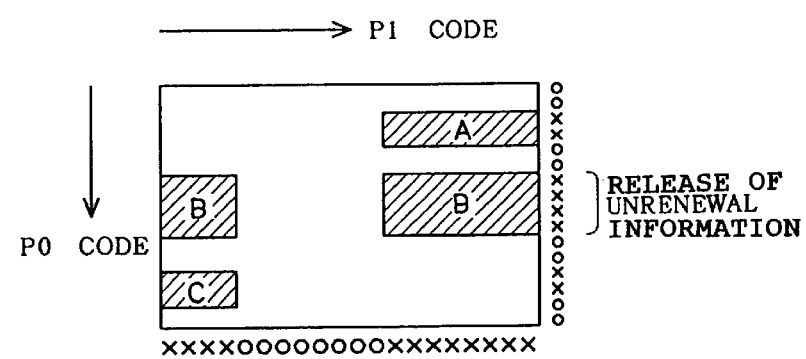

Further in FIGS. 24A to 24C, four PI code rowe in the area B are assigned with respective pieces of unrenewed position information as in the case of FIGS. 23A–23C. In case that the number of corrected rows in the error correction of the PO code rows is "8" (>5) as shown in FIG. 24B, the error correcting circuit 60 judges in the affirmative ("YES") at step A16, clearing the renewed position information at the next step A17 for the reason as will be described later. Accordingly, although the correction is to be carried out on the basis of the renewed position information, it cannot be executed. Accordingly, data is not corrected even when the error correction is normally executed without reference to the renewed position information. Consequently, a false judgment can be prevented (see FIG. 24C).

In the case shown in FIGS. 24A–24C, the renewed position information would be referred to and the error correction would be prohibited in order that false judgment and false correction may be prevented. However, when the number of pieces of data to be corrected in the PO code rows is large, there is a possibility that error may be corrected regarding unrenewed data in the subsequent error correction for the PI code rows. Therefore, the error correction is normally carried out without reference to the renewed position information.

Figure 25A:
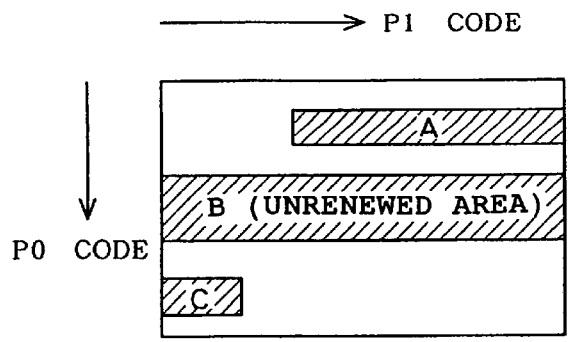
FIGS. 25A to 25C illustrate an example of the error correcting process without use of a data overwriting circuit in a conventional correcting system.
Figure 25B:
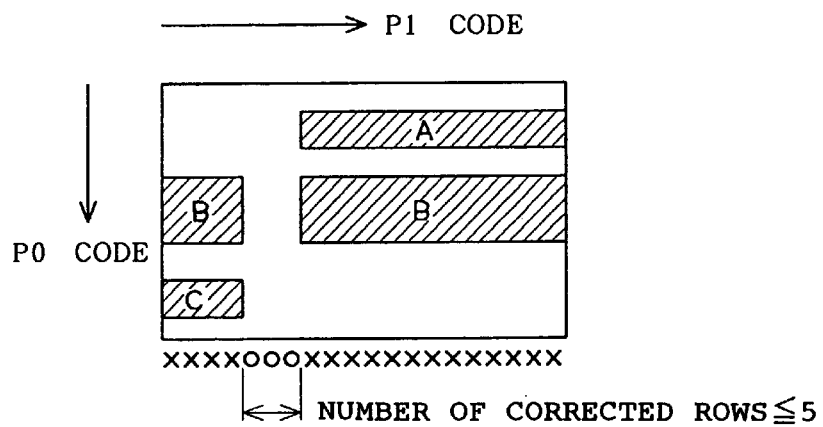
Figure 25C:
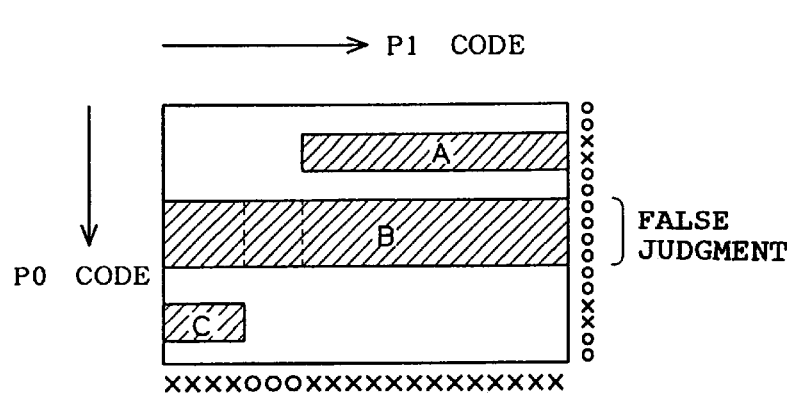

FIGS. 25A to 26C show examples in which the data overwrite circuit 17 and the renewed position information generating circuit 62 in the embodiment are eliminated from the error correcting circuit, and steps A16 and A17 in the flowchart of FIG. 22 are eliminated, under the same condition as in FIGS. 23A to 24C. In FIGS. 25A to 25C, the number of corrected rows in the error correction of the PO code rows is "3." Accordingly, when the error correcting circuit 60 carries out the error correction regarding the PI code rows subsequently, the error correction is executable since the data having been corrected in the previous error correction remains, namely, since three symbols have been corrected in each row in the uncorrected state. Accordingly, the data is further corrected to return to the former uncorrected state and accordingly, the error position information "○" is assigned to each row. However, restoration of the unrenewed data results in a false judgment (see FIG. 25C).

Figure 26A:
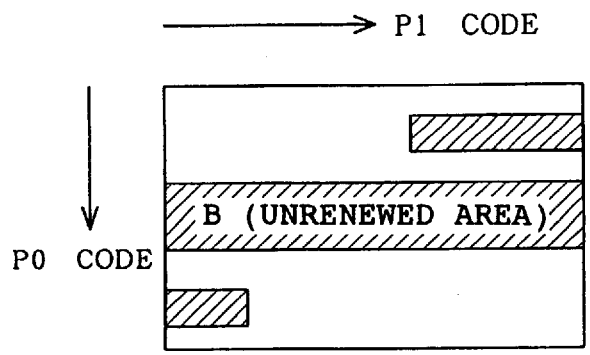
FIGS. 26A to 26C illustrate another example of the error correcting process without use of a data overwriting circuit in the conventional correcting system.
Figure 26B:
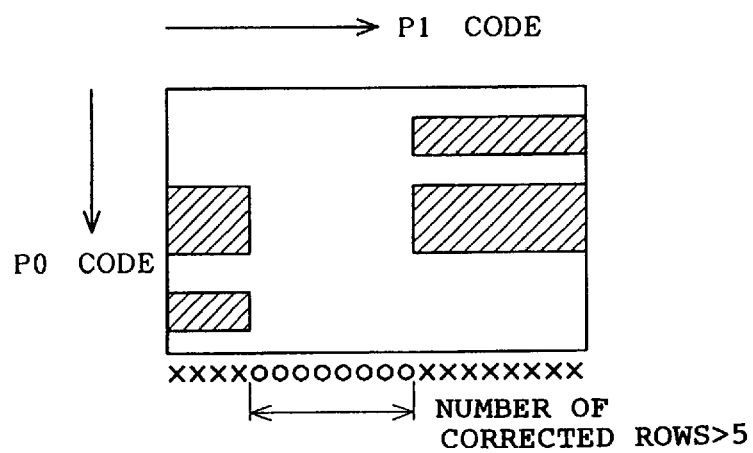
Figure 26C:
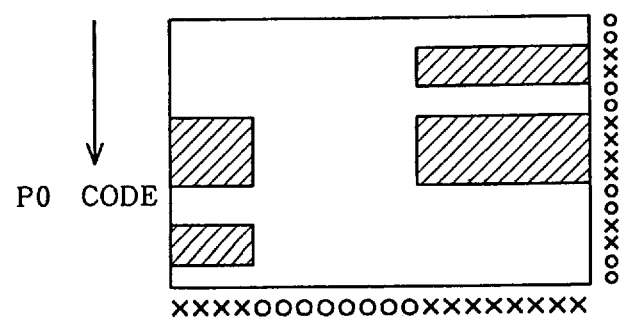

In the case shown in FIGS. 26A to 26C, the number of corrected rows in the error correction of the PO code rows is "8" (>5). Accordingly, when the error correcting circuit carries out the error correction regarding the PI code rows subsequently, the error correction is impossible in the PI code sequence since the data is unrenewed regarding the area B and 8 symbols in each sequence, which symbols have originally no errors, have been corrected. Accordingly, a false judgment can be prevented in the case shown in FIGS. 26A–26C as that shown in FIGS. 24A–24C (see FIG. 26C).

According to the tenth embodiment, the unrenewed data of PI code sequence remains in a area of the storage device 14 onto which area data is not written when disturbance in the receiving circuit 12 interrupts reception of data. Even in such a case, the error correcting circuit 60 does not execute the error correction regarding the PI code sequence the data of which has not been renewed, based on the renewed position information generated by the renewed position information generating circuit 62. Accordingly, the false detection and the false correction can be prevented without provision of the data overwriting circuit 17 erasing the data which has already been transmitted but remains on the storage device 14, by overwriting it. Consequently, the speed at which the storage device 14 is accessed need not be increased, and the arrangements of the error correcting circuit 60 and the transmission circuit 16 can be simplified.

Further, the error correction is not executed only when the code row the data of which has not been renewed is the PI code sequence in which a received order of the data is substantially the same as an order of arrangement of the error correcting code. As a result, the error correction is executed when the error is correctable on the basis of the error correcting code, so that the correctability of data can be improved.

Further, in a case where the number of code rows containing errors in the PO code sequence exceeds the correctability in the PI code sequence, the error correction is not executed regarding the unrenewed data even when the error correcting circuit 60 executes the normal error correction without reference to the renewed position information. Further, when the error correction is executed many times regarding. the PO code sequence and is repeated regarding the PI code sequence twice or more, there is a possibility that the error may be corrected regarding the unrenewed code rows of the PI code sequence in subsequent error corrections. Consequently, the correctability of the unrenewed data can be improved.

Further according to the tenth embodiment, the measuring/judging circuit 61 obtains the synchronization signal and the latch pulse signals via the receiving circuit 12 to count the number of latch pulse signals, thereby judging whether data of 182 bytes has been received every two frames. The measuring/judging circuit 61 delivers the result of judgment to the renewed position information generating circuit 62. As a result, whether the data has normally been received can reliably been judged.

Figure 27:
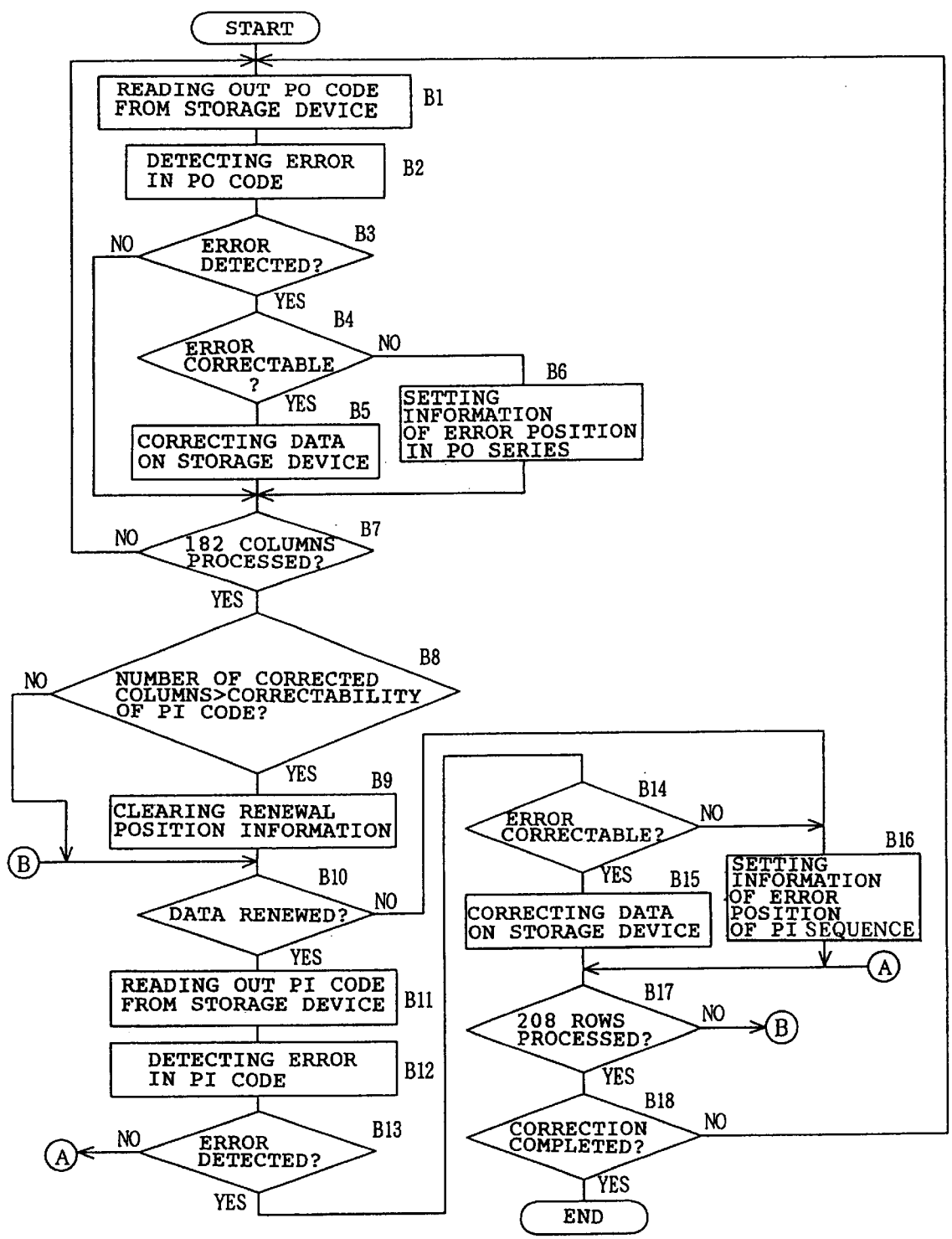
FIG. 27 is a flowchart similar to FIG. 22, showing an eleventh embodiment in accordance with the invention.

FIG. 27 is a flowchart showing error correcting processes executed by an error correcting circuit 60 employed in an eleventh embodiment of the invention. In the eleventh embodiment, the error correction is executed regarding the PO code sequence at first half steps B1 to B9 and thereafter, the error correction is executed regarding the PI code sequence at second half steps B10 to B18. In the case of the product code, the same result is obtained even when the error correction is carried out regarding either code sequence. Accordingly, the same effects can be achieved from the eleventh embodiment as from the tenth embodiment.

Figure 28:
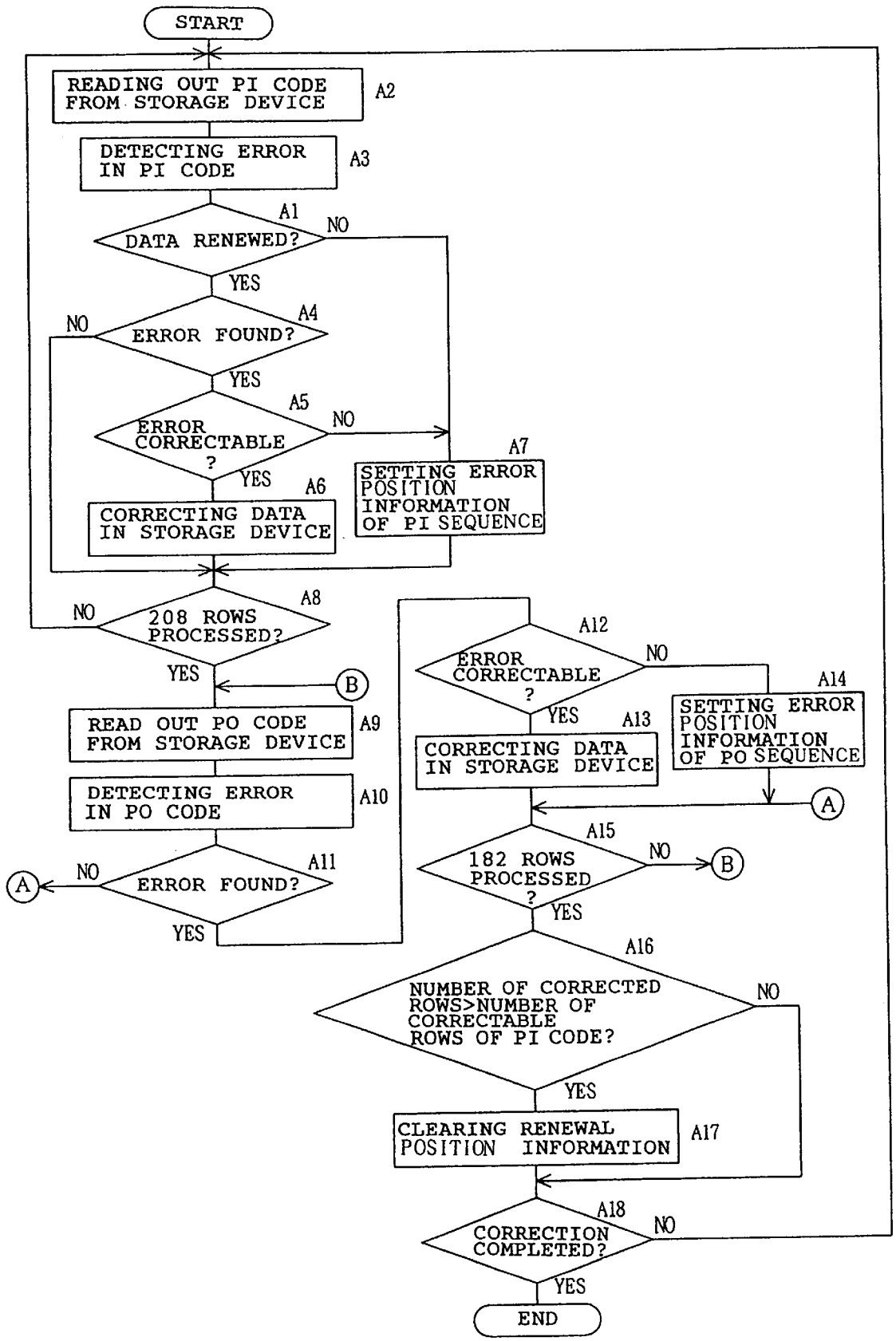
FIG. 28 is a flowchart similar to FIG. 22, showing a twelfth embodiment in accordance with the invention.

FIG. 28 is a flowchart showing error correcting processes executed by the error correcting circuit 60 employed in a twelfth embodiment of the invention. In the twelfth embodiment, the step for judging whether data has been renewed is transferred between the steps A3 and A4 in the flowchart of FIG. 22 of the tenth embodiment. More specifically, the error correcting circuit 60 reads out the symbol data indiscriminately to calculate the syndrome for the error correction of the PI code sequence or to perform the error detection (steps A2 and A3) before judging whether the symbol data on the storage device 14 has been renewed.

The error correcting circuit 60 subsequently advances to step A1 to judge whether the symbol data has been renewed. The error correcting circuit 60 advances to step A4 when judging the symbol data to have been renewed as the result of reference to the renewed position information at step A1. on the other hand, the error correcting circuit 60 advances to step A7 to set the error position information when the symbol data has not been renewed at step A1.

According to the twelfth embodiment, the error correcting circuit 60 calculates the syndrome indiscriminately to perform the error detection irrespective of the renewed position information about one of the PI code rows of the symbol data written on the storage device 14. Thereafter, the error correcting circuit 60 refers to the renewed position information generated by the renewed position information generating circuit 62. When the symbol data has not been renewed, the error correcting circuit 60 sets the error position information so that the error correction is not carried out regarding that code row. Consequently, false correction is prevented and accordingly, the same effect can be achieved from the twelfth embodiment as from the tenth embodiment.

Figure 29:
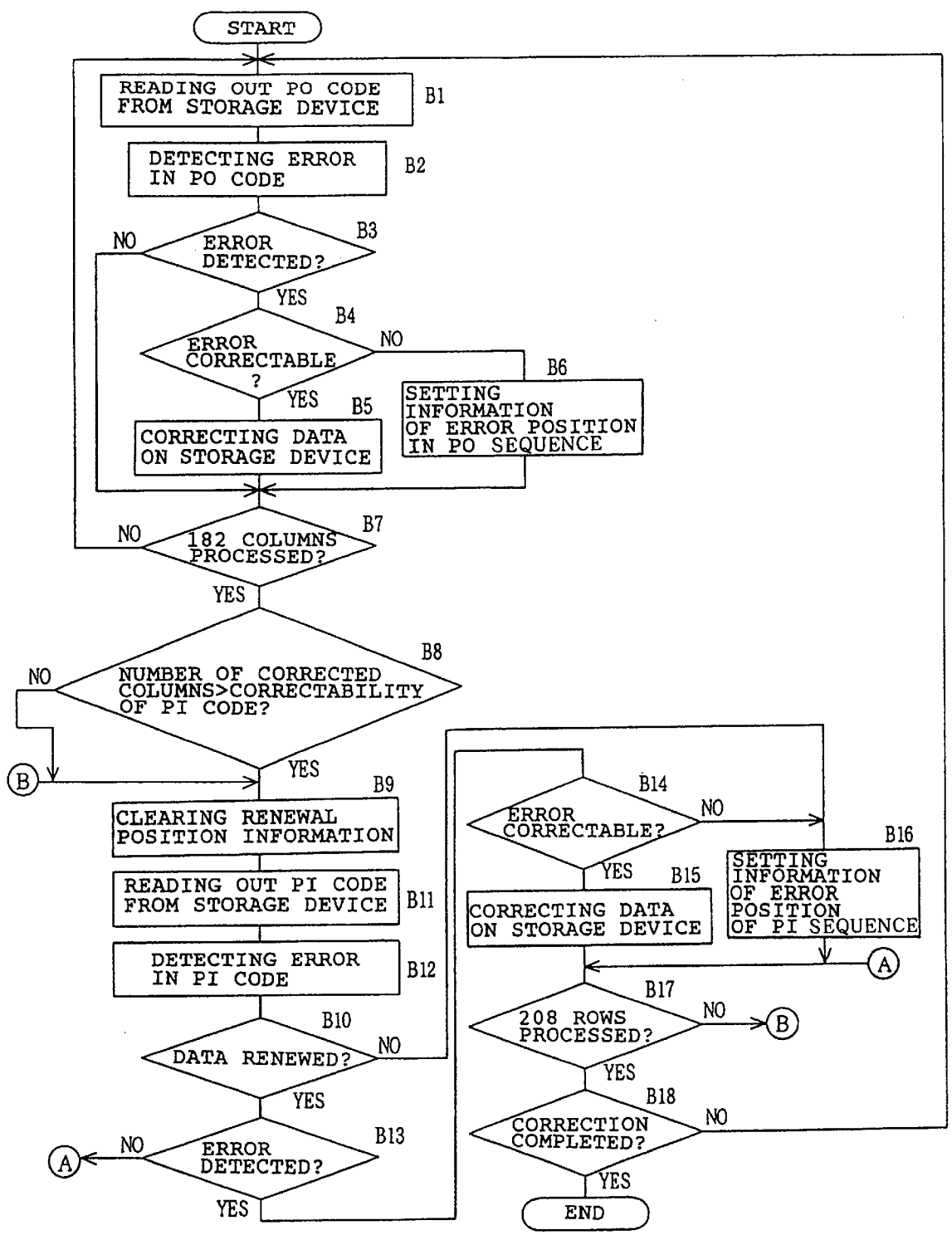
FIG. 29 is a flowchart similar to FIG. 22, showing a thirteenth embodiment in accordance with the invention.

FIG. 29 is a flowchart showing error correcting processes executed by the error correcting circuit 60 employed in a thirteenth embodiment of the invention. In the thirteenth embodiment, the step B10 for judging whether data has been renewed is transferred between the steps B12 and B13 in the flowchart of FIG. 27 of the eleventh embodiment. With this, the error correcting circuit 60 advances to step B11 when judging in the negative ("NO") at each of the steps B8 and B17. Consequently, the same effect can be achieved from the thirteenth embodiment as from the eleventh embodiment.

Figure 30:
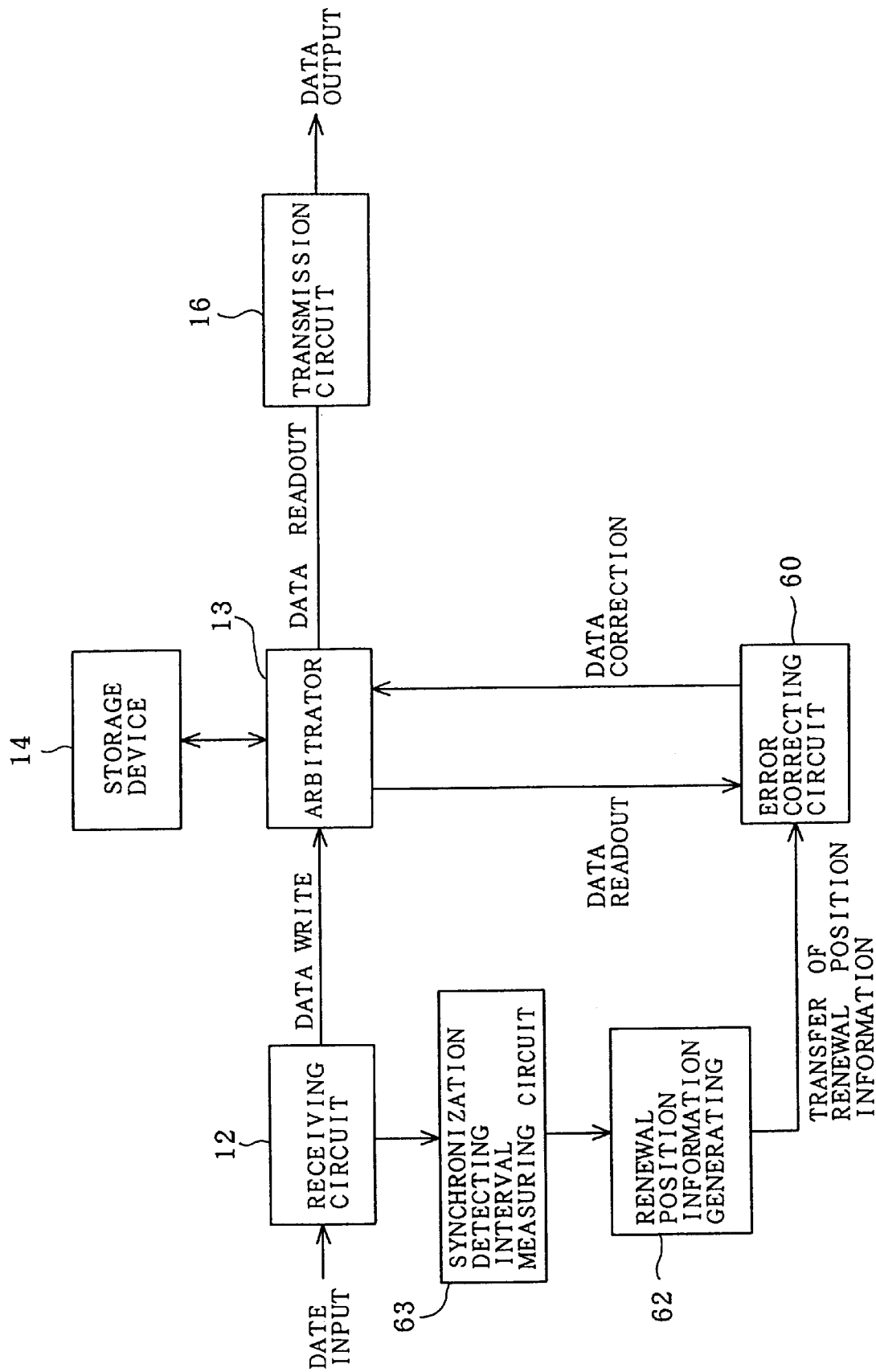
FIG. 30 is a view similar to FIG. 20, showing a fourteenth embodiment in accordance with the invention.

FIG. 30 illustrates a fourteenth embodiment of the invention. The identical or similar components in the fourteenth embodiment are labeled by the same reference symbols as those in the tenth embodiment, and the description of these components are eliminated. Only the differences between the tenth and fourteenth embodiments will herein be described. In FIG. 30, the measuring/judging circuit 61 shown in FIG. 20 is replaced by a synchronization detecting interval measuring circuit 63 (syndrome judging circuit). The other arrangement is the same as that in the tenth embodiment.

Judgment made by the synchronization detecting interval measuring circuit 63 differs from that of the measuring/judging circuit 61 in the sixth embodiment. More specifically, the measuring circuit 63 measures an interval at which the synchronization signal is received every one frame by the receiving circuit 12, based on the clock signal the PLL circuit generates from the received data, thereby judging whether the measured interval is 1488 channel bit (based on the standard of DVD data). Based on this judgment, the measuring circuit 63 judges whether the data reception by the receiving circuit 12 is normal. Consequently, the same effect can be achieved from the fourteenth embodiment as that from the tenth embodiment.

The invention should not be limited to the embodiments described above with reference to the accompanying drawings and may be modified or expanded as follows.

The arbitrator may be composed integrally with the storage device in each of the above-described embodiments. Further, the functions of the arbitrator may be allotted to the receiving circuit, the error correcting circuit and the transmission circuit so that the requirement for access to the storage device is shared with these circuits for execution of arbitration.

The tenth to fourteenth embodiments may be applied to a CD data reproducing device.

In the flowchart of FIG. 22 showing the tenth embodiment, steps A16 and A17 may be transferred between steps A13 and A15 so that the judgment about the number of corrected rows for the clearing of the renewed position information is made every time the error correction is executed for one of the PO code rows. Further, steps B8 and B9 may be transferred between steps B5 and B7 in the flowchart of FIG. 24 showing the eleventh embodiment. Further, steps A16 and A17 in FIG. 19 and steps B8 and B9 in FIG. 24 may be eliminated.

In the flowchart of FIG. 28 showing the twelfth embodiment, the error correcting circuit may advance to step A1 when judging in the negative ("NO") at step A4. In this case, when judging in the affirmative ("YES") at step A5, the error correcting circuit advances to a similar judging step A1'. In like manner, the error correcting circuit may advance to step B10 in the flowchart of FIG. 29 showing the thirteenth embodiment when judging in the negative ("NO") at step B13. In this case, too, the error correcting circuit advances to a similar judging step B10' when judging in the affirmative ("YES") at step B14.

Although the present invention is applied to the DVD or CD data reproducing device in each of the foregoing embodiments, the invention can be applied to equipment for reproducing data composed of error correcting codes. Further although the error correcting code is a product code in each embodiment, it may be a single code sequence.

FIGS. 31 to 35 illustrate a fifteenth embodiment in which the error correcting device of the invention is applied to a multi-disc reproducing device which can reproduce data recorded on various types of discs (information storing disc, recording medium) such as CD, CD-ROM, DVD, DVD-ROM, etc. The identical or similar components in the fifteenth embodiment are labeled by the same reference symbols as those in the arrangement shown in FIG. 49, and the description of these components are eliminated. Only the differences between the fifteenth embodiment and the arrangement shown in FIG. 49 will herein be described.

Figure 49:
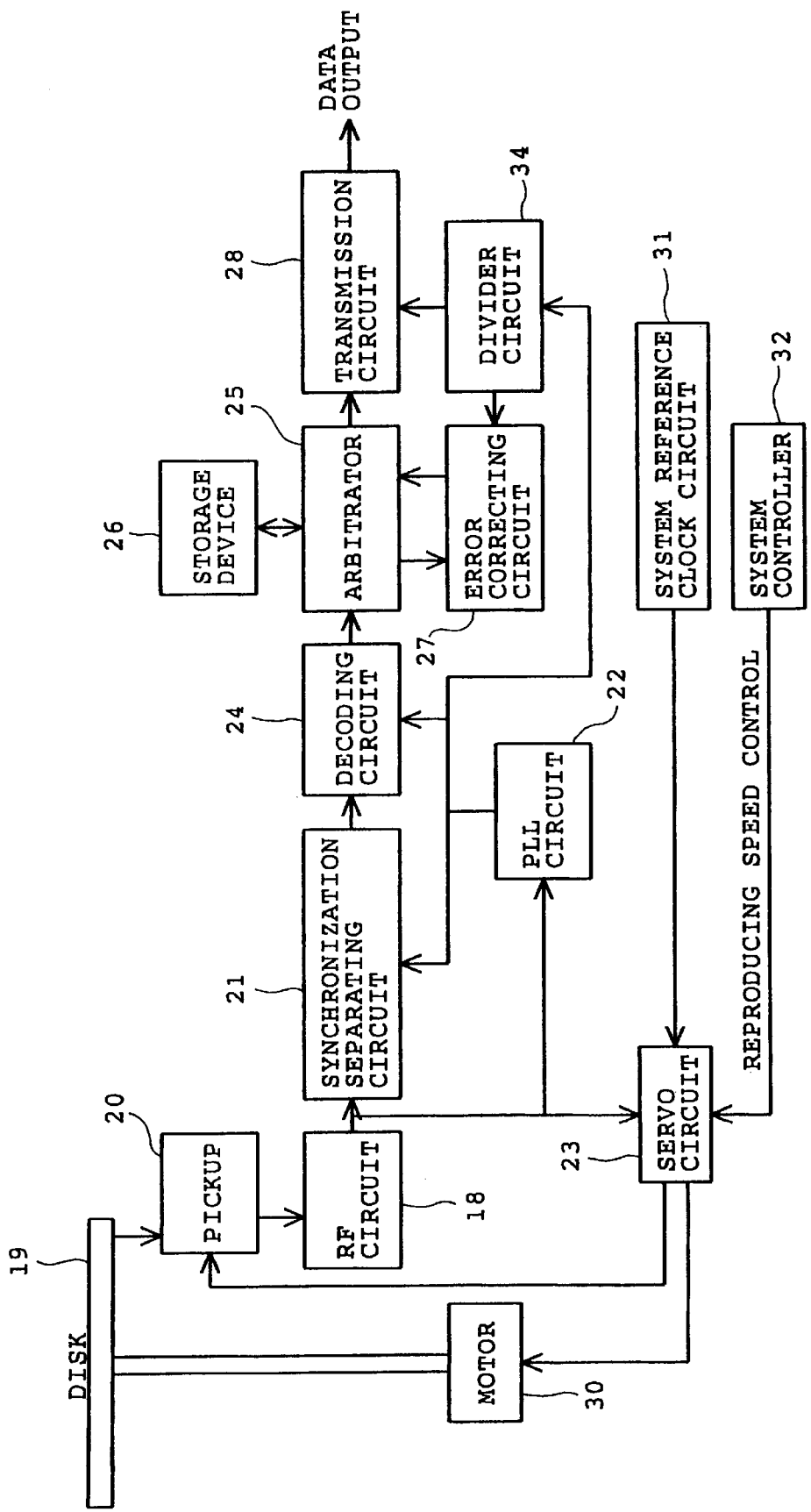

In the arrangement of FIG. 49, the PLL circuit 22 generates clock signals from the rows of received data and supplies the clock signals to the error correcting circuit 27 and the transmission circuit 28. On the other hand, in the arrangement shown in FIG. 31, a clock generating circuit 64 (clock signal supplying circuit) supplies clock signals to the error correcting circuit and the transmission circuit, instead of the clock signals generated by the PLL circuit.

Figure 32:
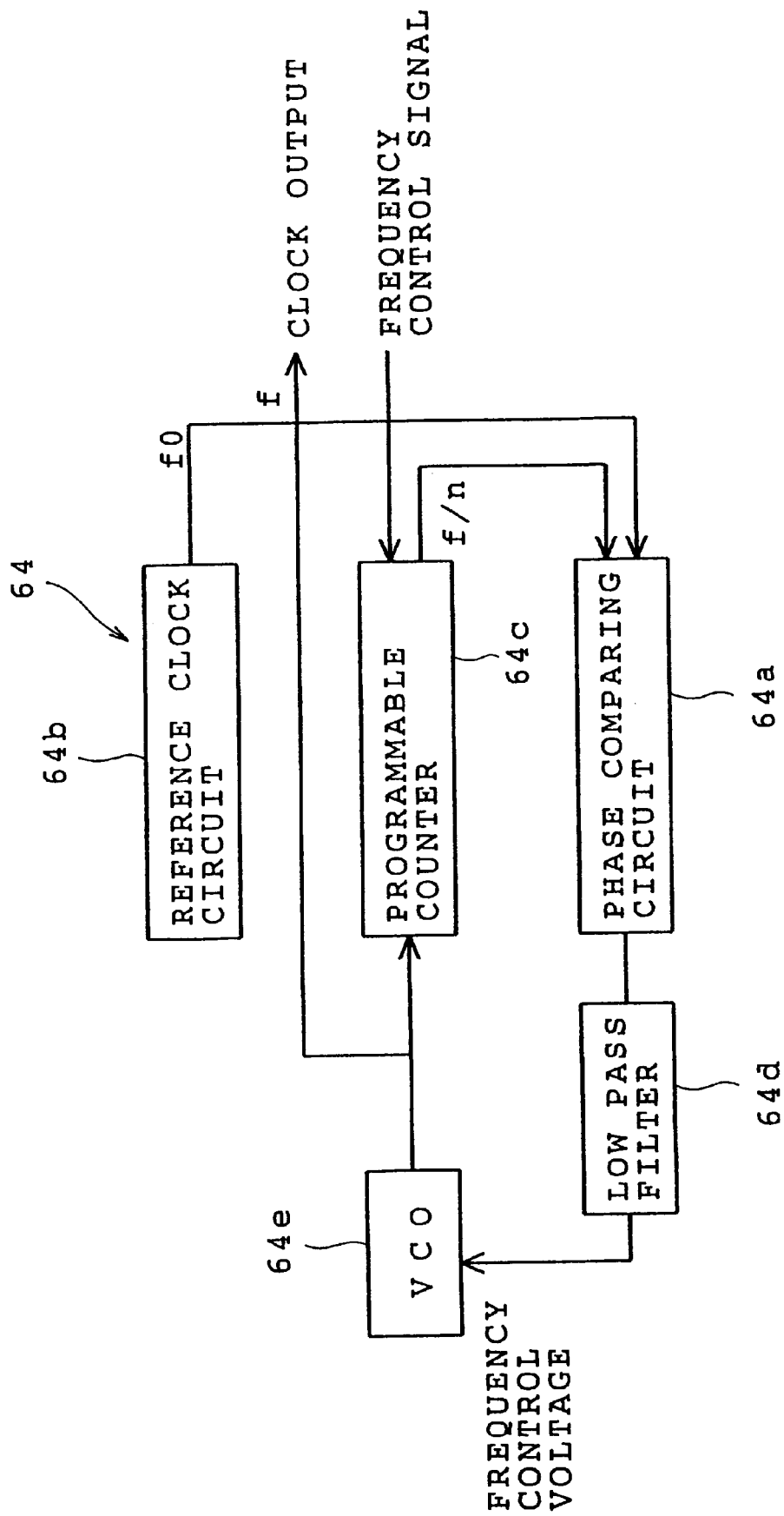
FIG. 32 is a detailed block diagram showing an electrical arrangement of a clock generating circuit.

FIG. 32 is a block diagram showing the detailed arrangement of the clock generating circuit 64. A phase comparing circuit 64a includes an input terminal to which reference clock signals delivered by a reference clock circuit 64b are supplied. An oscillation signal of a VCO 64e is also supplied via a programmable counter 64c (frequency setting circuit) to the input terminal of the phase comparing circuit 64a. An output signal of the phase comparing circuit 64a is supplied via a low pass filter 64d to a control input terminal of the VCO 64e as a frequency control voltage.

A system controller 32a (system control circuit) for controlling the overall system of the multi-disc reproducing device delivers to the programmable counter 64c a frequency control signal determining a dividing ratio of the oscillation signal of the VCO 64e. That is, a counter value and a set value to be set in the programmable counter 64c are supplied to the latter. As a result, the oscillation signal of the VCO 64e can be delivered as a frequency-variable clock signal. In this case, a frequency f of the clock signal delivered from the clock generating circuit 64 is shown by the equation, $f = n \cdot f0$, where f0 is a frequency of the reference clock signal delivered from the reference clock 64b and n is a count value set in the programmable counter 64c. Namely, the above-described arrangement constitutes a frequency synthesizer (frequency control circuit) which is classified into a PLL circuit. The frequency f is controlled in a feedback manner so as to become n times as large as the frequency f0. The other arrangement of the fifteenth embodiment is the same as that of FIG. 49. The RF circuit 18, the synchronization separating circuit 21, the PLL circuit 22 and the decoding circuit 24 constitute the receiving circuit.

Figure 33:
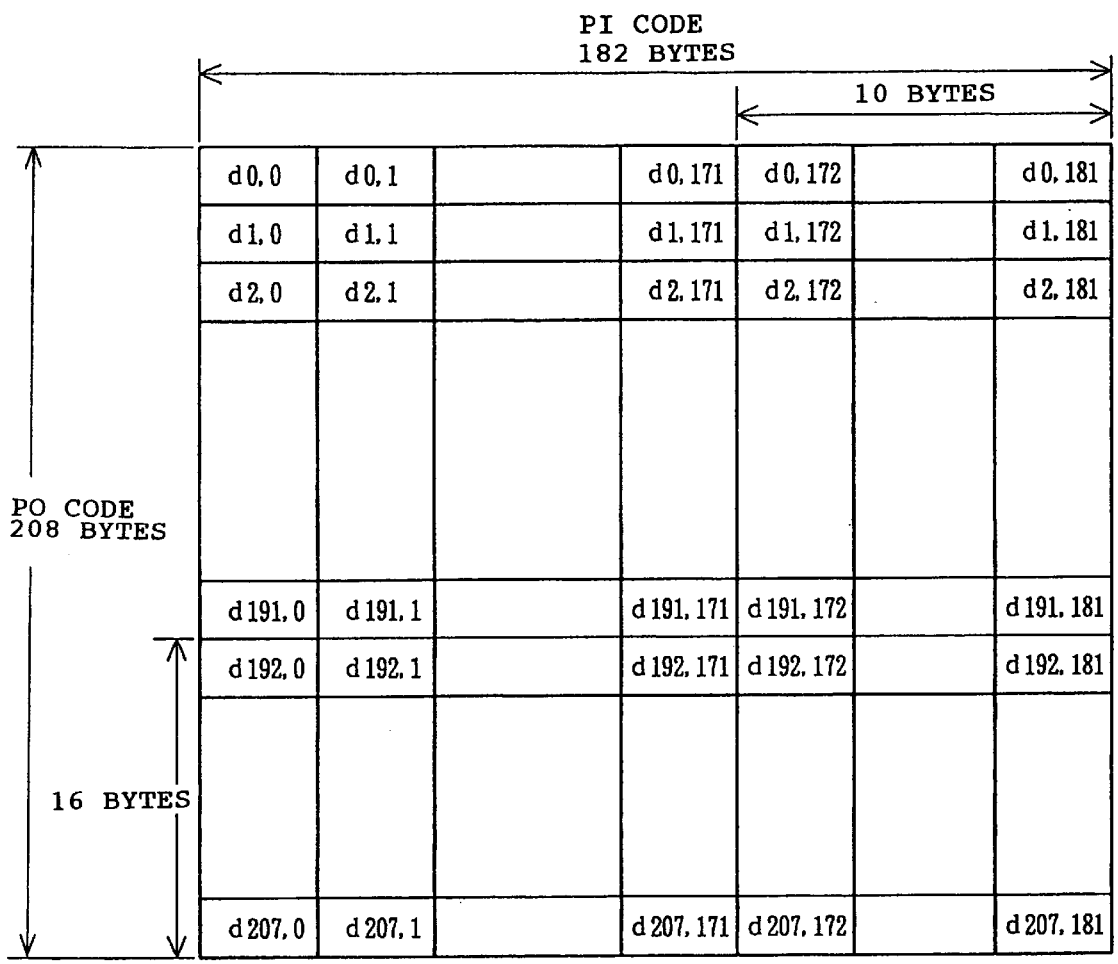
FIG. 33 illustrates a data format of error correcting codes employed in a DVD.

The operation of the fifteenth embodiment will be described with reference to FIGS. 33 to 35. FIG. 33 shows the error correcting code employed in the DVD data. Data format of the error correcting code shown in FIG. 33 is the same as that shown in FIG. 14 and accordingly, the description thereof is eliminated.

Figure 34:
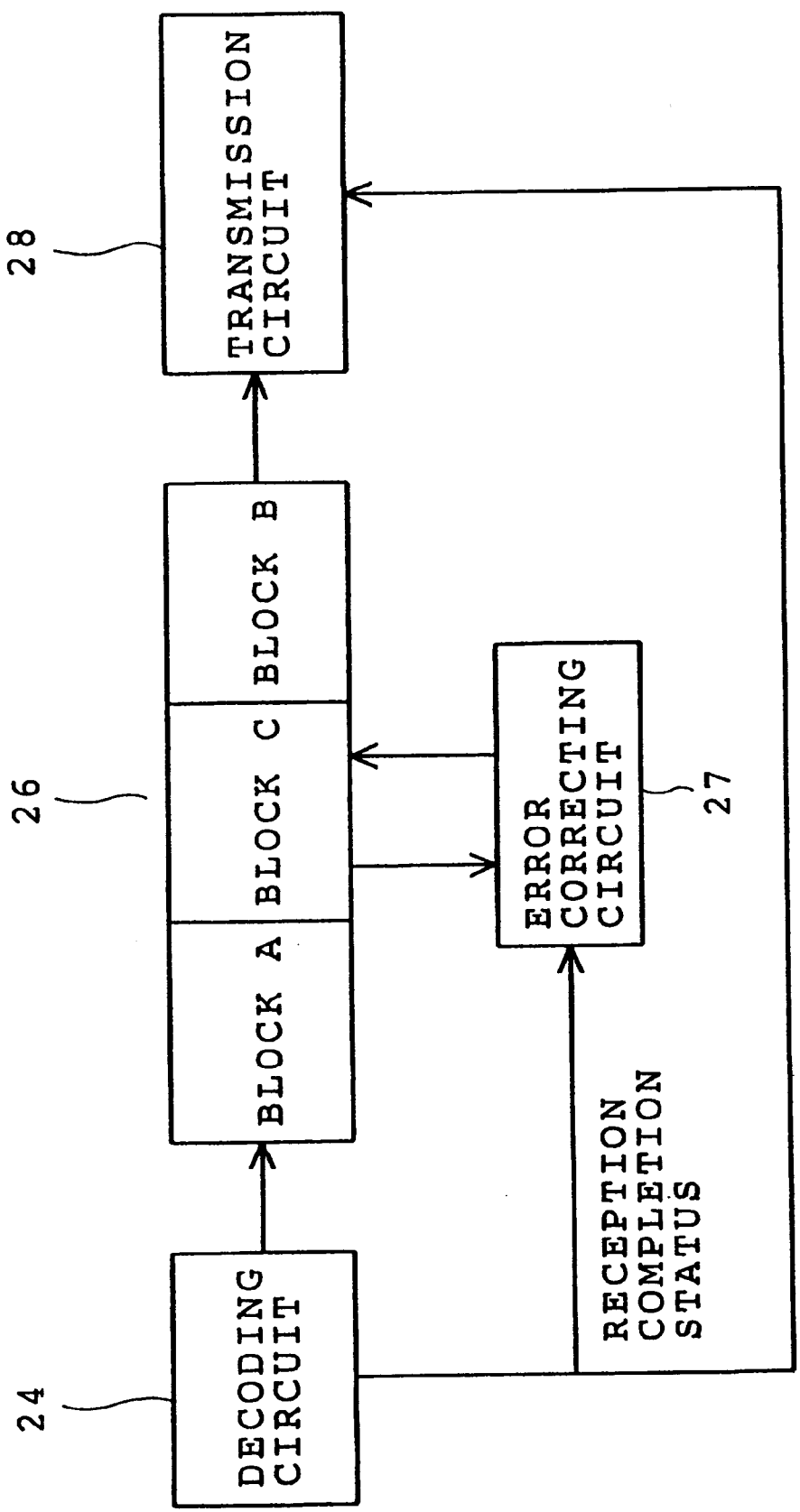
FIG. 34 illustrates an operational concept of areas of the storage device.

FIG. 34 shows a concept of storage area of the storage device 26 used for storing DVD data. The storage area of the storage device 26 is divided into three areas A, B and C. Each area has a storage capacity set to be equal to that of one block which is a unit for which the error correction is performed with use of the error correcting code. For example, as shown in FIG. 35, when the data received by the receiving circuit is to be written into the area A in a phase, the data the receiving circuit 1 has written into the area C in the last phase is an object for error detection and correction, whereas the data which is stored in the area B and the error of which has been corrected by the error correcting circuit in the last phase is an object to be transmitted by the transmission circuit.

In the above-described case, the decoding circuit 24 delivers both to the error correcting circuit 27 and to the transmission circuit 28 a status signal indicative of completion of reception of one block of data. Each of these circuits 27 and 28 confirms receipt of the status signal before performing the process for the area of a new block of data. When a disc is set in an accommodating section (not shown), the system controller 32a judges a type of the disc to determine an upper limit of a reproducing speed according to the judged type of the disc, namely, the count value for the programmable counter 64c of the clock generating circuit 64 to set it in the counter. For example, in discs such as a DVD-ROM and CD-ROM, it is important to reproduce data at a speed as high as possible. In the case of these discs, the upper limit of the reproducing speed set by the system controller 32a is rendered high. On the other hand, when a DVD stores MPEG data or a CD stores audio data, a reproducing speed is not increased over a predetermined speed defined in the standard. In such a case, the upper limit of the reproducing speed set by the system controller is rendered relatively low.

Figure 35:
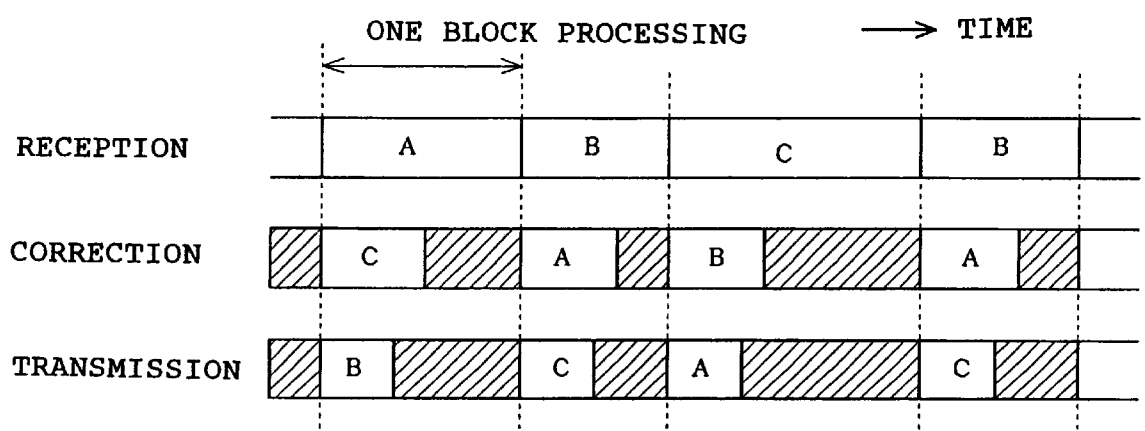
FIG. 35 is a time chart for explaining use of the areas of the storage device.

As shown in FIG. 35, periods of time during which the error correcting circuit 27 and the transmission circuit 28 perform the error correction and the transmission regarding one block of data respectively are fixed on the basis of the frequency of the clock signal the clock generating circuit 64 delivers to both circuits 27 and 28. When a period of time during which the decoding circuit 24 writes the received data on the storage device is long, a period of time during which the error correcting circuit 27 and the transmission circuit 28 are on standby for start of respective next processes becomes long. Conversely, when a period of time during which the decoding circuit 24 writes the received data on the storage device is short, a period of time during which the error correcting circuit 27 and the transmission circuit 28 are on standby for start of next processes becomes short. In other words, the upper limit of the reproducing speed is defined by the frequency of the clock signal the clock generating circuit 64 delivers to the error correcting circuit 27 and the transmission circuit 28.

According to the fifteenth embodiment, the clock generating circuit 64 is arranged dependent of the system reference clock circuit 31 and the PLL circuit 22. The clock signal generated by the clock generating circuit 64 is supplied to the error correcting circuit 27 and the transmission circuit 28. Accordingly, the frequency of the system reference clock signal need not be set high according to the sides of the error correcting circuit 27 and the transmission circuit 28 in order that the data reproducing speed is increased. Consequently, consumed electric power and unnecessary radiation can be reduced. Further, the error correcting circuit 27 and the transmission circuit 28 can be operated without depending on the clock signals which are generated by the PLL circuit 22 on the basis of the received data rows and have low stability. Consequently, occurrence of malfunction can be prevented.

Further, the clock generating circuit 64 is constituted as the frequency synthesizer operated on the basis of both the reference clock signal generated by the reference clock circuit 64a discrete from the system reference clock circuit 31 and the count value set in the programmable counter 64c. the system controller 32a set the count value in the programmable counter 64c according to the type of the disc on which data to be reproduced is recorded, thereby changing the upper limit value of the data reproducing speed. Accordingly, the clock generating circuit 64 performs the feedback control so that the frequency of the output clock signal thereof detected by the phase comparing circuit 64b approximates to a value according to the count value set in the programmable counter 64c. Consequently, the upper limit value of the data reproducing speed can properly be set according to the type of the disc.

Figure 31:
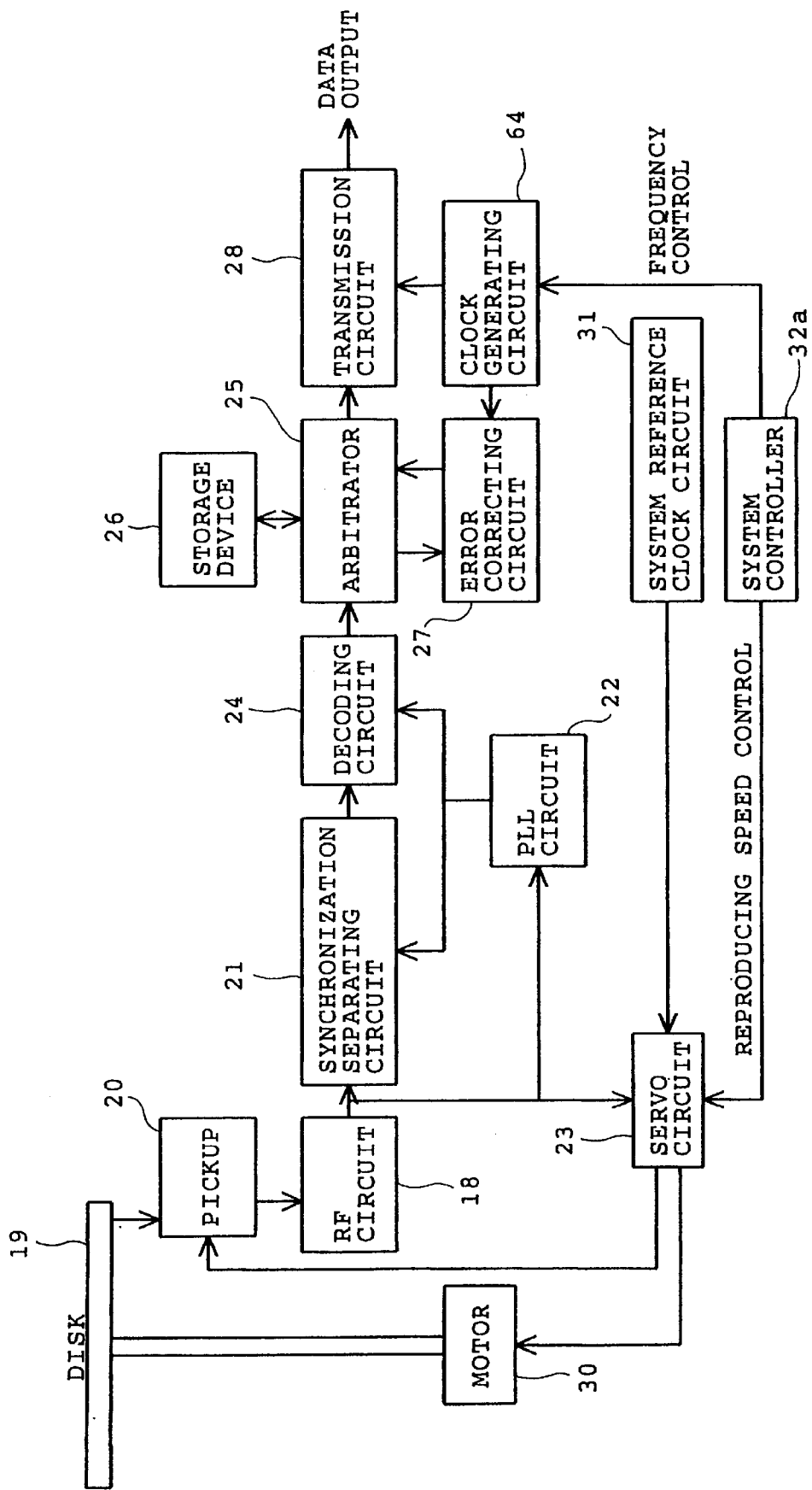
FIG. 31 is a block diagram showing an electrical arrangement of a multi-disc player of a fifteenth embodiment in accordance with the invention.
Figure 36:
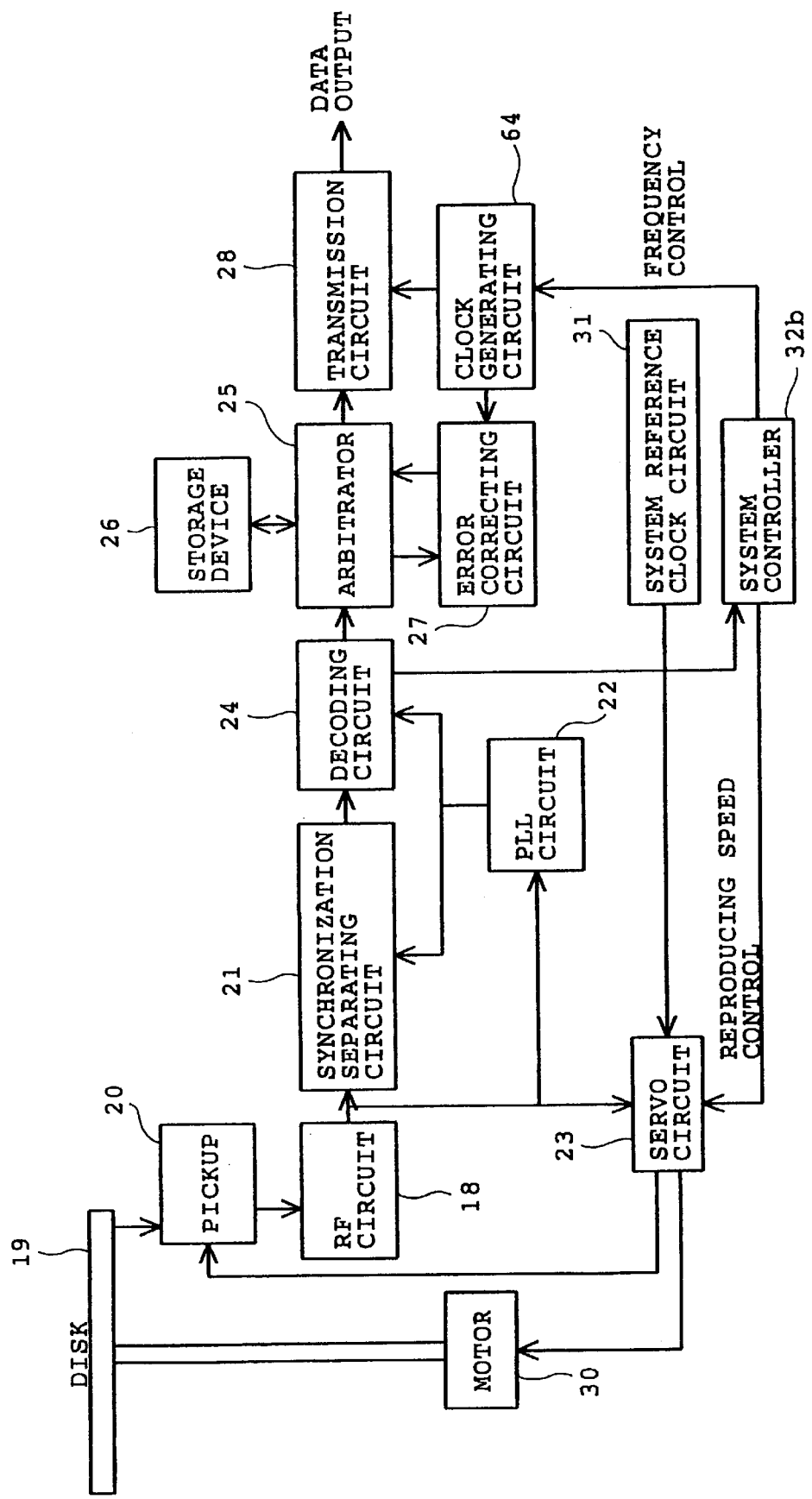
FIG. 36 is a block diagram similar to FIG. 31, showing a sixteenth embodiment in accordance with the invention.

FIG. 36 illustrates a sixteenth embodiment. The identical or similar components in the sixteenth embodiment are labeled by the same reference symbols as those in the fifteenth embodiment, and the description of these components are eliminated. Only the differences between the fifteenth and sixteenth embodiments will herein be described. Referring to FIG. 36 showing an electrical arrangement, the system controller 32a shown in FIG. 31 is replaced by a system controller 32b (system control circuit). The system controller 32b obtains the received data decoded by the decoding circuit 24. The other arrangement of the sixteenth embodiment is the same as that of the fifteenth embodiment.

The operation of the sixteenth embodiment will be described. For example, when the user supplies an input instructing the head of a track of audio data or video data recorded on a CD or DVD or when the user supplies an input instructing searching data recorded on a CD-ROM or DVD-ROM, the system controller 32b delivers a control signal to the servo circuit 23 to thereby suddenly change a tracking position on the disc 19 of the pickup 20 (data reading element). When the tracking position of the pickup 20 is suddenly changed, the data receiving speed is suddenly changed as the result of employment of the CLV system. More specifically, since the change in the rotational speed of the motor 30 cannot follow the sudden change in the data receiving speed, the data receiving speed is relatively increased in the change to the inner circumferential side of the disc, whereas it is relatively decreased in the change to the outer circumferential side of the disc. In this case, the system controller 32b obtains sub-coding data contained in the data recorded on the disc 19 from the received data decoded by the decoding circuit 24. The sub-coding data contains data showing where the data which is being read out is located on the disc.

The system controller 32b sets the counter value in the programmable counter 64c of the clock generating circuit 64 according to a tracking position indicated by the sub-coding data. In other words, the system controller 32b changes the frequency of the clock signal delivered from the clock generating circuit, during reproduction of the disc 19 in a dynamic manner.

According to the sixteenth embodiment, the system controller 32b changes the frequency of the clock signal delivered from the clock generating circuit 64 according to the tracking position of the pickup 20 reading the data from the disc 19, so that the error correcting speed of the error correcting circuit 27 and the transmitting speed of the transmission circuit are changed so as to match the data receiving speed which differs according to the tracking position. Consequently, an optimum speed control can be executed.

Figure 37:
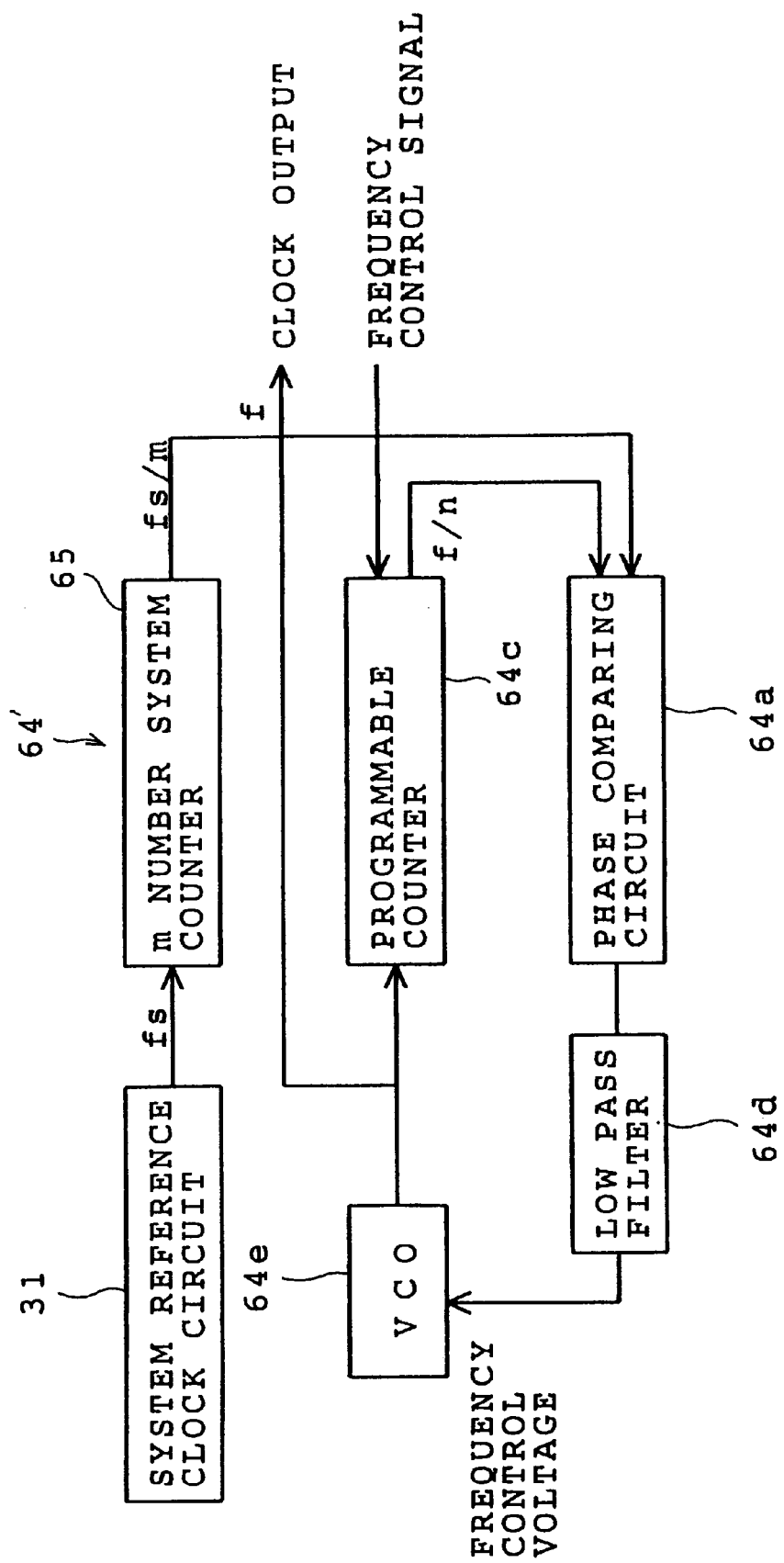
FIG. 37 is a block diagram similar to FIG. 32, showing a seventeenth embodiment in accordance with the invention.

FIG. 37 illustrates a seventeenth embodiment. The identical or similar components in the seventeenth embodiment are labeled by the same reference symbols as those in the fifteenth embodiment, and the description of these components are eliminated. only the differences between the fifteenth and seventeenth embodiments will herein be described. In FIG. 37 showing an electrical arrangement of the clock generating circuit 64' (clock signal supplying circuit and frequency control circuit), the phase comparing circuit 64b of the clock generating circuit 64' is supplied with the system clock signal of the system reference clock circuit 31 divided via an m count system counter 65 at m number of times, instead of the clock signal from the reference clock circuit 64a shown in FIG. 32. The other arrangement in the seventeen embodiment is the same as that of the fifteenth embodiment.

A frequency f of the clock signal delivered from the clock generating circuit 64' is shown by the equation, $f=(n/m) \cdot fs$, where fs is a frequency of the system clock signal delivered from the system reference clock circuit 31.

According to the seventeenth embodiment, the phase comparing circuit 64b of the clock generating circuit 64' compares self-delivered clock signal divided at the n number of times and the system clock signal of the system reference clock circuit 31 divided at the m number of times, thereby determining the frequency of the output clock signal. Consequently, since the frequency of the system clock signal need not be set high according processing speeds at the error correcting and data transmitting sides, the same effect can be achieved from the seventeenth embodiment as that from the fifteenth embodiment.

Figure 38:
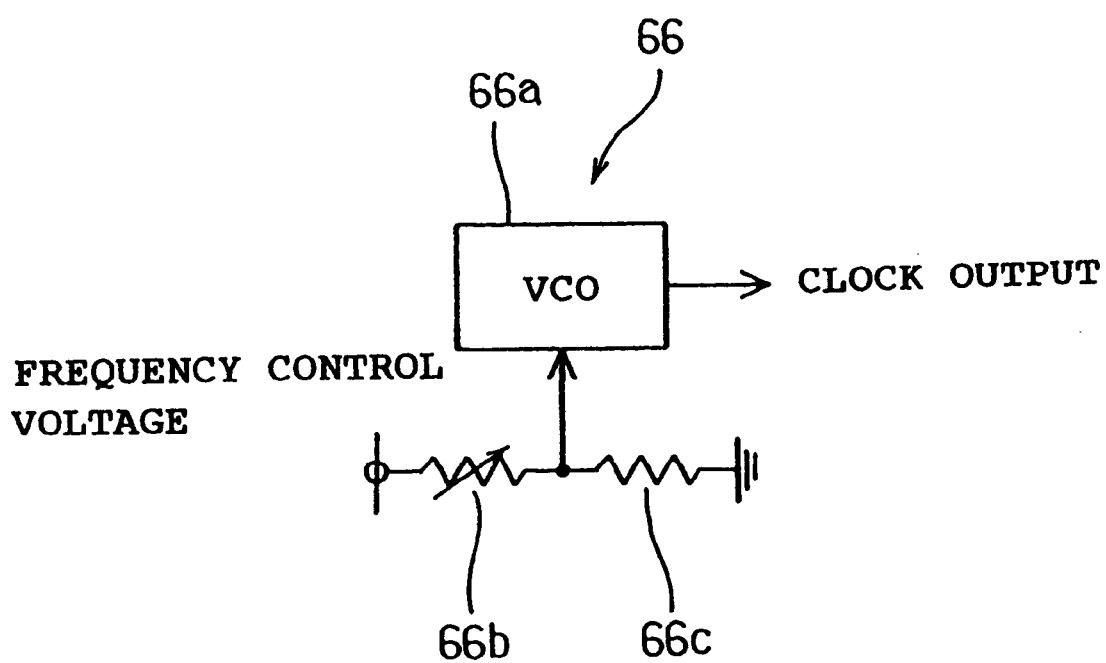
FIG. 38 is also a view similar to FIG. 32, showing an eighteenth embodiment in accordance with the invention.

FIG. 38 illustrates an eighteenth embodiment. The identical or similar components in the eighteenth embodiment are labeled by the same reference symbols as those in the fifteenth embodiment, and the description of these components are eliminated. Only the differences between the fifteenth and eighteenth embodiments will herein be described. FIG. 38 shows an electrical arrangement of a clock generating circuit (clock signal supplying circuit) 66. The clock generating circuit 66 comprises a voltage control oscillator (VCO) 66a, and a sequence circuit of a variable resistor (frequency setting circuit) 66b connecting between a control power source Vcc and the ground and a resistor 66c.

The VCO 66a has a voltage control terminal connected to a node of the variable resistor 66b and the resistor 66c, so that clock signals are delivered from an output terminal of the VCO 66a to the error correcting circuit 27 and the transmission circuit 28. The other arrangement of the eighteenth embodiment is the same as that of the fifteenth embodiment.

The operation of the data reproducing device of the eighteen embodiment will be described. In the data reproducing device of the eighteenth embodiment, the type of the disc 19 on which the data to be reproduced is recorded is fixed (single disc player) and accordingly, an upper limit of the reproducing speed is previously determined. In this case, for example, a resistance value (set value) of the variable resistor 66b of the clock generating circuit 66 is manually set at a manufacturing step of the reproducing device, so that a divided potential of the control power source Vcc to be supplied to the voltage control terminal of the VCO 66a is adjusted. The VCO 66a varies the frequency of the output signal according to the potential supplied to the voltage control terminal thereof. Consequently, the frequency of the clock signals supplied to the error correcting circuit 27 and the transmission circuit 28 can be set at a desired value according to the type of the disc 19 determined for every reproducing device.

According to the eighteenth embodiment, the frequency of the clock signals delivered from the clock generating circuit 66 is varied by manually setting the resistance value of the variable resistor 66b. As a result, the arrangement of the clock generating circuit 66 can be simplified when a single type of the disc 19 is used and the upper limit of the reproducing speed can fixedly be set.

The invention should not be limited to the embodiments described above with reference to the accompanying drawings and may be modified or expanded as follows.

The arbitrator may be composed integrally with the storage device in each of the above-described embodiments. Further, the functions of the arbitrator may be allotted to the receiving circuit, the error correcting circuit and the transmission circuit so that the requirement for access to the storage device is shared with these circuits for execution of arbitration.

The arrangements of the fifteenth and sixteenth embodiments are combined together so that the system control circuit sets the upper limit of the reproducing speed according to the type of the disc and so that the upper limit of the reproducing speed is dynamically set according to the tracking position of the pickup.

A frequency comparing circuit may be provided instead of the phase comparing circuit 64a in each of the fifteenth to seventeenth embodiments.

In each of the fifteenth to seventeenth embodiments, the system controller 32, 32a or 32b sets the counter value of the programmable counter. However, a dip switch (frequency setting circuit) may be provided for setting the counter value of the programmable counter 64c, instead. Further, when the invention is applied to a single disc player as in the eighteenth embodiment, the dip switch is manually set to thereby set the upper limit of the reproducing speed.

In the seventeenth embodiment, the m count system counter 65 may be composed into a programmable counter. In this arrangement, the frequency of the system clock signal of the system reference clock circuit 31 is varied by the equation, f=(n/m), according to the counter value m. Consequently, the frequency f can be varied in various manners as compared, for example, with the case of the fifteenth embodiment.

Figure 50:
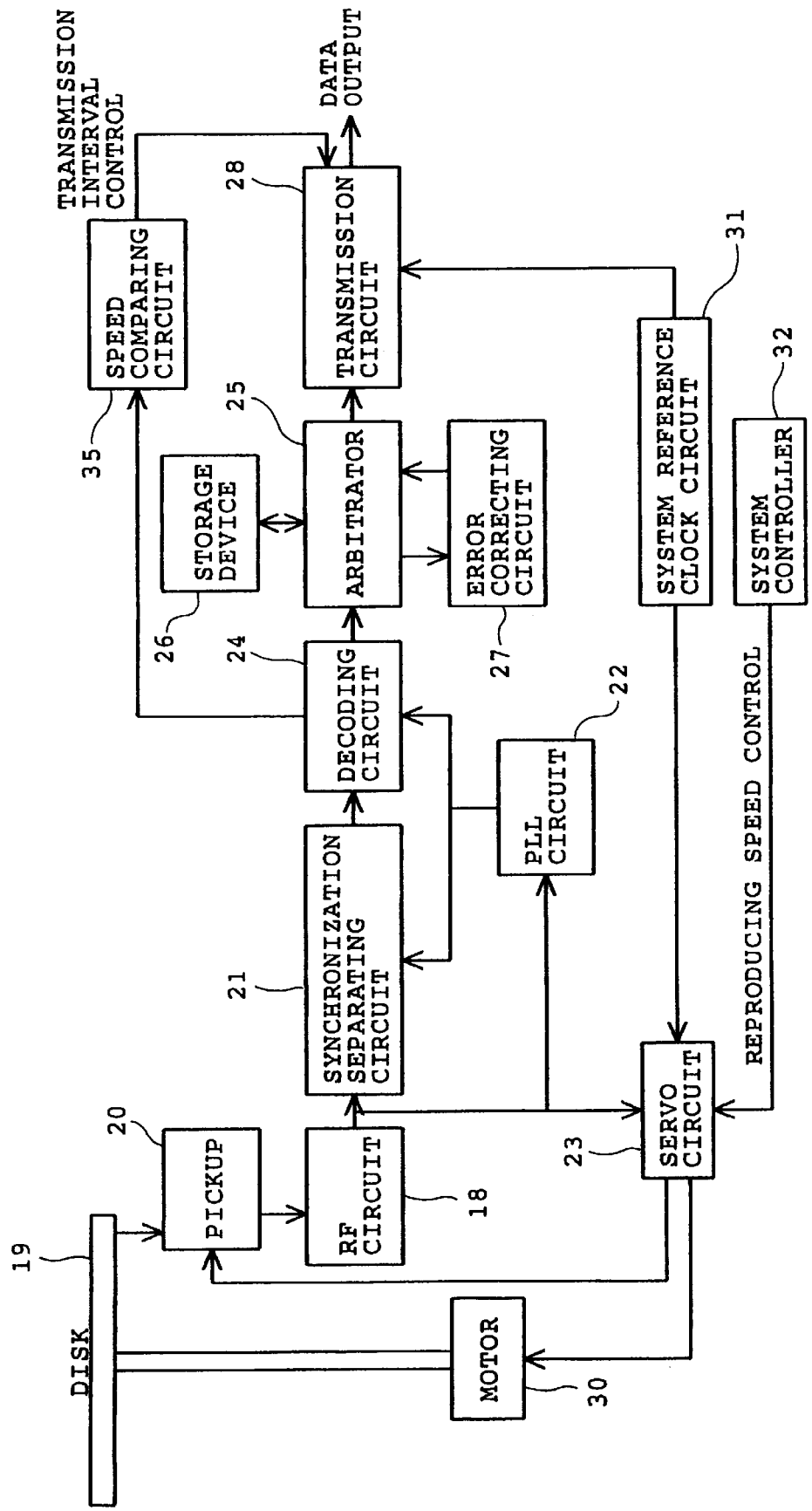

Although the invention has been applied to the single disc player in the eighteenth embodiment, the frequency of the clock generating circuit 66 may be set according to a maximum one of the reproducing speeds of a plurality of discs 19, and the speed comparing circuit as shown in FIG. 50 may be provided, for example. In this case, the discs having respective lower reproducing speeds may be dealt with by increasing an interval of the data transmission from the transmission circuit 28.

Further, the speed comparing circuit 35 may be provided in the arrangement of the fifteenth embodiment so that the system controller 32a sets the frequency of the clock generating circuit 64 according to the highest reproducing speed of the disc in an initial processing. Thereafter, the data transmission interval may be adjusted by the speed comparing circuit 35 in the sane manner as described above.

The fifteenth to eighteenth embodiments should not be limited to the disc 19 such as the CD or DVD. The reproducing device of each of the fifteenth to eighteenth embodiments may be applied to a device for reproducing data recorded on a hard disc, floppy disc, magnetic disc, etc. when the data recorded on each of these recording media contains data composed as the error correcting code. In each case, a magnetic head is provided as the data reading element.

The clock signal supplying circuit may supply the clock signals to components other than the error correcting circuit and the transmission circuit.

Although the invention has been applied to the data reproducing devices of the CLV system in the foregoing embodiments, the invention may be applied to data reproducing devices of the ZCLV system and ZCAV system.

The foregoing description and drawings are merely illustrative of the principles of the present invention and are not to be interpreted in a limiting sense. Various changes and modifications will become apparent to those of ordinary skill in the art. All such changes and modifications are seen to fall within the scope of the present invention as defined in the appended claims.

We claim:

1. An error correcting device comprising:
    a receiving circuit for receiving data in a unit of a block;
    an error correcting circuit for detecting and correcting an error in the data received by the receiving circuit so as to provide error-corrected data;
    a transmission circuit for transmitting the error-corrected data; and
    a storage device having two areas each having a storage capacity corresponding to at least one block of the data, wherein the receiving circuit writes received data alternatively onto a first of the two areas of the storage device, said first of the two areas initially serving as a received data area and in the alternate writing serving as a corrected data area,
    the error correcting circuit corrects every one block of received data written onto a second of the two areas of the storage device, said second of the two areas initially serving as the corrected data area and in the alternate writing serving as the received data area,
    the transmission circuit reads the error-corrected data from a transmission data area corresponding to the received data area of the storage device to transmit the error-corrected data,
    when a first address refers to an address where the transmission circuit previously read the error-corrected data and a second address refers to an address where the transmission circuit reads the error-corrected data, the first and second addresses both belonging to a same one of the two areas of the storage device, the receiving circuit writes the data received by the receiving circuit into the first address of the same one of the two areas of the storage device while the transmission circuit is reading the error corrected data from the second address of the same one of the two areas of the storage device, and the error correcting circuit concurrently corrects an error in data stored in an other one of the two areas of the storage device.

2. An error correcting device according to claim 1, wherein a time required for the error correcting circuit to detect and correct the error in one block of data and further to write the error-corrected data onto a corrected data area of the storage device, which is a second of the two areas of the storage device, is set so as to be shorter than a time required for the receiving circuit to write received one block of data onto the storage device, and when the error correcting circuit finishes writing the error-corrected data onto the corrected data area, the transmission circuit reads out the error-corrected data from a first address of the second of the two areas of the storage device before the receiving circuit completes writing one block of data onto the first of the two areas of the storage device.

3. An error correcting device according to claim 1, wherein the transmission circuit reads out the error-corrected data at a speed substantially equal to or higher than a maximum speed at which the receiving circuit writes the received data onto the storage device. storage device.

4. An error correcting device according to claim 1, further comprising a readout speed control circuit for controlling a data readout speed of the transmission circuit based on a speed at which the receiving circuit writes the received data onto the storage device.

5. An error correcting device according to claim 1, further comprising an interrupting circuit for comparing the second address and the first address and interrupting a writing operation of the receiving circuit when an interval between the first address and the second address is below a predetermined value.

6. An error correcting device according to claim 1, further comprising a data erasure judging circuit for comparing the second address and the first address, and judging that untransmitted data whose error has been corrected and which is stored in the storage device has been erased, when the second address is equal to or precedes the first address.

7. An error correcting device comprising:
    a receiving circuit for receiving data in a unit of a block;
    an error correcting circuit for detecting and correcting an error in the data received by the receiving circuit so as to provide error-corrected data;

a transmission circuit for transmitting the error-corrected data; and a storage device having two areas each having a storage capacity corresponding to at least one block of the data, wherein the receiving circuit writes received data alternatively onto a first of the two areas of the storage device, said first of the two areas initially serving as a received data area and in the alternate writing serving as a corrected data area, the error correcting circuit corrects every one block of received data written onto a second of the two areas of the storage device, said second of the two areas initially serving as the corrected data area and in the alternate writing serving as the received data area, the transmission circuit reads the error-corrected data from a transmission data area corresponding to the received data area of the storage device to transmit the error-corrected data, when a first address refers to an address where the transmission circuit previously read the error-corrected data and a second address refers to an address where the transmission circuit reads the error-corrected data, the first and second addresses both belonging to a same one of the two areas of the storage device, the receiving circuit writes the data received by the receiving circuit into the first address of the same one of the two areas of the storage device while the transmission circuit is reading the error corrected data from the second address of the same one of the two areas of the storage device, and the error correcting circuit concurrently corrects an error in data stored in an other one of the two areas of the storage device, and a difference is set between the first address and second address so that the difference, which defines a predetermined amount of memory capacity, is smaller than a memory capacity of one block of an error correcting code.

8. An error correcting device according to claim 7, wherein a time required for the error correcting circuit to detect and correct the error in one block of data and further to write error-corrected data onto a corrected data area of the storage device is set so as to be shorter than a time required for the receiving circuit to write received one block of data onto the storage device, and when the error correcting circuit finishes writing onto the corrected data area one block of the error-corrected data, the transmission circuit reads out the error-corrected data from a first address of the corrected data area before the receiving circuit completes writing one block of data onto a received data area.

9. An error correcting device according to claim 7, wherein the transmission circuit reads out error-corrected data from a previously corrected data area of the storage device at a speed at least one of substantially equal to and higher than a maximum speed at which the receiving circuit writes the received data onto the storage device.

10. An error correcting device according to claim 7, further comprising a readout speed control circuit for controlling a data readout speed of the transmission circuit based on a speed at which the receiving circuit writes the received data onto the storage device.

11. An error correcting device according to claim 7, further comprising:

an interrupting circuit for comparing the second address and the first address, the interrupting circuit interrupting a writing operation of the receiving circuit onto a received data area when an interval between the second address and the first address is below a predetermined value.

12. An error-correcting device according to claim 7, further comprising:

a data erasure judging circuit for comparing the second address and the first address at which the receiving circuit writes the received data onto the storage device, and judging that untransmitted data whose error has been corrected and which is stored in the storage device has been erased, when the second address is at least one of equal to and precedes the first address.

13. An error correcting device comprising:

a receiving circuit for receiving data of an error correcting code;

a storage device for storing the data received by the receiving circuit;

an error correcting circuit for correcting an error in the data received by the receiving circuit using of the error correcting code and writing error-corrected data onto the storage device;

a transmission circuit for reading out and transmitting the error-corrected data from the storage device;

a syndrome calculating circuit for obtaining the data received by the receiving circuit and calculating a syndrome of data obtained from the error correcting code and delivering the syndrome to the error correcting circuit; and a syndrome judging circuit for judging a validity condition to decode the syndrome calculated by the syndrome calculating circuit based on a received state of data obtained from the receiving circuit for use in calculation of the syndrome.

14. An error correcting device according to claim 13, wherein the syndrome judging circuit measures the number of symbols of the data obtained from the receiving circuit for use in the calculation of the syndrome, so that when the number of the symbols disagrees with a predetermined value, the syndrome judging circuit judges the syndrome calculated by the syndrome calculating circuit to be invalid and delivers an invalidity signal.

15. An error correcting device according to claim 14, further comprising a syndrome output switching circuit for switching between a case where the syndrome output switching circuit delivers to the error correcting circuit a syndrome with respect to which the error of the data is uncorrectable, when the syndrome judging circuit has delivered the invalidity signal, and a case where the syndrome output switching circuit delivers to the error correcting circuit the syndrome calculated by the syndrome calculating circuit otherwise.

16. An error correcting device according to claim 14, wherein the error correcting circuit does not perform error correction for at least a row of the error correcting code of the data corresponding to the syndrome judged to be invalid when the syndrome judging circuit has delivered the invalidity signal.

17. An error correcting device according to claim 13, wherein the syndrome judging circuit detects synchronization signals contained in the data received by the receiving circuit, so that when a detected interval of the synchronization signals is outside a predetermined range, the syndrome judging circuit judges the syndrome calculated by the syndrome calculating circuit to be invalid and delivers an invalidity signal.

18. An error correcting device comprising:

a receiving circuit for receiving data of an error correcting code;

a storage device onto which the data received by the receiving circuit is written;

a judging circuit for judging whether data of a predetermined number of symbols required for error correction is received by the receiving circuit and properly written onto the storage device;

a renewal position information generating circuit for generating information of a renewal position regarding codes of the data written onto the storage device on the basis of a judgment of the judging circuit;

an error correcting circuit for reading out the data stored in the storage device to detect an error in the data on the basis of the error correcting code, correct the error in the data and write the error-corrected data onto the storage device, the error correcting circuit refraining from performing the error correction for at least a row of the error correcting code with respect to which the data has not been renewed on the basis of the renewal position information generated by the renewal position information generating circuit; and a transmission circuit for reading out the error-corrected data written onto the storage device to transmit the same.

19. An error correcting device according to claim 18, wherein the error correcting circuit refrains from performing the error correction at least when regarding a row of the error correcting code the data of which has not been renewed, an order of receipt of the data is substantially the same as an arrangement of error correcting code.

20. An error correcting device according to claim 18, wherein the data is composed as a plurality of sequences of error correcting codes, and when the number of rows of any one sequence of error correcting code of the data regarding which rows the error correction has been performed is larger than the number of correctable errors in the other sequences of error correcting codes, the error correcting circuit performs the error correction for the rows of error correcting codes the data of which in said other sequences of error correcting codes has not been renewed.

21. An error correcting device according to claim 18, wherein the judging circuit measures the number of symbols received by the receiving circuit and judges whether the data of the predetermined number of symbols required for the error correction has been written onto the storage device on the basis of the measured number of symbols.

22. An error correcting device according to claim 18, wherein the judging circuit detects synchronization signals contained in the data received by the receiving circuit and judges whether the data of a predetermined number of symbols required for the error correction has been written onto the storage device on the basis of a detected interval of the synchronization signals.

23. A data reproducing apparatus comprising:

a receiving circuit for receiving data read out from a recording medium;

a storage device onto which the data received by the receiving circuit is written;

a clock signal supplying circuit for supplying a frequency-variable clock signal independent of a clock signal for control of data reception;

an error correcting circuit for reading out the data stored in the storage device to correct an error in the data and write the error-corrected data onto the storage device on the basis of the clock signal supplied thereto from the clock signal supplying circuit; and a transmission circuit for reading out the error-corrected data written onto the storage device to transmit the same on the basis of the clock signal supplied thereto from the clock signal supplying circuit.

24. A data reproducing apparatus according to claim 23, wherein the clock signal supplying circuit includes a frequency setting circuit for setting a frequency of the clock signal.

25. A data reproducing apparatus according to claim 24, wherein the clock signal supplying circuit includes a frequency control circuit for controlling a frequency of the clock signal in a feedback manner so that the frequency of the clock signal delivered from the clock signal supplying circuit approximates to a value set by the frequency setting circuit.

26. A data reproducing apparatus according to claim 25, wherein the frequency control circuit controls the frequency of the clock signal delivered from the clock signal supplying circuit in the feedback manner by comparing the frequency of the clock signal with a frequency of a system reference clock signal.

27. A data reproducing apparatus according to claim 25, wherein the frequency control circuit controls the frequency of the clock signal delivered from the clock signal supplying circuit in the feedback manner by comparing the frequency of the clock signal with a frequency of a clock signal independent of a system reference clock signal.

28. A data reproducing apparatus according to claim 23, further comprising a system control circuit for generally controlling a system and setting the set value at the frequency setting circuit.

29. A data reproducing apparatus according to claim 28, wherein the recording medium is an information storage disc and the system control circuit changes an upper limit value of a data reproducing speed by setting the set value of the frequency setting circuit according to a type of the information storage disc storing the data to be reproduced.

30. A data reproducing apparatus according to claim 28, wherein the recording medium is an information storage disc and the system control circuit changes an upper limit value of a data reproducing speed by setting the set value of the frequency setting circuit according to a position of a data reading element reading the data from the information storage disc.

* * * * *